US007233526B2

(12) United States Patent
Umezawa

(10) Patent No.: US 7,233,526 B2
(45) Date of Patent: Jun. 19, 2007

(54) SEMICONDUCTOR MEMORY DEVICE WITH MOS TRANSISTORS EACH HAVING FLOATING GATE AND CONTROL GATE

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 11/248,425

(22) Filed: Oct. 13, 2005

(65) Prior Publication Data

US 2006/0083072 A1   Apr. 20, 2006

(30) Foreign Application Priority Data

Oct. 14, 2004   (JP) ............................. 2004-300522

(51) Int. Cl.
*G11C 11/34* (2006.01)
(52) U.S. Cl. ..................... 365/185.27; 365/185.05; 365/185.29
(58) Field of Classification Search ........... 365/185.27, 365/185.05, 185.29, 204, 230.06, 185.18, 365/185.2
See application file for complete search history.

(56) References Cited

U.S. PATENT DOCUMENTS

2005/0068808 A1* 3/2005 Quader et al. ......... 365/185.18

OTHER PUBLICATIONS

Do Dormans, et al., "High-density low-voltage byte-erasable EEPROM memory based on a 2T-FNFN Flash cell", NVSMW, Feb. 17, 2003, pp. 21, 22 and 1 cover page.

Wei-Hua Liu, et al., "A 2-Transistor Source-select (2TS) Flash EEPROM for 1.8V-Only Applications", NVSMW 4.1, Feb. 1997, pp. 1-3.

* cited by examiner

*Primary Examiner*—Anh Phung
*Assistant Examiner*—Douglas S. King
(74) *Attorney, Agent, or Firm*—Oblon, Spivak, McClelland, Maier & Neustadt, P.C.

(57) ABSTRACT

A semiconductor memory device includes a memory cell array, word lines, select gate lines, and switch elements. The memory cell array includes a plurality of memory cells arranged in a matrix. Each of the memory cells includes a first MOS transistor having a charge accumulation layer and a control gate and a second MOS transistor which has a drain connected to a source of the first MOS transistor. Each of the word lines connects commonly the control gates of the first MOS transistors in a same row. Each of the select gate lines connects commonly the gates of the second MOS transistors in a same row. The switch elements, in an erase operation, electrically connect the select gate lines to a semiconductor substrate in which the memory cell array is formed.

20 Claims, 57 Drawing Sheets

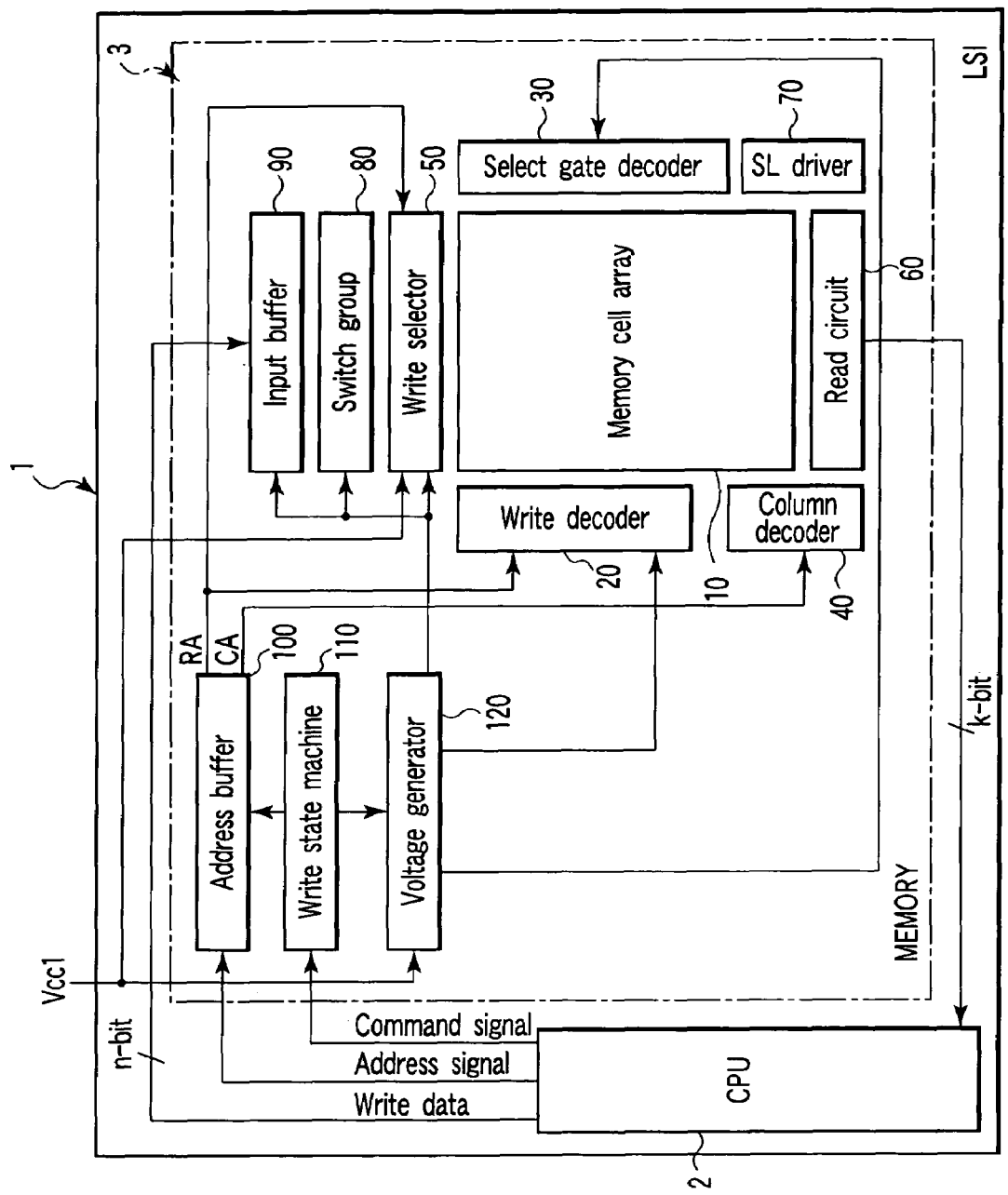
F I G. 1

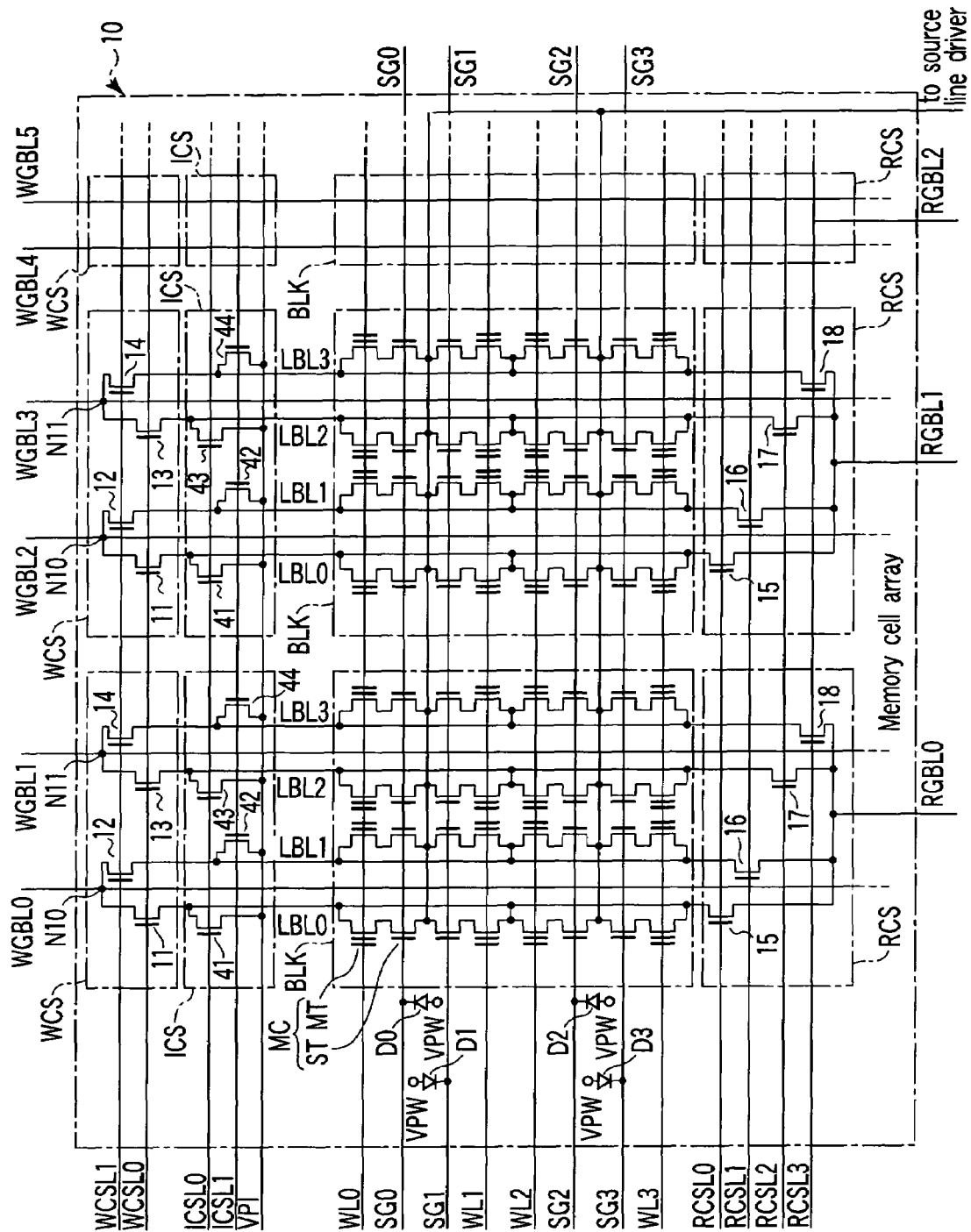
F I G. 2

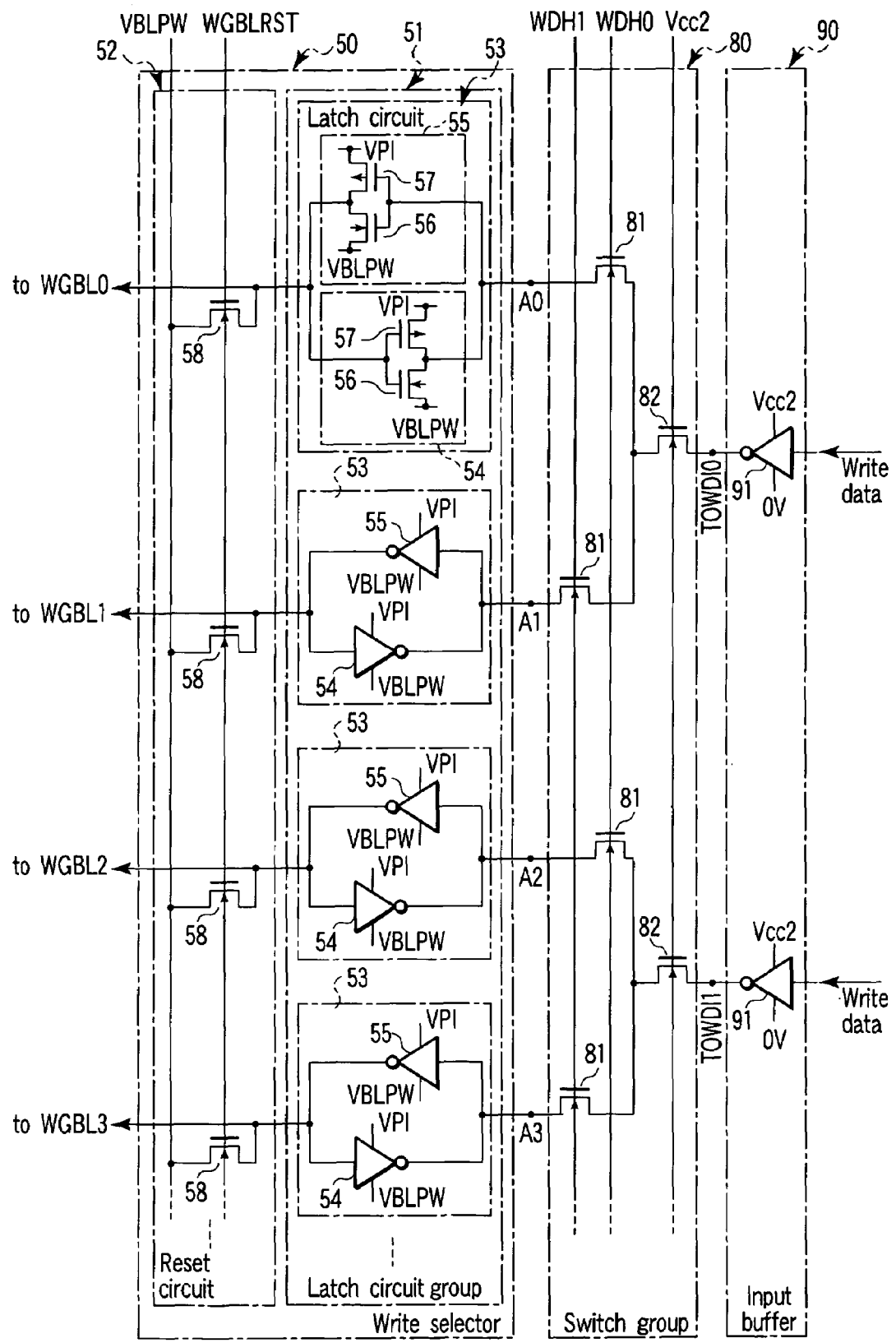
F I G. 3

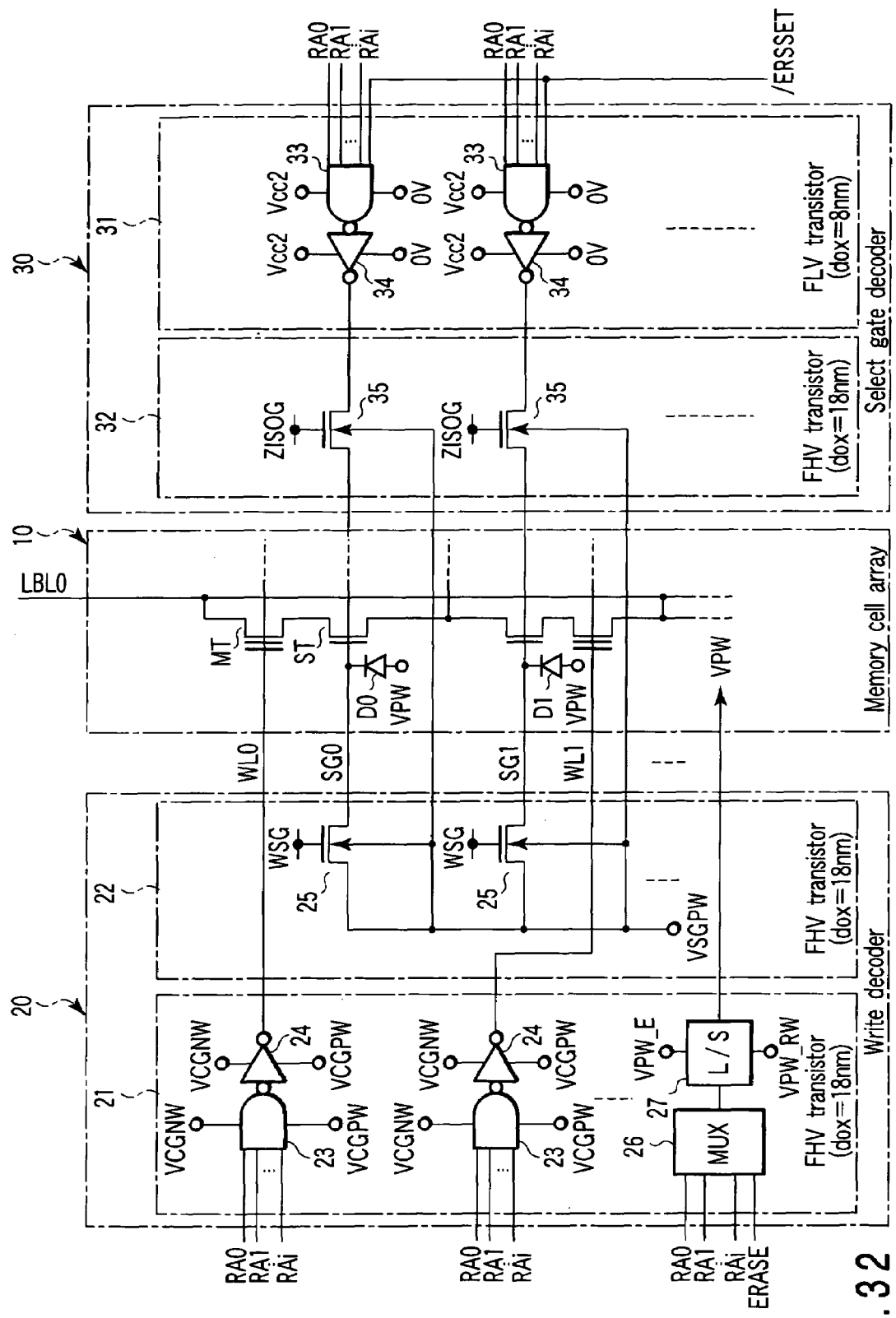
F I G. 32

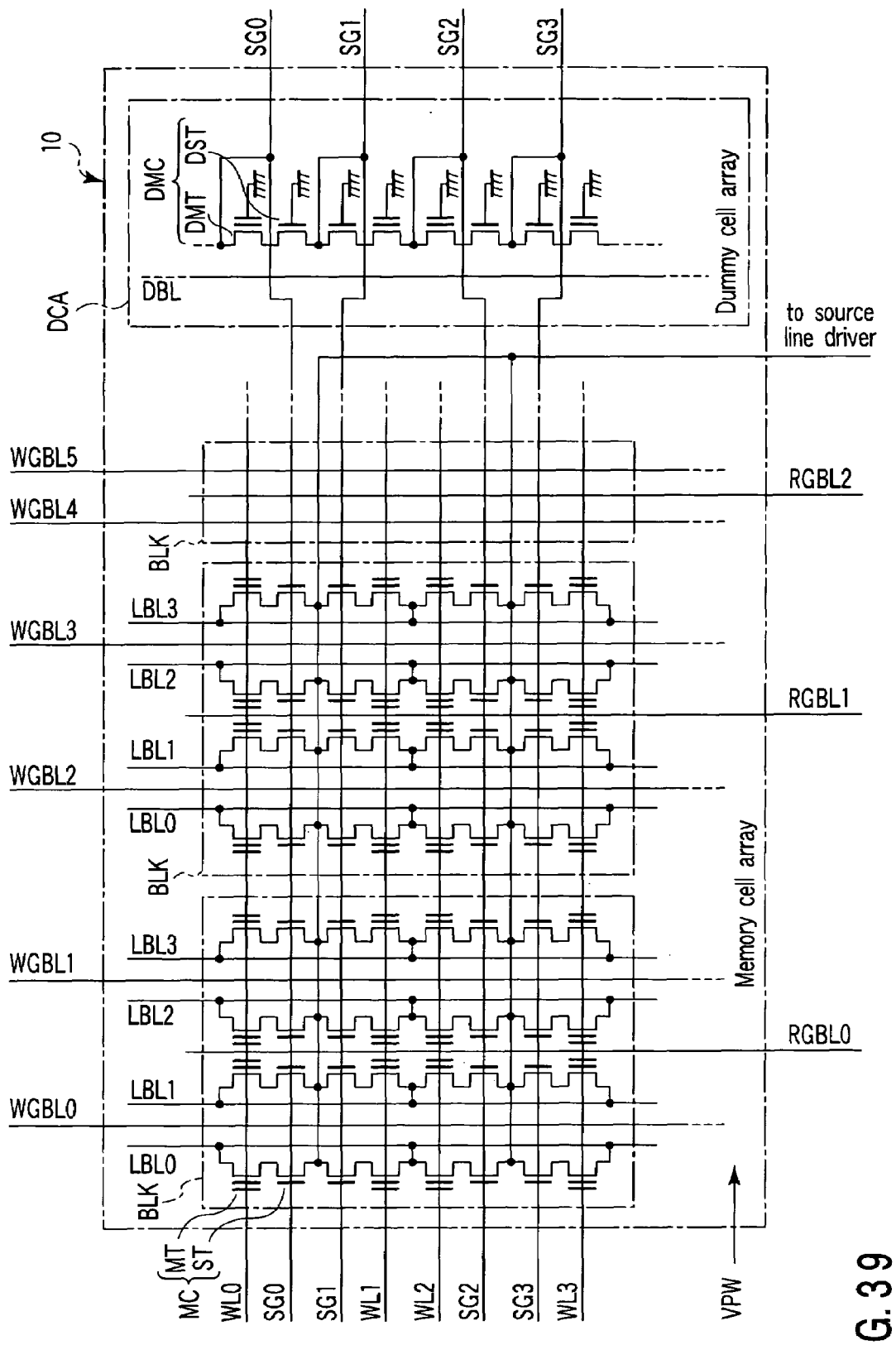
F I G. 39

SEMICONDUCTOR MEMORY DEVICE WITH MOS TRANSISTORS EACH HAVING FLOATING GATE AND CONTROL GATE

CROSS-REFERENCE TO RELATED APPLICATIONS

This application is based upon and claims the benefit of priority from prior Japanese Patent Application No. 2004-300522, filed Oct. 14, 2004, the entire contents of which are incorporated herein by reference.

BACKGROUND OF THE INVENTION

1. Field of the Invention

This invention relates to a semiconductor memory device. More specifically, this invention relates to a nonvolatile semiconductor memory device with MOS transistors each having a floating gate and a control gate.

2. Description of the Related Art

NOR and NAND flash memories have been widely used as nonvolatile semiconductor memory devices.

In recent years, a flash memory combining the features of the NOR flash memory and the NAND flash memory has been proposed. This type of flash memory has been disclosed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type (hereinafter, referred to as a 2Tr flash memory) has memory cells each of which includes two MOS transistors. In such a memory cell, one MOS transistor, which functions as a nonvolatile memory section, includes a control gate and a floating gate and is connected to a bit line. The other MOS transistor, which is connected to a source line, is used to select a memory cell.

A 2Tr flash memory operates using a positive voltage and a negative voltage. Therefore, a conventional configuration has the following problem particularly in an erase operation: a high voltage is applied to the gate insulting films of the select MOS transistors, which impairs the reliability of the memory cells.

BRIEF SUMMARY OF THE INVENTION

A semiconductor memory device according to an aspect of the present invention includes: a memory cell array in which a plurality of memory cells are arranged in a matrix, each including a first MOS transistor having a charge accumulation layer and a control gate and a second MOS transistor which has a drain connected to a source of the first MOS transistor;

word lines each of which connects commonly the control gates of the first MOS transistors in a same row;

select gate lines each of which connects commonly the gates of the second MOS transistors in a same row; and switch elements which, in an erase operation, electrically connect the select gate lines to a semiconductor substrate in which the memory cell array is formed.

A memory card according to an aspect of the present invention includes a semiconductor memory device which includes: a memory cell array in which a plurality of memory cells are arranged in a matrix, each including a first MOS transistor having a charge accumulation layer and a control gate and a second MOS transistor which has a drain connected to a source of the first MOS transistor;

word lines each of which connects commonly the control gates of the first MOS transistors in a same row;

select gate lines each of which connects commonly the gates of the second MOS transistors in a same row; and switch elements which, in an erase operation, electrically connect the select gate lines to a semiconductor substrate in which the memory cell array is formed.

BRIEF DESCRIPTION OF THE SEVERAL VIEWS OF THE DRAWING

FIG. 1 is a block diagram of a system LSI according to a first embodiment of the present invention;

FIG. 2 is a circuit diagram of the memory cell array of a 2Tr flash memory according to the first embodiment;

FIG. 3 is a circuit diagram of the write circuit, switch group, and input buffer of the 2Tr flash memory according to the first embodiment;

FIG. 32 is a circuit diagram of the memory cell array, write decoder and select gate decoder of the 2Tr flash memory according to the second embodiment;

FIG. 39 is a circuit diagram of the memory cell array in a 2Tr flash memory according to a modification of the third embodiment;

DETAILED DESCRIPTION OF THE INVENTION

Figure 4:
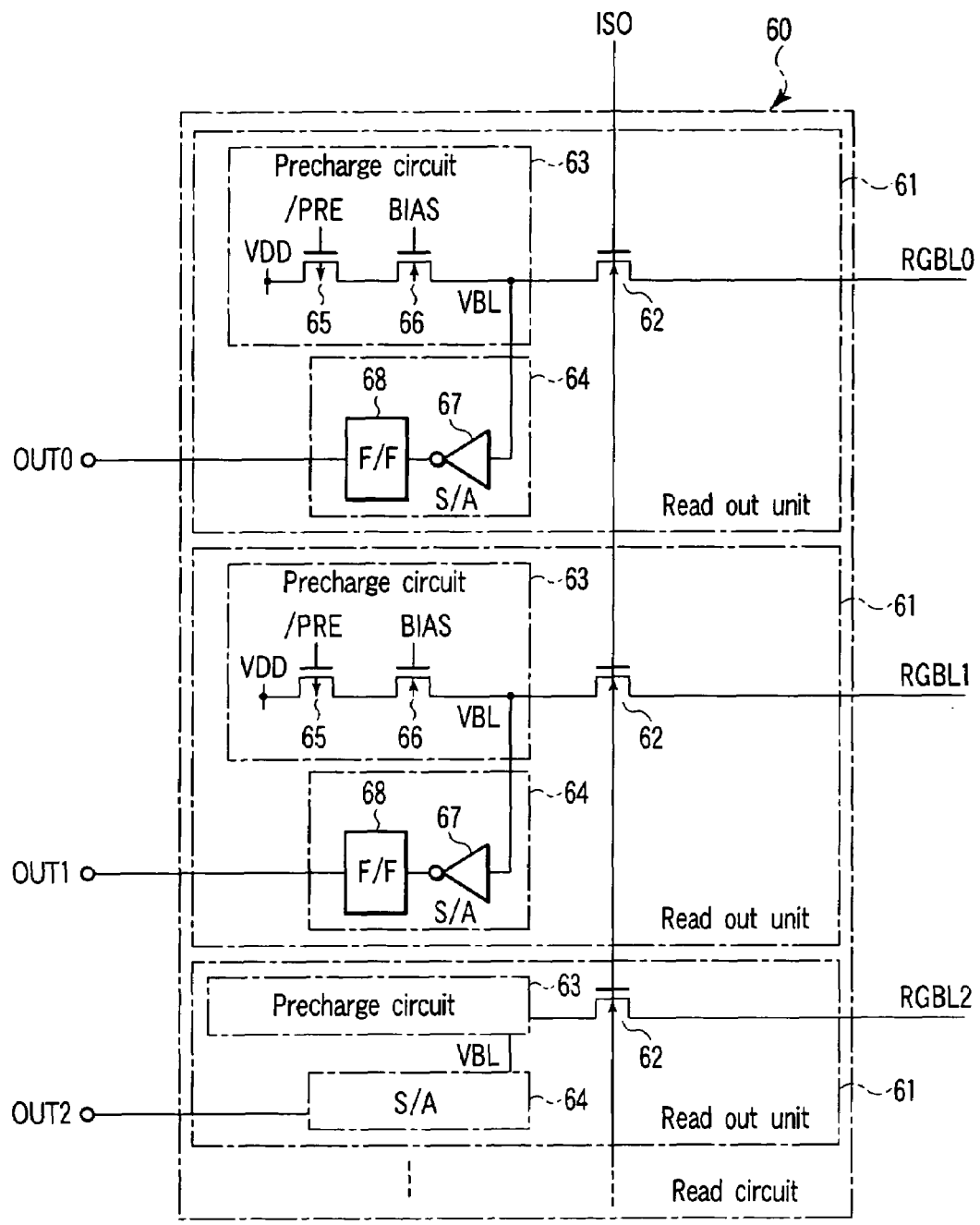
FIG. 4 is a circuit diagram of the read circuit of the 2Tr flash memory according to the first embodiment.

A semiconductor memory device according to a first embodiment of the present invention will be explained. FIG. 1 is a block diagram of a system LSI according to the first embodiment.

As shown in FIG. 1, the system LSI 1 comprises a CPU 2 and a 2Tr flash memory 3. The CPU 2 exchanges data with the flash memory 3. The flash memory 3 comprises a memory cell array 10, a write decoder 20, a select gate decoder 30, a column decoder 40, a write circuit 50, a read circuit 60, a source line driver 70, switch group 80, an input buffer 90, an address buffer 100, a write state machine 110, and a voltage generator 120. A voltage of Vcc1 (1.25 to 1.65V) is externally applied to the LSI 1. The voltage Vcc1 is applied to the LSI 1.

The memory cell array 10 has a plurality of memory cells arranged in a matrix. The configuration of the memory cell array 10 will be explained with reference to FIG. 2. FIG. 2 is a circuit diagram of a part of the memory cell array 10.

As shown in FIG. 2, the memory cell array 10 has (m+1)×(n+1) memory cell blocks BLK (m and n are natural numbers) and diodes D0 to D(4m−1). The memory cell array 10 further has write column selectors WCS, read column selectors RCS, and write inhibit column selectors ICS, which are provided for the memory cell blocks BLK in a one-to-one correspondence.

Each of the memory cell blocks BLK includes a plurality of memory cells MC. The memory cells MC is the memory cells of a 2Tr flash memory. Specifically, each of the memory cells MC includes a memory cell transistor MT and a select transistor ST. The source of the memory cell transistor MT is connected to the drain of the select transistor ST. The memory cell transistor MT has a stacked gate structure that includes a floating gate on a semiconductor substrate with a gate insulating film interposed therebetween and a control gate on the floating gate with an inter-gate insulating film interposed therebetween. Memory cells MC adjoining each other in the column direction share the drain region of the memory cell transistor MT or the source region of the select transistor ST. Each of the memory cell blocks BLK includes (4×4) memory cells MC. Although the number of memory cells MC arranged in the column direction is 4 in FIG. 2, this is illustrative and not restrictive. For instance, the number of memory cells MC may be 8 or 16. The drain regions of the memory cell transistors MT arranged in four columns are connected to four local bit lines LBL0 to LBL3 in a one-to-one correspondence. One end of each of local bit lines LBL0 to LBL3 is connected to a write column selector WCS and the other end is connected to a read column selector RCS.

In the memory cell array 10, the control gates of the memory cell transistors MT in a same row are connected commonly to any one of word lines WL0 to WL(4m+3). The gates of the select transistors ST in a same row are connected commonly to any one of select gate lines SG0 to SG(4m+3). Local bit lines LBL0 to LBL3 connect the memory cell transistors to one another in each of the memory cell blocks BLK, whereas the word lines WL and select gate lines SG connect the memory cell transistors and select transistors in a same row to one another even across the memory cell blocks.

Word lines WL0 to WL(4m+3) are connected to the write decoder 20. One end of each of the select gate lines SG0 to SG(4m+3) is connected to the select gate decoder 30 and the other end is connected to the write decoder 20. The source region of a select transistor ST is shared by a plurality of memory cell blocks BLK and then is connected to the source line driver 70.

Next, the configuration of a write column selector WCS will be explained. Each of the write column selectors WCS includes four MOS transistors 11 to 14. One end of the current path of each of the MOS transistors 11 to 14 is connected to one end of the corresponding one of local bit lines LBL0 to LBL3. The other ends of the current paths of the MOS transistors 11 and 12 are connected to each other and the other ends of the current paths of the MOS transistors 13 and 14 are connected to each other. Hereinafter, the common junction node of the MOS transistors 11 and 12 is called node N10 and the common junction node of the MOS transistors 13 and 14 is called node N11. The gates of the MOS transistors 11 to 14 are connected to any one of write column select lines WCSL0 to WCSL(2m+1). The MOS transistors 11, 13 included in the write column selectors WCS in a same row are connected to the same one of the write column select lines WCSL(h−1) (h: 1, 3, 5, . . . ). The MOS transistors 12, 14 included in the write column selectors WCS in the same row are connected to the same one of the write column select lines WCSLh. One of the write column select lines WCSL0 to WCSL(2m+1) is selected by the column decoder 40 in a write operation.

Each of the nodes N10, N11 in the write column selector WCS is connected to any one of write global bit lines WGBL0 to WGBL(2n+1). Each of the write global bit lines WGBL0 to WGBL(2n+1) is connected commonly to the nodes N10 or nodes N11 of the write column selectors WCS in a same column. Write global bit lines WGBL0 to WGBL (2n+1) are connected to the write circuit 50.

Next, the configuration of a read column selector RCS will be explained. Each of the read column selectors RCS includes four MOS transistors 15 to 18. One end of the current path of each of the MOS transistors 15 to 18 is connected to one end of the corresponding one of the local bit lines LBL0 to LBL3. The other ends of the current paths of the MOS transistors 15 and 18 are connected to each other. Hereinafter, the common junction node of the MOS transistors 15 and 18 is called node N20. Each of the gates of the MOS transistors 15 to 18 is connected to a different one of the read column select lines RCSL0 to RCSL(4m+3). Each of the MOS transistors 15 to 18 included in the read column selectors RCS in a same row is connected to the same one of the read column select lines RCSL0 to RCSL (4m+3). One of the read column select lines RCSL0 to RCSL(4m+3) is selected by the column decoder 40 in a read operation.

Node 20 in the read column selector RCS is connected to any one of the read global bit lines RGBL0 to RGBLn. Each of the read global bit lines RGBL0 to RGBLn is connected commonly to the nodes N20 in the read column selectors RCS in a same column. Read global bit lines RGBL0 to RGBLn are connected to the read circuit 70 via the column selector 60.

Next, the configuration of a write inhibit column selector ICS will be explained. Each of the write inhibit column selectors ICS includes four MOS transistors 41 to 44. One end of the current path of each of the MOS transistors 41 to 44 is connected to one end of the corresponding one of the local bit lines LBL0 to LBL3. A write inhibit voltage VPI is applied commonly to the other ends of the current paths of the MOS transistors 41 and 44. The write inhibit voltage VPI is generated by the voltage generator 130. The gates of the MOS transistors 41 to 44 are connected to any one of the write inhibit column select lines ICSL0 to ICSL(2m+1). The MOS transistors 41, 43 included in the write inhibit column selectors ICS in a same row are connected to the same one of the write column select lines WCSL(h−1) (h: 1, 3, 5, . . . ). The MOS transistors 42, 44 included in the write column selectors ICS in the same row are connected to the same one of the write column select lines WCSLh. One of the write inhibit column select lines ICSL0 to ICSL(2m+1) are selected by the column decoder 40 in a write operation.

Diodes D0 to D(4m+3) are provided for select gate lines SG0 to SG(4m+3) in a one-to-one correspondence. The cathodes of diodes D0 to D(4m+3) are connected to select gate lines SG0 to SG(4m+3), respectively. Their anodes are connected to the semiconductor substrate (or p-well region) in which the memory cell array is formed.

The configuration of the memory cell array 10 can also be explained as follows. In the memory cell array 10, a plurality of memory cells MC are arranged in a matrix. The control gates of the memory cell transistors MC of the memory cell MCs in a same row are connected commonly to a word line. The gates of the select transistors of the memory cells in the same row are connected to a select gate line. The drains of the memory cell transistors MT of four memory cells MC in a same column are connected commonly to any one of the local bit lines LBL0 to LBL3. Specifically, the memory cells MC in the memory cell array 10 are connected to a different one of the different local bit lines LBL0 to LBL3 in units of four memory cells MC arranged in a line. Then, one end of each of the local bit lines LBL0 in a same column and one end of each of the local bit lines LBL1 in a same column are connected commonly to any one of the write global bit lines WGBL0 to WGBL(2n+1) via the MOS transistors 11, 12, respectively. Moreover, one end of each of the local bit lines LBL2 in a same column and one end of each of the local bit lines LBL3 in a same column are connected commonly to any one of the write global bit lines WGBL- to WGBL(2n+1) via the MOS transistors 13, 14, respectively. The other ends of local bit lines LBL0 to LBL3 in the same column are connected equally to any one of the read global bit lines RGBL0 to RGBLn via the MOS transistors 15 to 18. Furthermore, local bit lines LBL0 to LBL3 are connected via the MOS transistors 41 to 44 to write inhibit nodes, respectively. Then, the sources of the select transistors ST of the memory cells MC are connected to one another and then are connected to the source line driver. In the memory cell array with the above configuration, four columns of four memory cells MC connected to the same local bit line makes a single memory block BLK. The memory cell blocks in a same column are connected to a common write global bit line and a common read global bit line. The memory cell blocks BLK in a different column are connected to a different write global bit line and a different read global bit line. The number of memory cells in a memory cell block, the number of read global bit lines RGBL, and the number of write global bit lines WGBL are not limited to those in the embodiment.

Referring to FIG. 1, the explanation will be continued. The write circuit 50 not only latches write data but also resets the write global bit lines WGBL.

The input buffer 90 holds the write data given by the CPU 2.

The switch group 80 transfers the write data held in the input buffer 90 to the write circuit 50.

The configuration of the write circuit 50, switch group 80, and input buffer 90 will be explained with reference to FIG. 3. FIG. 3 is a circuit diagram of the write circuit 50, switch group 80, and input buffer 90.

First, the write circuit 50 will be explained. The write circuit 50 includes a latch circuit group 51 and a reset circuit 52. The latch circuit group 51 includes latch circuits 53 provided for write global bit lines WGBL0 to WGBL(2n+1) in a one-to-one correspondence. Each of the latch circuits 53 has two inverters 54, 55. The input terminal of the inverter 54 is connected to the output terminal of the inverter 55. The output terminal of the inverter 54 is connected to the input terminal of the inverter 55. The junction node of the input terminal of the inverter 54 and the output terminal of the inverter 55 makes the output node of the latch circuit 53, which is connected to the corresponding write global bit line. Each of the inverters 54, 55 has an n-channel MOS transistor 56 and a p-channel MOS transistor 57 whose current paths are connected in series. The source of the n-channel MOS transistor 56 is connected to VBLPW node and the source of the p-channel MOS transistor is connected to the write inhibit voltage node VPI. The gate of the n-channel MOS transistor 56 and the gate of the p-channel MOS transistor 57 are connected to one another. Then, the junction node of the drain of the p-channel MOS transistor 57 and the drain of the n-channel MOS transistor 56 in the inverter 55 is connected to the junction node of the gate of p-channel MOS transistor 57 and the gate of n-channel MOS transistor 56 in the inverter 54 and is further connected to a write global bit line. In addition, the junction node of the drain of the p-channel MOS transistor 57 and the drain of the n-channel MOS transistor 56 in the inverter 54 is connected to the junction node of the gate of the p-channel MOS transistor 57 and the gate of the n-channel MOS transistor 56 in the inverter 55. This junction node makes the input node of the latch circuit 53.

The reset circuit 52 includes n-channel MOS transistors 58 provided for write global bit lines WGBL0 to WGBL(2n+1) in a one-to-one correspondence. The drains of the n-channel MOS transistors 58 are connected to the corresponding write global bit lines. Their sources are connected commonly to VBLPW node and their gates are connected commonly to WGBLRST node.

The switch group 80 includes n-channel MOS transistors 81 provided for the latch circuits 53 in a one-to-one correspondence and n-channel MOS transistors 82. One end of each of the MOS transistors 81 is connected to the input node of the corresponding latch circuit 53. The other ends of the current paths of the two MOS transistors 81 each connected to adjacent latch circuits are connected to each other. That is, the MOS transistors 81 connected to the latch circuits 53 each corresponding to write global bit lines WGBL0, WGBL1 share the other end of their current path. The same holds true for the MOS transistors 81 connected to the latch circuits 53 each corresponding to write global bit lines WGBL2, WGBL3. The gates of the MOS transistors 81 connected to the latch circuits 53 corresponding to write global bit lines WGBL(h−1) (h=1, 3, 5, . . . ) are connected commonly to WDH0 node. The gates of the MOS transistors 81 connected to the latch circuits 53 corresponding to write global bit lines WGBLh are connected commonly to WDH1 node. The other ends of the current paths of the MOS transistors 81 connected to one another are connected to one end of the current path of a MOS transistor 82. A positive voltage Vcc2 (about 3V) is applied to the gates of the MOS transistors 82 at the same time. The positive voltage Vcc2 is, for example, generated by the voltage generator 120. Hereinafter, the junction nodes of the MOS transistors 81 and the input nodes of the latch circuits 53 are referred to as nodes A0 to A(2n+1).

Next, the input buffer 90 will be explained. The input buffer 90 includes inverters 91 provided for the MOS transistors 82 in the switch group 80 in a one-to-one correspondence. The write data supplied from the CPU 2 is input to the input node of the inverter 91. The output node of the inverter 91 is connected to the other end of the current path of the MOS transistor 82. The inverter 91 operates with a high-voltage power supply potential of Vcc2 and a low-voltage power supply potential of 0V. Hereinafter, the junction nodes of the output nodes of the inverters 181 and the MOS transistors 82 are called nodes TOWDI0 to TOWDI ((2n+1)/2).

Referring to FIG. 1, the explanation will be continued.

The column decoder 40 decodes a column address signal, thereby producing a column address decode signal. On the basis of the column address decode signal, the column select lines WCSL, RCSL, ICSL are selected.

In a read operation, the read circuit 60 precharges read global bit lines RGBL0 to RGBLn and amplifies the data read onto read global bit lines RGBL0 to RGBLn. Using FIG. 4, the configuration of the read circuit 60 will be explained. FIG. 4 is a circuit diagram of the read circuit 60.

The read circuit 60 includes read units 61 provided for read global bit lines RGBL0 to RGBLn in a one-to-one correspondence. Each of the read units 61 includes an isolating MOS transistor 62, a precharge circuit 63, and a sense amplifier 64.

Each of the precharge circuits 63 precharges the corresponding one of the read global bit lines RGBL0 to RGBLn in a read operation. The precharge circuit 63 includes a p-channel MOS transistor 65 and an n-channel MOS transistor 66. The source of the p-channel MOS transistor 65 is connected to a power supply voltage VDD (e.g., 1.3V). A precharge signal /PRE is input to its gate. The drain of the n-channel MOS transistor 66 is connected to the drain of the MOS transistor 65. A bias signal BIAS is input to its gate.

The sense amplifier 64 amplifies the data read onto the corresponding one of the read global bit lines RGBL0 to RGBLn in a read operation. The sense amplifier 64 includes an inverter 67 and a flip-flop 68. The input node of the inverter 67 is connected to the source of the MOS transistor 66. The output node of the inverter 67 is connected to the input node of the flip-flop 68. The amplified read data is output at the corresponding one of the output nodes OUT0 to OUtn of the flip-flops 68.

One end of the current path of the isolating MOS transistor 62 is connected to the corresponding one of the read global bit lines RGBL0 to RGBLn. The other end of its current path is connected to the source of the MOS transistor 66 and the input node of the inverter 67. The n-channel MOS transistor is used as isolating MOS transistor 62. That is, the precharge circuit 63 and sense amplifier 64 are connected to the corresponding one of the read global bit lines RGBL0 to RGBLn via the isolating MOS transistor 62. Then, the gates of all of the MOS transistors 62 are connected to one another. A signal ISO is input to the common junction of the gates.

Referring to FIG. 1, the explanation will be continued.

The source line driver 70 supplies a voltage to the source lines SL.

The address buffer 100 holds an address signal supplied from the CPU 2. Then, the address buffer 100 supplies a column address signal CA to the column decoder 40 and a row address signal RA to the write decoder 20 and select gate decoder 30.

The write state machine 110 controls the operation of each circuit included in the flash memory 3 on the basis of a command signal supplied from the CPU 2, thereby performing timing control in writing, erasing, or reading data, and executing a specific algorithm determined for each operation.

The voltage generator 120 generates a plurality of internal voltages on the basis of the voltage Vcc1 (about 1.25 to 1.65V) externally input. The voltage generator 120 has a negative charge pump circuit and a positive charge pump circuit. Then, the voltage generator 120 generates a negative voltage VBB1 (=−7V), VBB2 (=−8V) and positive voltages VPP1 (=12V) and Vcc2 (=3V).

The write decoder 20 not only selects any one of the word lines WL0 to WL(4m+3) and applies a positive potential VPP (12V) to the selected word line but also a negative potential VBB1 (−7V) to the p-well region where the memory cell array has been formed and to all of the select gate lines SG0 to SG(4m+3), in a write operation. The write decoder 20 applies not only a negative potential VBB (−8V) to all of the word lines but also the positive voltage VPP to the p-well region where the memory cell array has been formed, in an erase operation.

The select gate decoder 30 selects any one of the select gate lines SG0 to SG(4m+3) and applies a positive potential Vcc2 to the selected select gate line in a read operation. The select gate decoder 30 further controls a signal ISO, thereby controlling the operation of the isolating MOS transistor 62.

Figure 5:
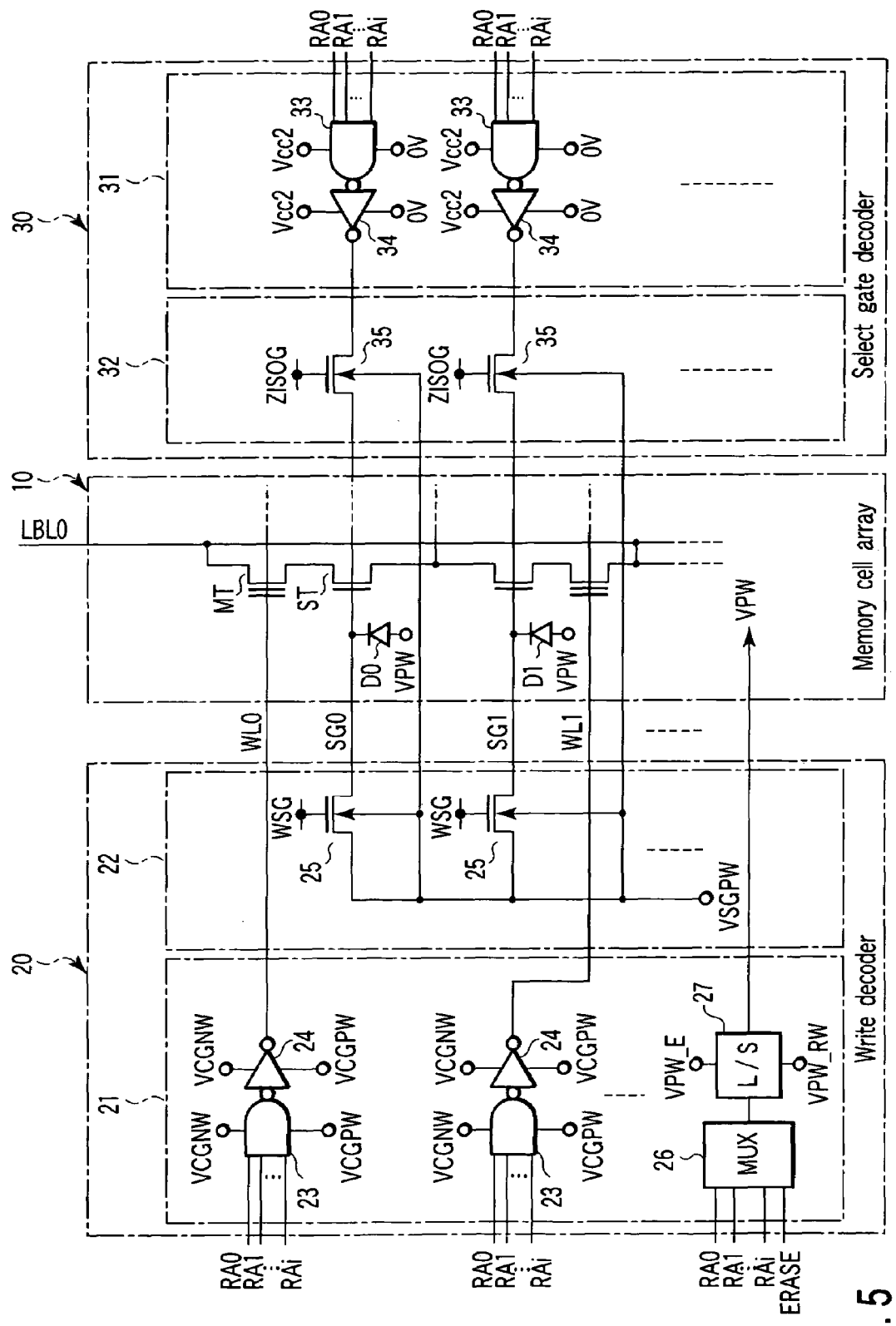
FIG. 5 is a circuit diagram of the write decoder and select gate decoder of the 2Tr flash memory according to the first embodiment.

Using FIG. 5, the configuration of the write decoder 20 and select gate decoder 30 will be explained. First, the configuration of the select gate decoder 30 will be explained. The select gate decoder 30 includes a row address decode circuit 31 and a switch element group 32. The row address decode circuit 31, which operates on a power supply voltage Vcc2, decodes (i+1)-bit row address signals RA0 to RAi, thereby producing a row address decode signal. The row address decode circuit 31 has NAND circuits 33 and inverters 34 provided for select gate lines SG0 to SG(4m+3) in a one-to-one correspondence. The NAND circuit 33 carries out the NAND operation of each bit in the row address signals RA0 to RAi. Then, the inverter 34 inverts the result of the NAND operation and outputs the resulting signal as a row address decode signal.

The switch element group 32 has n-channel MOS transistors 35. The n-channel MOS transistors 35 are provided for select gate lines SG0 to SG(4m+3) in a one-to-one correspondence. Then, the outputs of the inverters 34 are supplied to select gate lines SG0 to SG(4m+3) via the current paths of the n-channel MOS transistors 35 in a one-to-one correspondence. A control signal ZISOG is input to the gates of the n-channel MOS transistors 35. The control signal ZISOG brings the MOS transistors into the off state in a write and an erase operation and into the on state in a read operation.

Next, the configuration of the write decoder 20 will be explained. The write decoder 20 includes a row address decode circuit 21 and a switch element group 22. The row address decode circuit 21 decodes (i+1)-bit row address signals RA0 to RAi, thereby producing a row address decode signal. The row address decode signal is supplied to word lines WL0 to WL(4m+3). The row address decode circuit 21 has NAND circuits 23 and inverters 24 provided for word lines WL0 to WL(4m+3) in a one-to-one correspondence. The NAND circuit 23 and inverter 24 have their high-voltage-side power supply voltage nodes connected to VCGNW node and their low-voltage-side power supply voltage nodes connected to VCGPW node. The NAND circuit 23 carries out the NAND operation of each bit in the row address signals RA0 to RAi. Any one of Vcc1, 0V, and the positive voltage VPP and the negative voltage VBB1, VBB2 generated by the voltage generator 120 is applied to the power-supply voltage nodes VCGNW, VCGPW. Then, the inverter 24 inverts the result of the NAND operation and outputs the resulting signal as a row address decode signal.

The write decoder 20 further includes a multiplexer 26 and a level shift circuit 27. The multiplexer 26 and level shift circuit 27, which are provided in each p-well region where the memory cell array 10 is formed, apply a voltage VPW to the p-well region. The multiplexer 26 multiplexes row address signals R0 to RAi with an erase signal ERASE. The level shift circuit 27 level-shifts the multiplexed signal and supplies the resulting signal as a voltage VPW to the p-well. The level shift circuit 27 has its high-voltage-side power supply voltage node connected to VPW_E node and its low-voltage-side power supply node connected to VPW_RW node. The multiplexer 26 and level shift circuit 27 apply the positive voltage VPP from VPW_E node to VPW node in an erase operation, the negative voltage VBB1 from VPW_RW node to VPW node in a write operation, and 0V from VPW_RW node to VPW node in a read operation.

The switch element group 22 has n-channel MOS transistors 25. The n-channel MOS transistors 25 are provided for select gate lines SG0 to SG(4m+3) in a one-to-one correspondence. One end of the current path of each of the MOS transistors 25 is connected to the corresponding one of the select gate lines SG0 to SG(4m+3). The other ends of the current paths are connected to VSGPW node. VBB1 or VPP generated by the voltage generator 120 or 0V is applied to VSGPW node. A control signal WSG is input to the gates of the MOS transistors 25. The control signal WSG turns on the MOS transistors 25 in a write operation and turns off the MOS transistors 25 in an erase and a read operation. The voltage VPW is also applied to the anodes of diodes D0 to D(4m+3) in the memory cell array 10.

Figure 6:
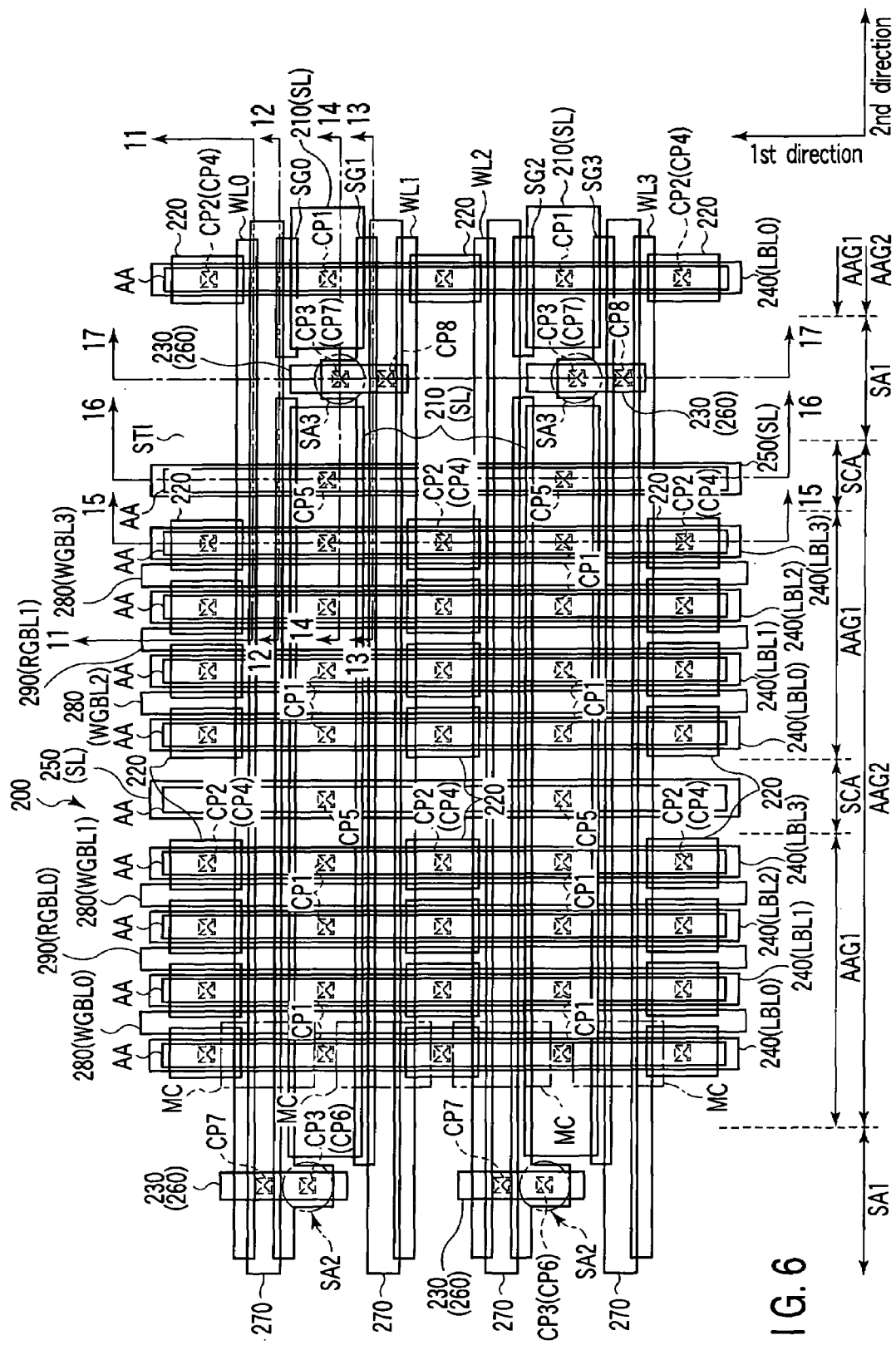
FIG. 6 is a plan view of the memory cell array included in the 2Tr flash memory according to the first embodiment.

Next, using FIGS. 6 to 10, a plane structure of the memory cell array 10 included in the 2Tr flash memory 3 will be explained. FIG. 6 is a plan view of a part of the memory cell array 10. FIGS. 7 to 10 are plan views showing plane patterns of metal wiring layers of a first to a fourth layer, respectively, together with element regions, word lines, and select gate lines. In FIGS. 7 to 10, the regions shown correspond to those in FIG. 6.

As shown in FIGS. 6 to 10, in the semiconductor substrate (p-well region) 200, a plurality of strip-shaped element regions AA extending in a first direction are formed in a second direction perpendicular to the first direction. Strip-shaped word lines WL0 to WL(4m+3) and select gate lines SG0 to SG(4m+3), which extend in the second direction, are formed so as to cross the element regions AA. In the regions where word lines WL0 to WL(4m+3) cross the element regions AA, memory cell transistors MT are formed. In the regions where select gate lines SG0 to SG(4m+3) cross the element regions AA, select transistors ST are formed.

In the regions where word lines WL0 to WL(4m+3) cross the element regions AA, memory cell transistors MT are formed. The memory cell transistors MT have floating gates (not shown) isolated on a memory cell transistor MT basis. Like a memory cell transistor MT, a select transistor ST has a control gate and a floating gate. However, differently from a memory cell transistor MT, the floating gate of a select transistor is shared by select transistors ST adjoining in the second direction. Adjacent memory cells have their select gate lines SG or word lines adjoining each other.

Hereinafter, a group of four columns of element regions AA is referred to as a first element region group AAG1. A region where a column of element regions AA is formed between adjacent first element region groups AAG1 is referred to as a source contact region SCA. The memory cells MC formed in the first element region groups AAG1 are used for storing data. The memory cells MC in the source contact region SCA are dummy memory cells and are not used for storing data. A stitch region SA1 is formed in units of two columns of first element region groups AAG1. In the first embodiment, no element region AA is formed in the stitch region SA1. The width of the stitch region SA1 is almost equal to the sum of the width of an element region AA and the width of the element isolating region STI formed between element regions AA. On the stitch region SA1, too, word lines WL0 to WL(4m+3) and select gate lines SG0 to SG(4m+3) are formed. However, word lines WL0 to WL(4m+3) and select gate lines SG0 to SG(4m+3) existing in the stitch region SA1 do not practically constitute the memory cells. In the stitch region SA1, a part of each of the select gate lines SG0 to SG(4m+3) is made wider. The region made wider in the select gate line is referred to as a shunt region SA2. The shunt regions SA2 are provided in select gate line SG0 to SG(4m+3) alternately in the second direction. Specifically, in a stitch region SA1, a shunt region SA2 is formed in each of the select gate lines SG0, SG2, SG4, . . . . In another stitch region SA1 adjacent to the stitch region, a shunt region SA2 is formed in each of the select gate lines SG1, SG3, SG5, . . . . The select gate lines where no shunt region SA2 is formed are partially removed in the stitch region SA1. The shunt region SA2 is formed so as project toward the adjacent select gate lines. Hereinafter, the region obtained by combining a first element region group AAG1 and a source contact region SCA is referred to as a second element region group AAG2.

Figure 7:
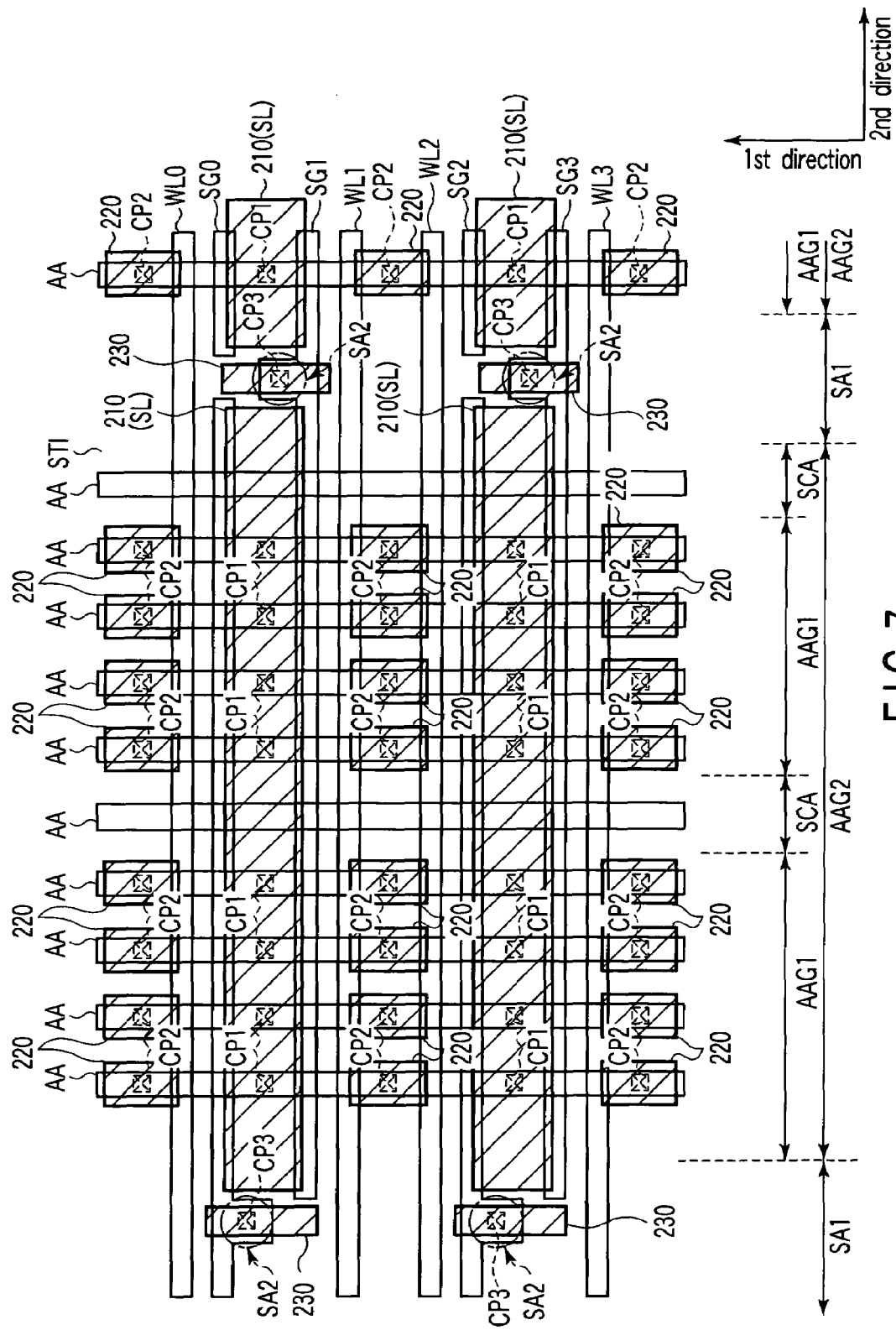
FIG. 7 is a plan view of the memory cell array included in the 2Tr flash memory according to the first embodiment, showing a plane pattern of a metal wiring layer of a first layer.

Next, using FIGS. 6 and 7, a pattern of a first-layer metal wiring layer existing above word line WL0 to WL(4m+3) and select gate lines SG0 to SG(4m+3) will be explained. In FIG. 7, the shaded region is a metal wiring layer of a first-layer metal wiring layer.

As shown in FIG. 7, between adjacent select gate lines SG (between SG0 and SG1, between SG2 and SG3, . . . ), a strip-shaped metal wiring layer 210 extending in the second direction is formed. The metal wiring layer 210 is a part of a source line SL. The metal wiring layers 210 are isolated from one another by stitch regions SA1 in its longitudinal direction (or the second direction). That is, the metal wiring layers 210 are independent on a second element region group AAG2 basis. Each of the metal wiring layer 210 is connected to the source region of a select transistor ST by a contact plug CP1. In the first embodiment, in the source contact region SCA, no contact plug CP1 is formed, with the result that the metal wiring layer 210 is not electrically connected to the source region of the memory cell in the source contact region SCA. On the drain region of the memory cell transistor MT in the first element region group AAG1, an island pattern of metal wiring layer 220 is formed. The metal wiring layers 220 are isolated from one another. Each of the metal wiring layers 220 is connected to the drain of the corresponding memory cell transistor MT by a contact plug CP2. Therefore, metal wiring layer 220 along in the second direction and a strip-shaped metal wiring layer 210 along in the second direction are provided alternately in the first direction. On the shunt region SA2, an island pattern of metal wiring layer 230 is formed. The metal wiring layer 230 is connected to the shunt region SA2 of the corresponding select gate line SG by a contact plug CP3. The metal wiring layer 230 is extended in the first direction from the top of the corresponding select gate line SG to the top of the region from which the adjacent select gate line SG has been removed.

Figure 8:
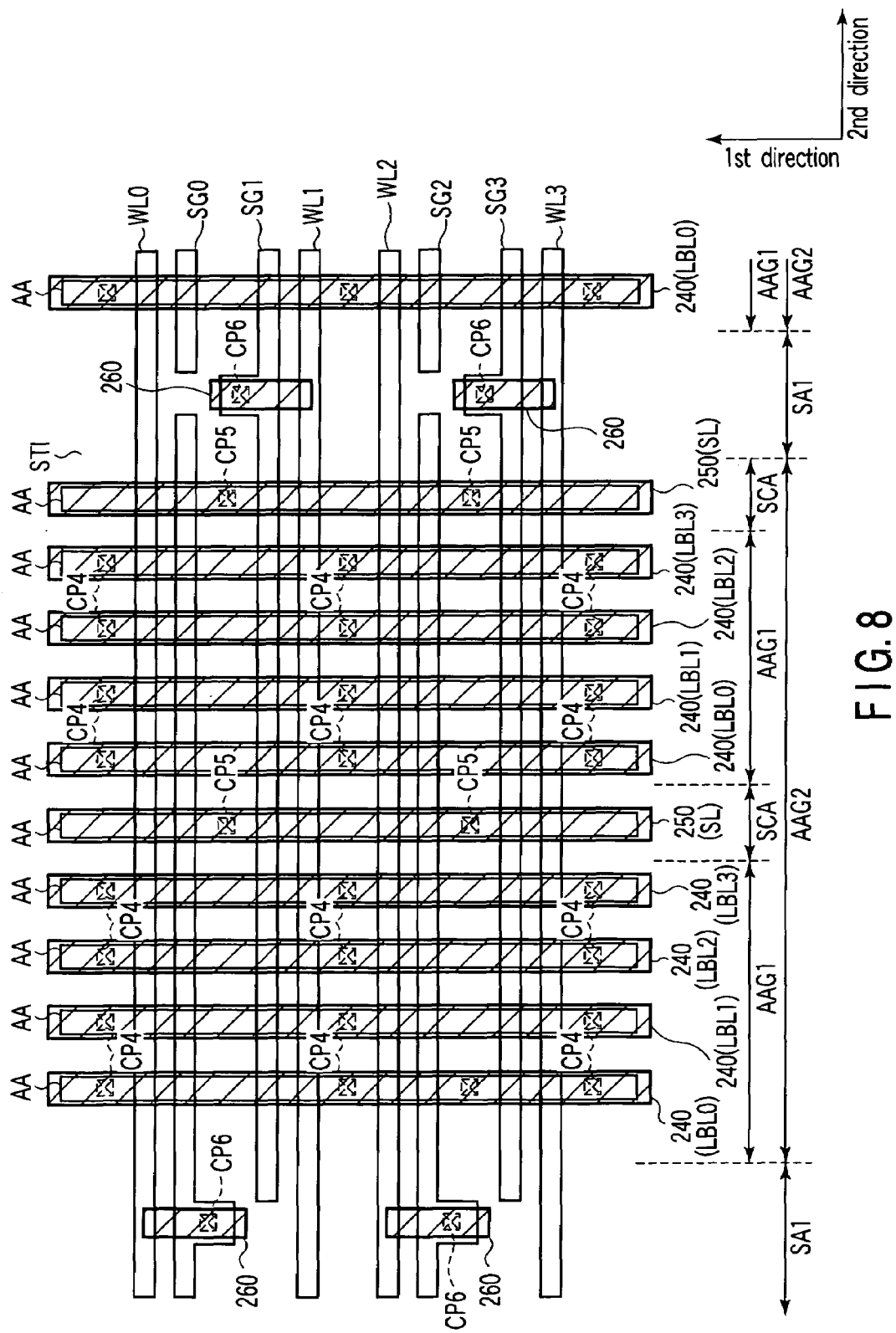
FIG. 8 is a plan view of the memory cell array included in the 2Tr flash memory according to the first embodiment, showing a plane pattern of a metal wiring layer of a second layer.

Next, using FIGS. 6 and 8, a pattern of a second-layer metal wiring layer existing on the first-layer metal wiring layers 210 to 230 will be explained. In FIG. 8, the shaded region is the second-layer metal wiring layer.

As shown in FIG. 8, in a first element region AAG1, strip-shaped metal wiring layers 240 are formed in the first direction above element regions AA. The metal wiring layers 240 function as local bit lines LBL0 to LBL3. The metal wiring layers 240 are connected to the first-layer metal wiring layer 220 by contact plugs CP4. In source contact regions SCA, metal wiring layers 250 whose pattern is similar to that of the metal wiring layers 240 are formed. Therefore, the line width of the metal wiring layers 250 is the same as that of the metal wiring layers 240. The metal wiring layers 250 function as part of the source lines SL. The metal wiring layers 250 are connected to the first-layer metal wiring layers 210 by contact plugs 5. That is, a plurality of metal wiring layers 210 isolated in the first direction are connected to one another by a metal wiring layer 250. In the stitch region SA1, metal wiring layers 260 with an island pattern are formed. The metal wiring layers 260 are formed so as to correspond to the first-layer metal wiring layers 230. The shape of a metal wiring layer 260 is such that the layer 260 is extended more to the adjacent word line than the metal wiring layer 230 and a part of the layer 260 exists above a word line. The metal wiring layers 260 are connected to the metal wiring layers 230 by contact plugs CP6. While in FIGS. 6 and 8, the contact plugs CP6 are directly above the shunt regions SA2, the present embodiment is not limited to this, as long as the contact plugs CP6 are provided in positions where the metal wiring layers 230 and 260 can be connected.

Figure 9:
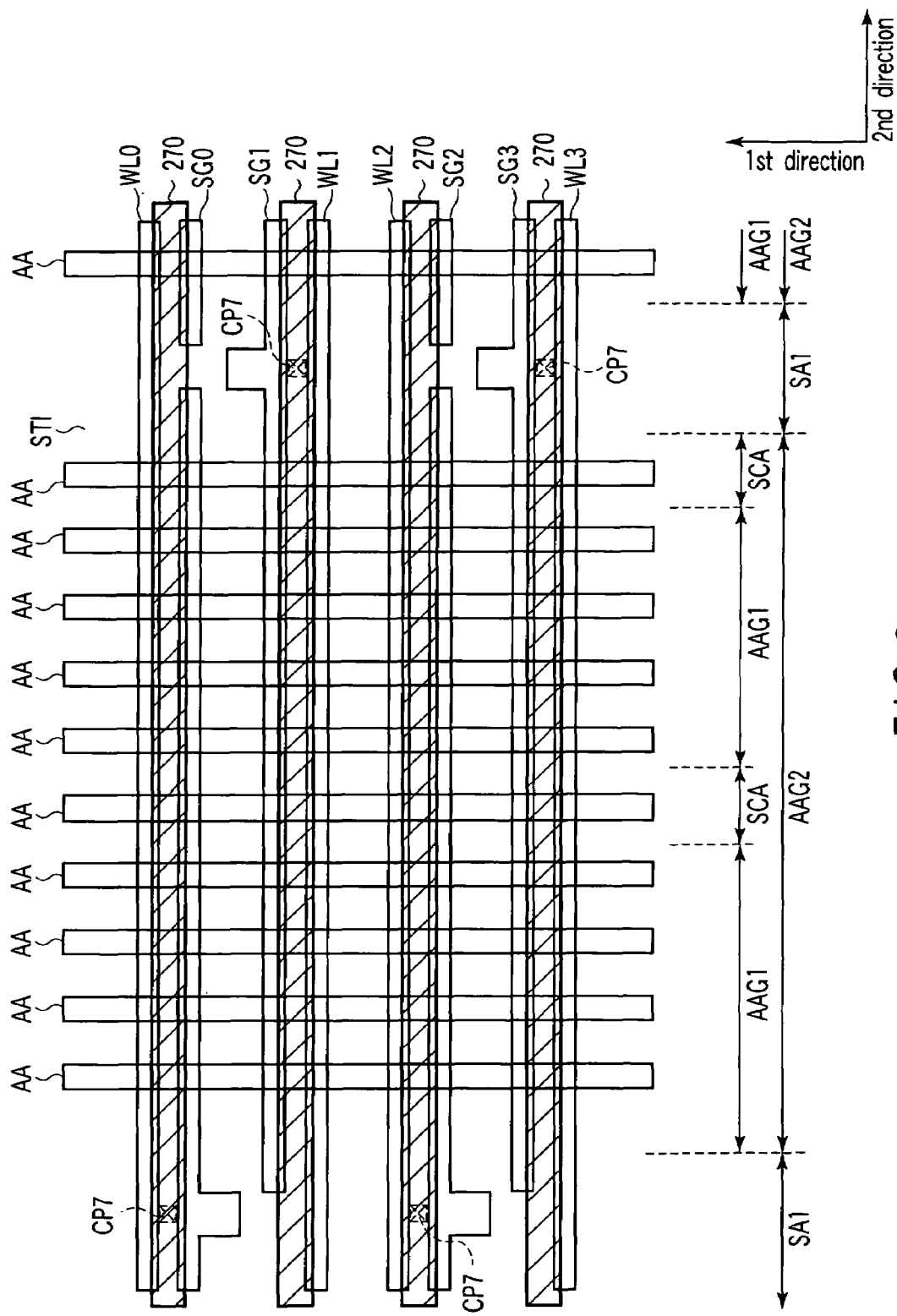
FIG. 9 is a plan view of the memory cell array included in the 2Tr flash memory according to the first embodiment, showing a plane pattern of a metal wiring layer of a third layer.

Next, using FIGS. 6 and 9, a pattern of a third-layer metal wiring layer existing on the second-layer metal wiring layers 240 to 260 will be explained. In FIG. 9, the shaded region is the third-layer metal wiring layer.

As shown in FIG. 9, strip-shaped metal wiring layers 270 are formed in the second direction. The metal wiring layers 270 are formed for sets of word line and select gate line (a set of WL0 and SG1, a set of WL1 and SG1, . . . ) in a one-to-one correspondence. The metal wiring layers 270 are connected by contact plugs CP7 to the second-layer metal wiring layers 260 electrically connected to the corresponding select gate lines. Specifically, each of the metal wiring layers 270 function as a shunt wire for each of the select gate lines SG0 to SG(4m+3). Each of the metal wiring layers 270 is formed in a region between the central part of a word line WL and the central part of the select gate line corresponding to the word line WL. In other words, the metal wiring layer 270 runs through the central part of the memory cell MC. Therefore, the metal wiring layers 270 are arranged at equal intervals in the first direction. The metal wiring layers 270 are connected to each other between second element groups AA2 adjoining each other in the second direction. One end of each metal wiring layer 270 is connected to the select gate decoder 30 and the other end is connected to the write decoder 20.

Figure 10:
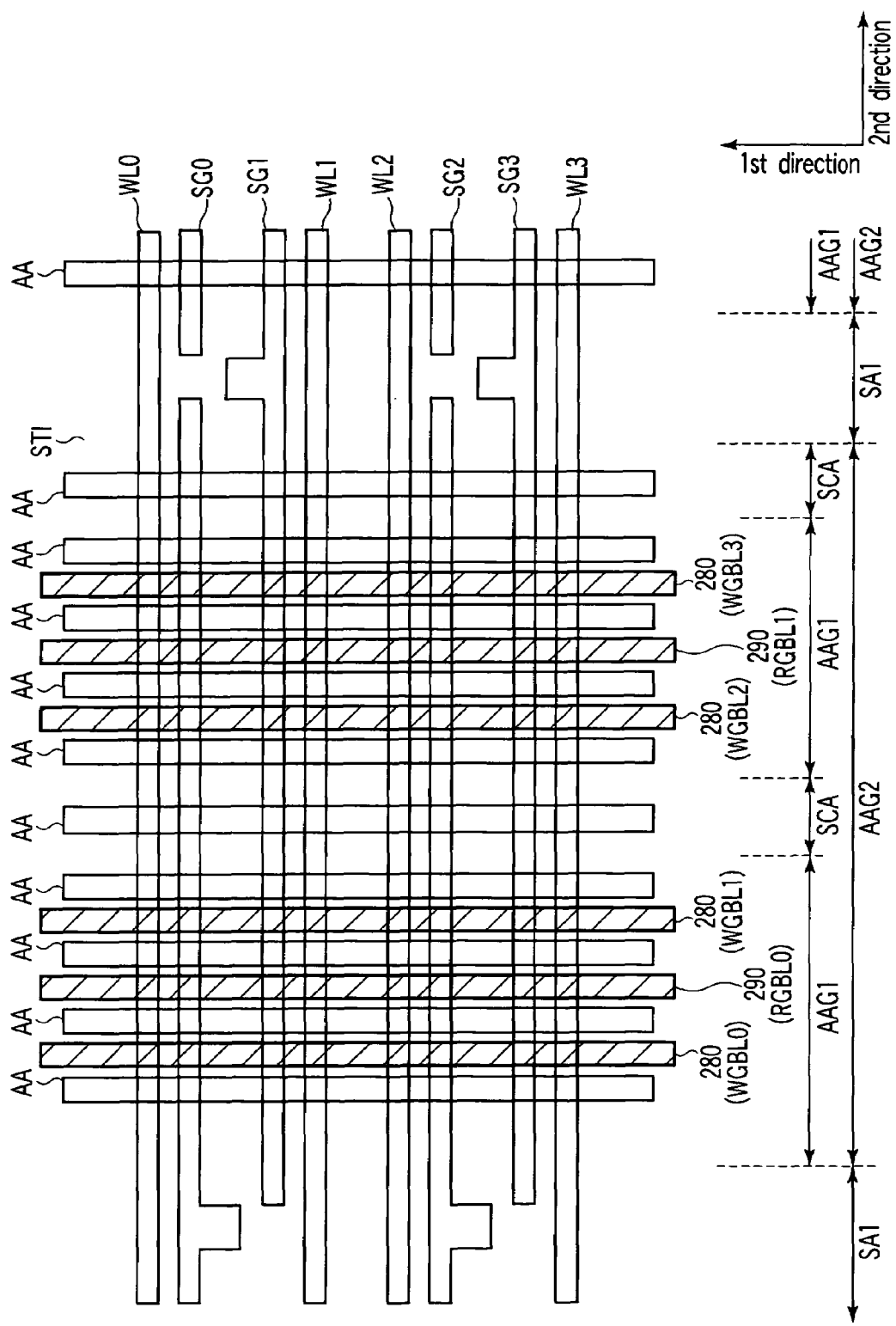
FIG. 10 is a plan view of the memory cell array included in the 2Tr flash memory according to the first embodiment, showing a plane pattern of a metal wiring layer of a fourth layer.

Next, using FIGS. 6 and 10, a pattern of a fourth-layer metal wiring layer existing on the third-layer metal wiring layers 270 will be explained. In FIG. 10, the shaded region is the fourth-layer metal wiring layer.

As shown in FIG. 10, strip-shaped metal wiring layers 280, 290 are formed in the first direction. The metal wiring layers 280 function as write global bit lines WGBL0 to WGBL(2n+1). The metal wiring layers 290 function as read global bit lines RGBL0 to RGBLn. Two metal wiring layers 280 and one metal wiring layer 290 form a set. A metal wiring layer 280 is provided so as to correspond to a set of two local bit lines LBL0, LBL1 or a set of two local bit lines LBL2, LBL3. A metal wiring layer 290 is provided so as to correspond to a set of four local bit lines LBL0 to LBL3.

Figure 15:
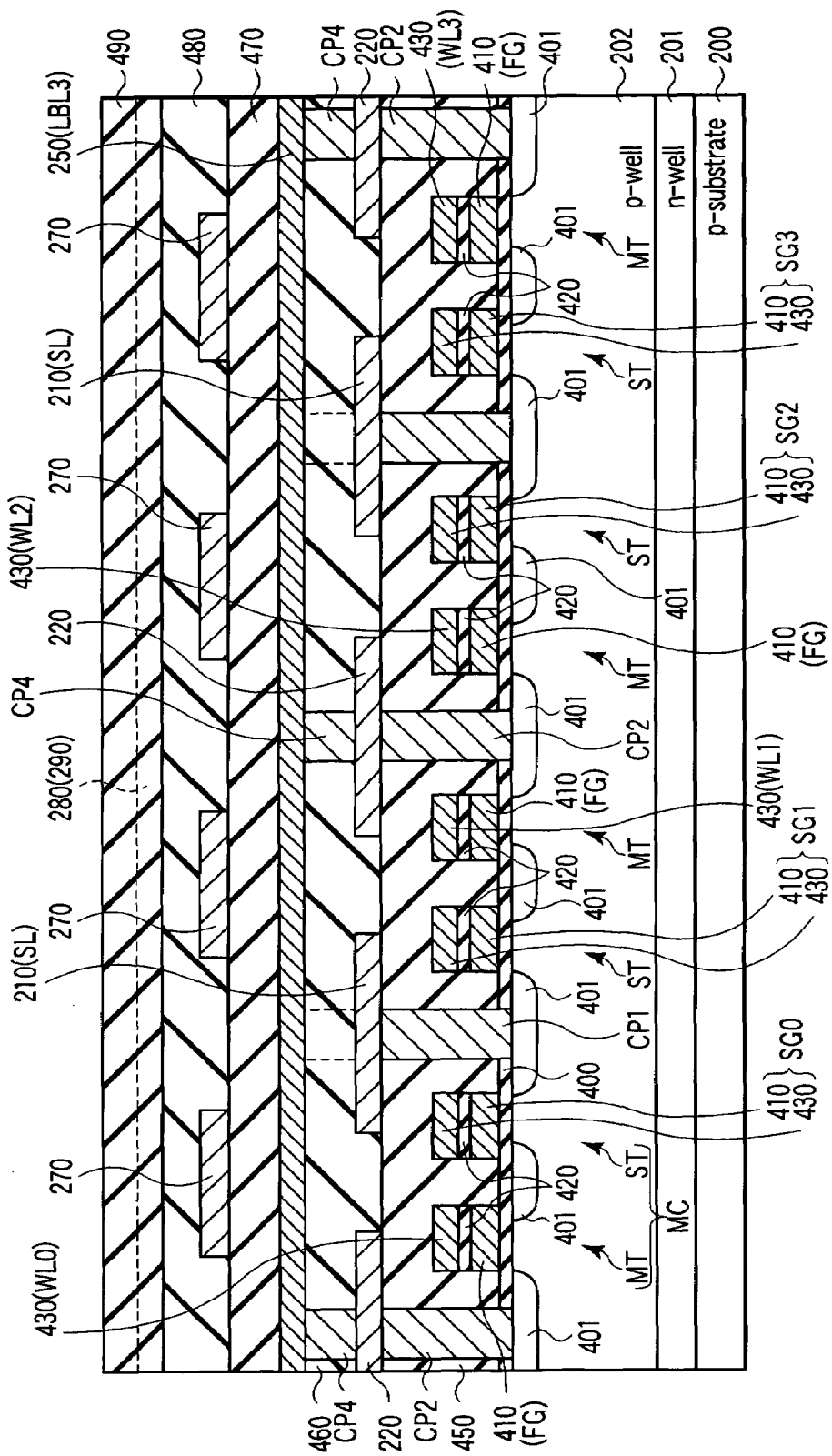
FIG. 15 is a sectional view taken along line 15—15 of FIG. 6.
Figure 16:
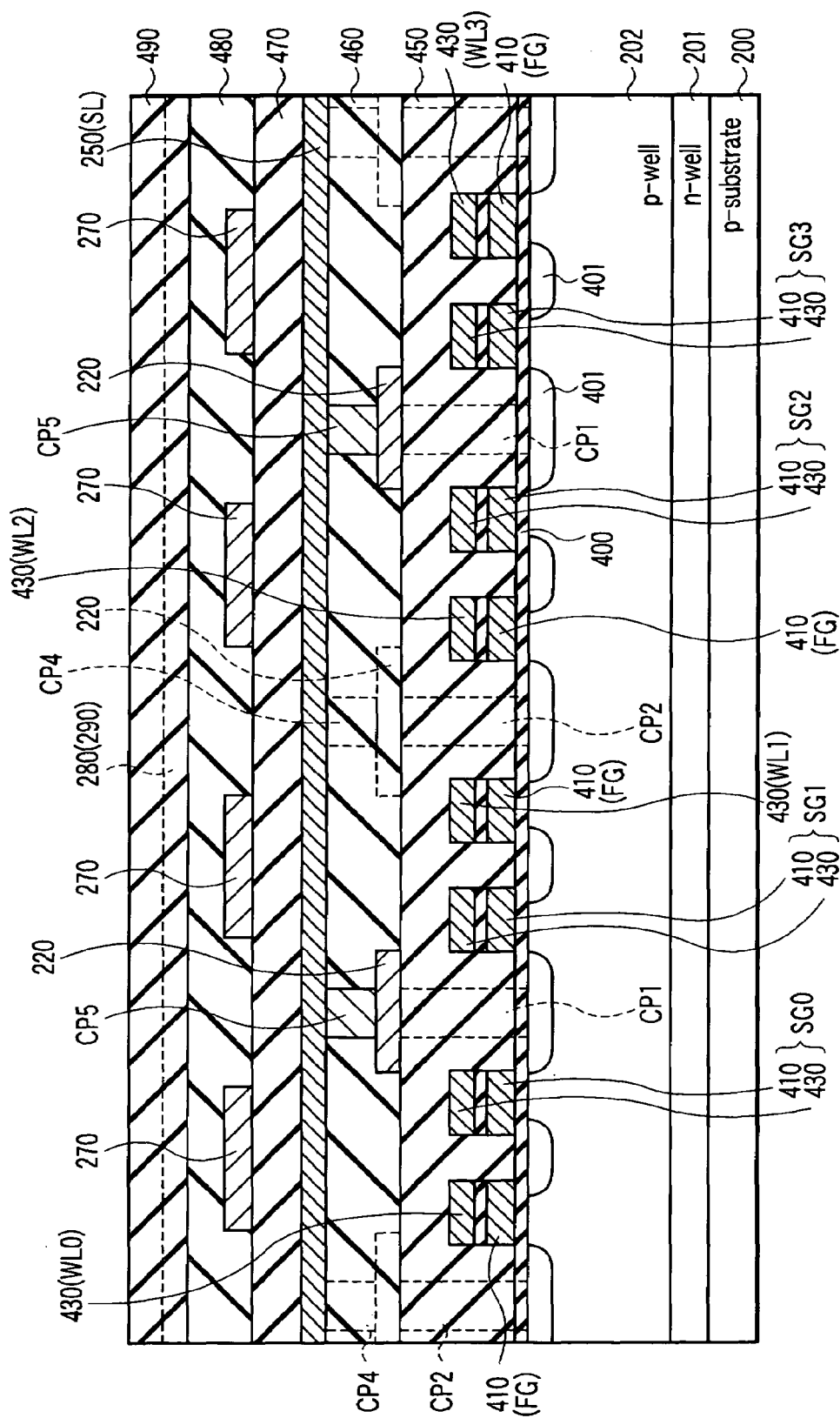
FIG. 16 is a sectional view taken along line 16—16 of FIG. 6.

Next, a sectional structure of the flash memory configured as described above will be explained. Using FIGS. 11 to 16, a sectional structure of the second element region group AAG2 will be explained. FIGS. 11 to 14 are sectional views taken along line 11—11, along line 12—12, along line 13—13, and along line 14—14 in FIG. 6, respectively. FIGS. 15 and 16 are sectional views taken along line 15—15 and along line 16—16 in FIG. 6, respectively.

As shown, at the surface of the p-type semiconductor substrate 200, an n-well region 201 is formed. At the surface of the n-well region 201, a p-well region 202 is formed. In the p-well region 202, an element isolating region STI is formed. The region surrounded by the element isolating region STI is an element region AA. On the element region of the p-well region 202, a gate insulating film 400 is formed. On the gate insulating film 400, the gate electrodes of a memory cell transistor MT and a select transistor ST are formed. Each of the gate electrodes of the memory cell transistor MT and the select transistor ST includes a polysilicon layer 410 formed on the gate insulating film 400, an inter-gate insulating film 420 formed on the polysilicon layer 410, and a polysilicon layer 430 formed on the inter-gate insulating film 420. The inter-gate insulating film 420 is made of, for example, a silicon oxide film, or an ON film, NO film, or ONO film having a stacked structure of a silicon oxide film and a silicon nitride film.

Figure 11:
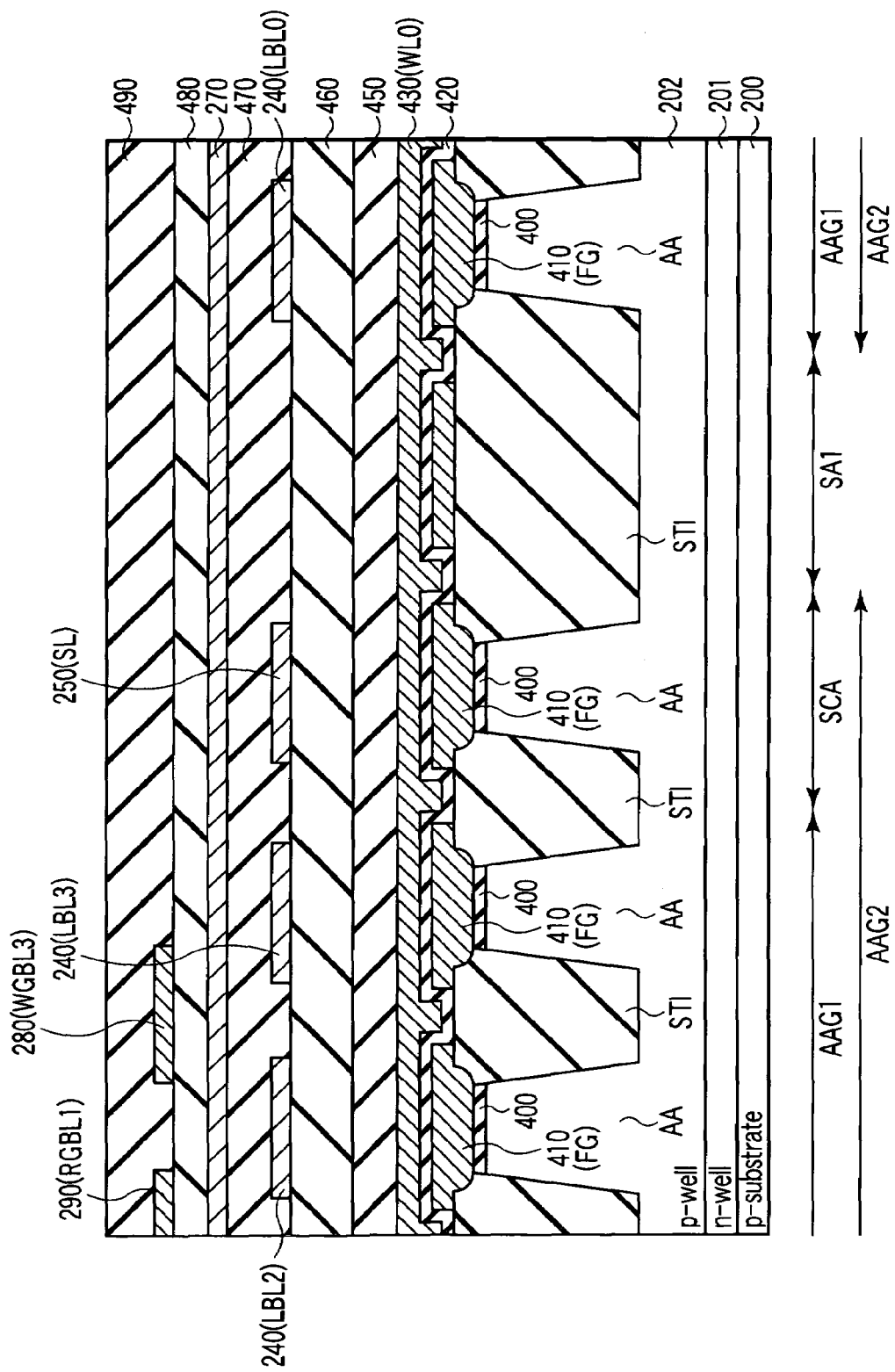
FIG. 11 is a sectional view taken along line 11—11 of FIG. 6.

As shown in FIG. 11, in a memory cell transistor MT, the polysilicon layers 410, which are isolated from each other between adjacent element regions AA along the word line, function as floating gates (FG). On the other hand, the polysilicon layers 430, which are shared by adjacent element regions AA, function as control gates (or word line WL).

Figure 12:
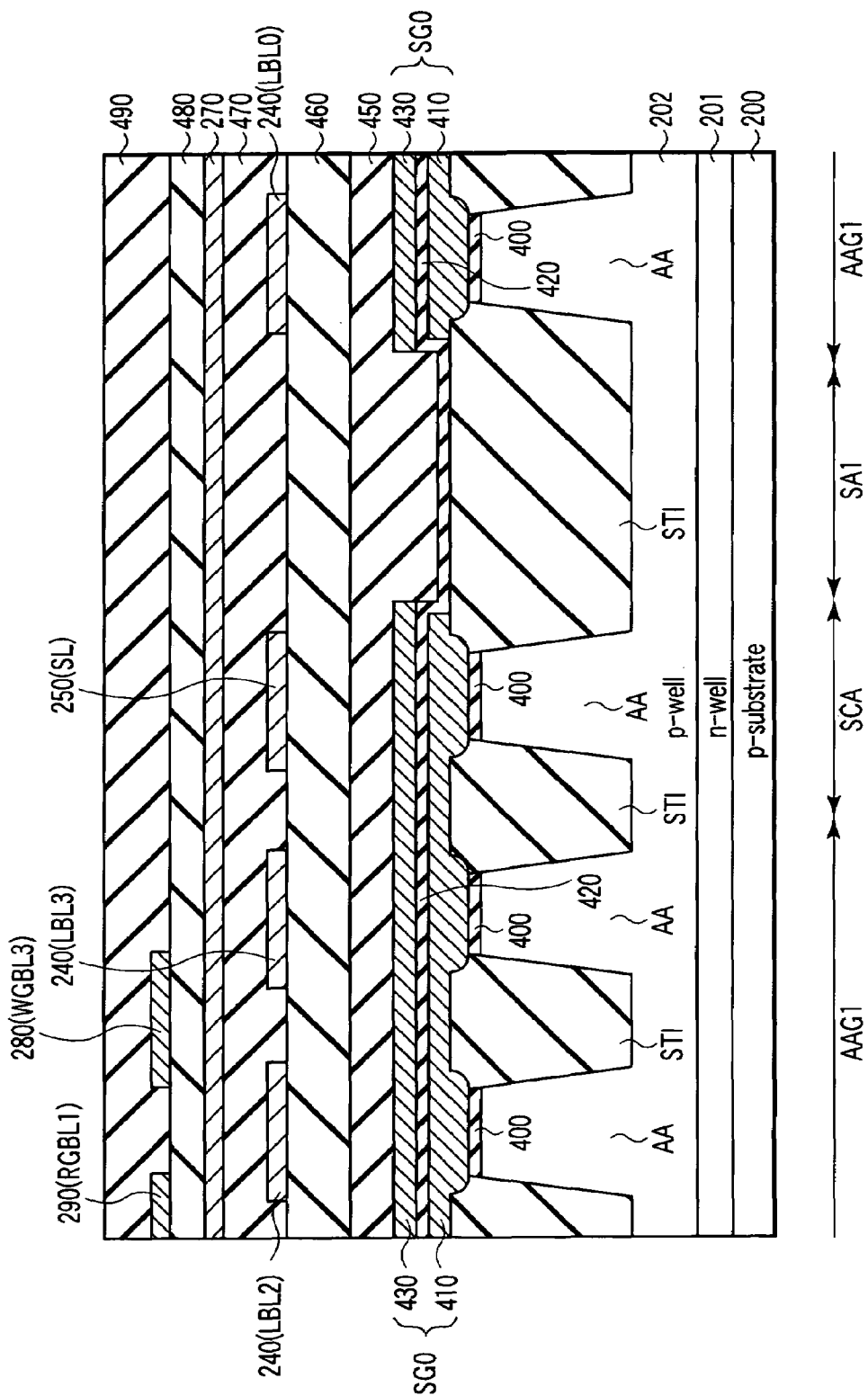
FIG. 12 is a sectional view taken along line 12—12 of FIG. 6.
Figure 13:
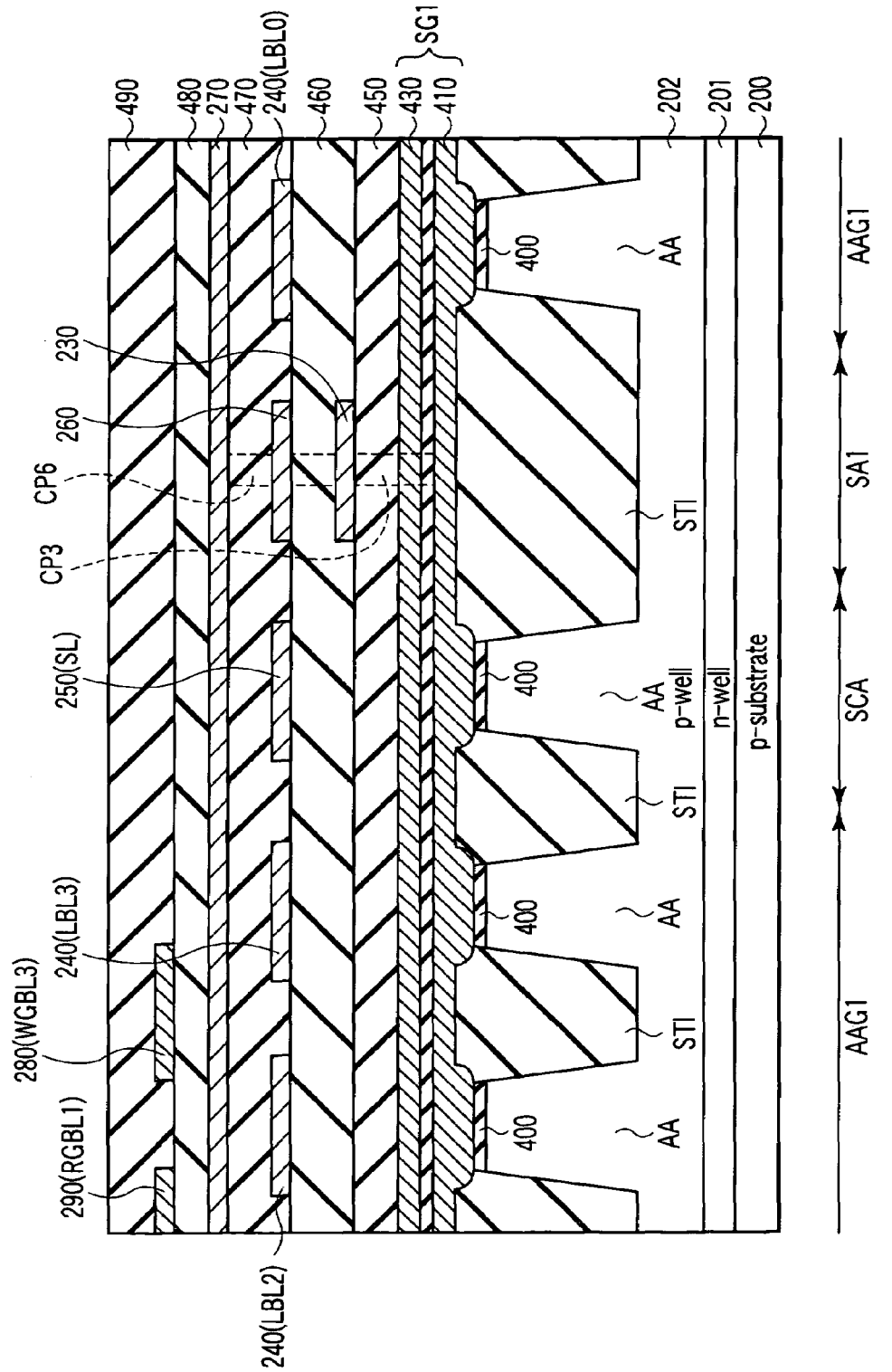
FIG. 13 is a sectional view taken along line 13—13 of FIG. 6.

As shown in FIG. 12 and FIG. 13, in a select transistor ST, the polysilicon layers 210 are shared by adjacent element regions AA. The polysilicon layers 230 are also shared by adjacent element regions AA. Then, the polysilicon layers 410, 430 function as select gate lines SG. Of these polysilicon layers, it is only the polysilicon layers 210 that practically function as select gate lines.

At the surface of the p-well region 202 between adjacent gate electrodes, an impurity diffused layer 401 is formed (see FIG. 15 and FIG. 16). The impurity diffused layer 401 is shared by adjacent transistors.

As described above, a memory cell including a memory cell transistor MT and a select transistor ST is formed so as to have the following relationship. In adjacent memory cells, their select transistors ST or their memory cell transistors MT are adjacent to each other. The adjacent select transistors or memory cell transistors share the impurity diffused layer 401. Therefore, two adjacent memory cells MC, MC, when their select transistors are adjacent to each other, are arranged symmetrically with the impurity diffused layer (or source region) 401 shared by the two select transistors ST, ST. Conversely, when their memory cell transistors MT are adjacent to each other, two adjacent memory cells MC, MC are arranged symmetrically with the impurity diffused layer (or drain region) 401 shared by the two memory cell transistors MT, MT.

Then, on the p-well region 202, an interlayer insulating film 450 is formed so as to cover the memory cell transistors MT and select transistors ST. In the interlayer insulating film 450, a contact plug CP1 is formed which reaches the impurity diffused layer (or source region) 401 shared by two select transistors ST, ST (see FIGS. 14 and 15). On the interlayer insulating film 450, a metal wiring layer 210 to be connected to the contact plug CP1 is formed. The metal wiring layer 210 functions as a source line SL. In the interlayer insulating film 450, a contact plug CP2 is formed which reaches the impurity diffused layer (or drain region) 401 shared by two memory cell transistors MT, MT (see FIG. 15). On the interlayer insulating film 450, a metal wiring layer 220 to be connected to the contact plug CP2 is formed.

On the interlayer insulating film 450, an interlayer insulating film 460 is formed so as to cover the metal wiring layers 210, 220, 230. In the interlayer insulating film 460, a contact plug CP4 reaching the metal wiring layer 220 is formed (see FIG. 15). On the interlayer insulating film 460, a metal wiring layer 240 connected commonly to a plurality of contact plugs CP4 is formed. The metal wiring layer 240 functions as any one of the local bit lines LBL0 to LBL3. A contact plug CP5 reaching the metal wiring layer 210 is formed in the inter layer insulating film 460 (see FIG. 14, source contact region SCA). On the interlayer insulating film 460, a metal wiring layer 250 connected commonly to a plurality of contact plugs CP5 in the bit line direction is formed (see FIGS. 14 and 16, source contact region SCA). The metal wiring layer 250 functions as a part of a source line SL.

On the interlayer insulating film 460, an interlayer insulating film 470 is formed so as to cover the metal wiring layers 240, 250. On the interlayer insulating film 470, a metal wiring layer 270 is formed. The metal wiring layers 270, which function as shunt wires for the select gate lines, are arranged at equal intervals. On the interlayer insulating film 470, an interlayer insulating film 480 is formed so as to cover the metal wiring layer 270.

On the interlayer insulating film 480, metal wiring layers 280, 290 functioning as write global bit lines and read global bit lines are formed and then an interlayer insulating film 490 is formed.

Figure 17:
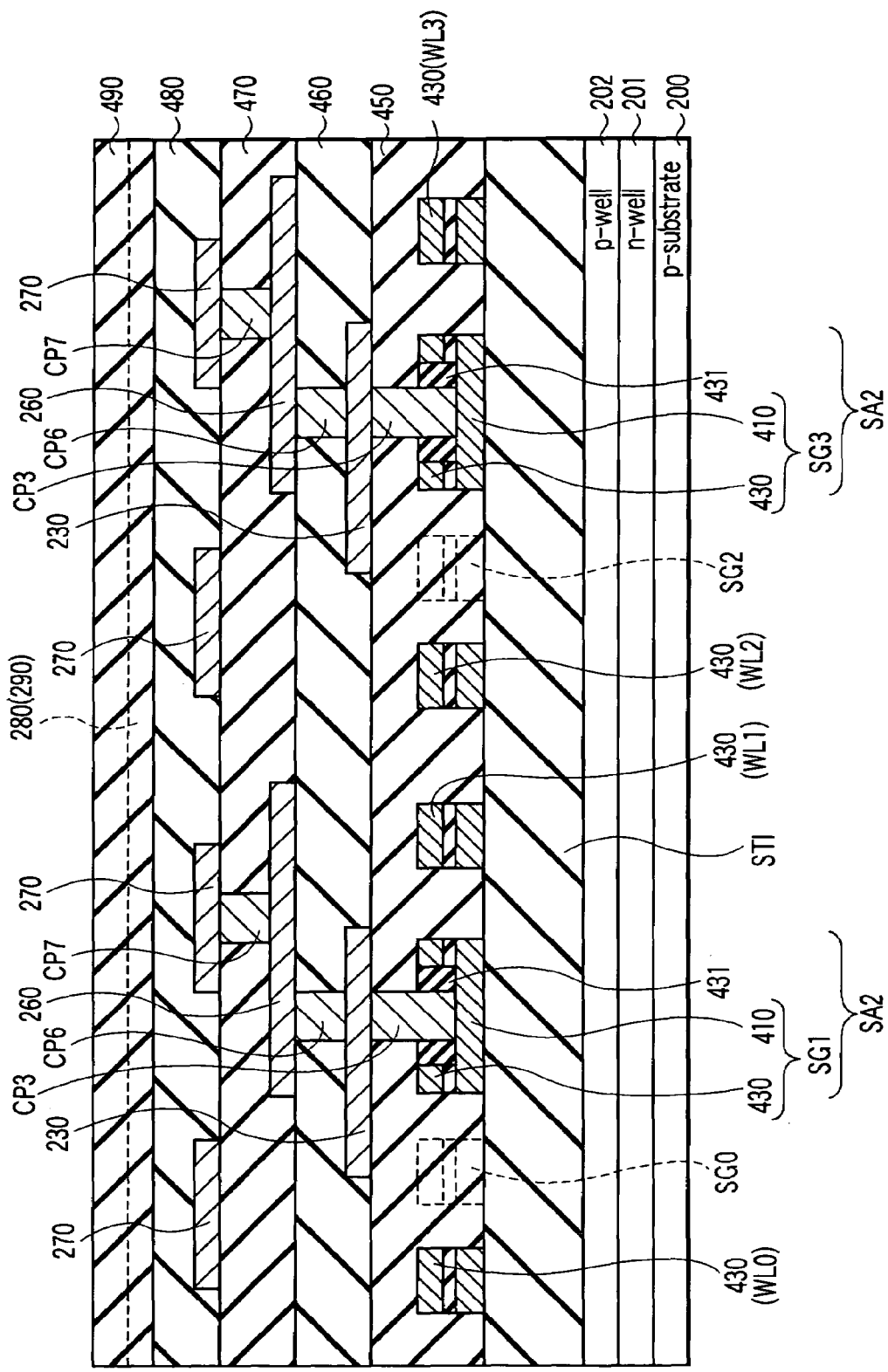
FIG. 17 is a sectional view taken along line 17—17 of FIG. 6.

Next, using FIGS. 12, 14, and 17, a sectional structure of a stitch region SA1 will be explained. FIG. 17 is a sectional view taken along line 17—17 of FIG. 16.

As shown in FIG. 17, an element isolating region STI is formed in the p-well region 202. On the element isolating region STI, the floating gate 410 and control gate 430 of a memory cell transistor MT are formed. The polysilicon layers 410, 430 have been removed from the select gate lines which have no shunt region SA2 in the stitch region SA1 (see FIGS. 12 and 17). That is, the select gate lines are divided by the stitch regions SA1. In each of the select gate lines which have a shunt region SA2, a stacked gate including the polysilicon layers 410, 430 has been formed. The stacked gate has been formed so as to project toward the adjacent select gate lines (see FIG. 17).

Figure 14:
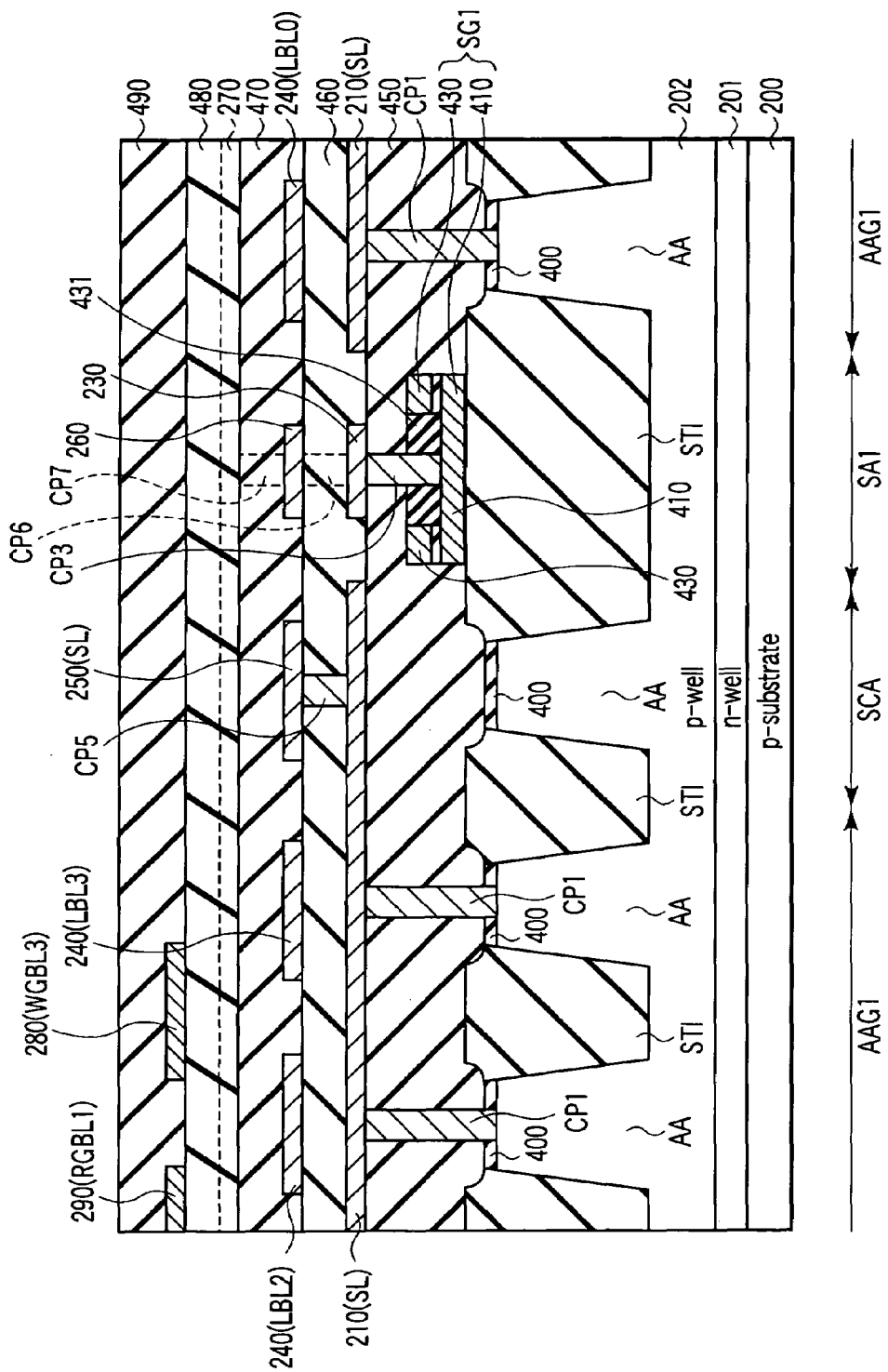
FIG. 14 is a sectional view taken along line 14—14 of FIG. 6.

As shown in FIGS. 14 and 17, in the shunt region SA2, the polysilicon layer 430 and inter-gate insulating film 420 are removed, thereby exposing the polysilicon layer 410. Then, a contact plug CP3 is formed so as to contact the top of the polysilicon layer 410 in the region. An insulating film 431 electrically isolates the contact plug CP3 from the polysilicon layer 430. The contact plug CP3 is formed from the surface of the interlayer insulating film 450 so as to reach the polysilicon layer 410.

The metal wiring layer 230 has been formed on the interlayer insulating film 450. The metal wiring layer 230 is connected to the corresponding select gate line (or polysilicon layer 410) by the contact plug CP3. On the interlayer insulating film 450, an interlayer insulating film 460 is formed so as to cover the metal wiring layer 230. In the interlayer insulating film 460, a contact plug CP6 reaching the metal wiring layer 230 is formed. On the interlayer insulating film 460, the metal wiring layer 260 connected to the contact plug CP6 has been formed. The metal wiring layer 260 is extended so as to cover not only the top of the gate electrode of the corresponding select transistor ST but also the top of the stacked gate electrode of the memory cell transistor MT corresponding to the select transistor ST (see FIG. 17). On the interlayer insulating film 460, an interlayer insulating film 470 is formed. In the interlayer insulating film 470, a contact plug CP7 reaching the metal wiring layer 260 is formed. As shown in FIG. 17, the contact plug 47 is located in the central part of a memory cell. In other words, the contact plug CP7 is formed in a region between the central part of the stacked gate of the memory cell transistor MT and the central part of the gate electrode of the select transistor ST. On the interlayer insulating film 470, a metal wiring layer 270 connected to the contact plug CP7 is formed. As shown in FIG. 17, a plurality of metal wiring layers 270 are arrange at equal intervals on the interlayer insulating film 470. Then, on the interlayer insulating film 470, interlayer insulating films 480, 490 are formed so as to cover the metal wiring layers 270.

Figure 18:
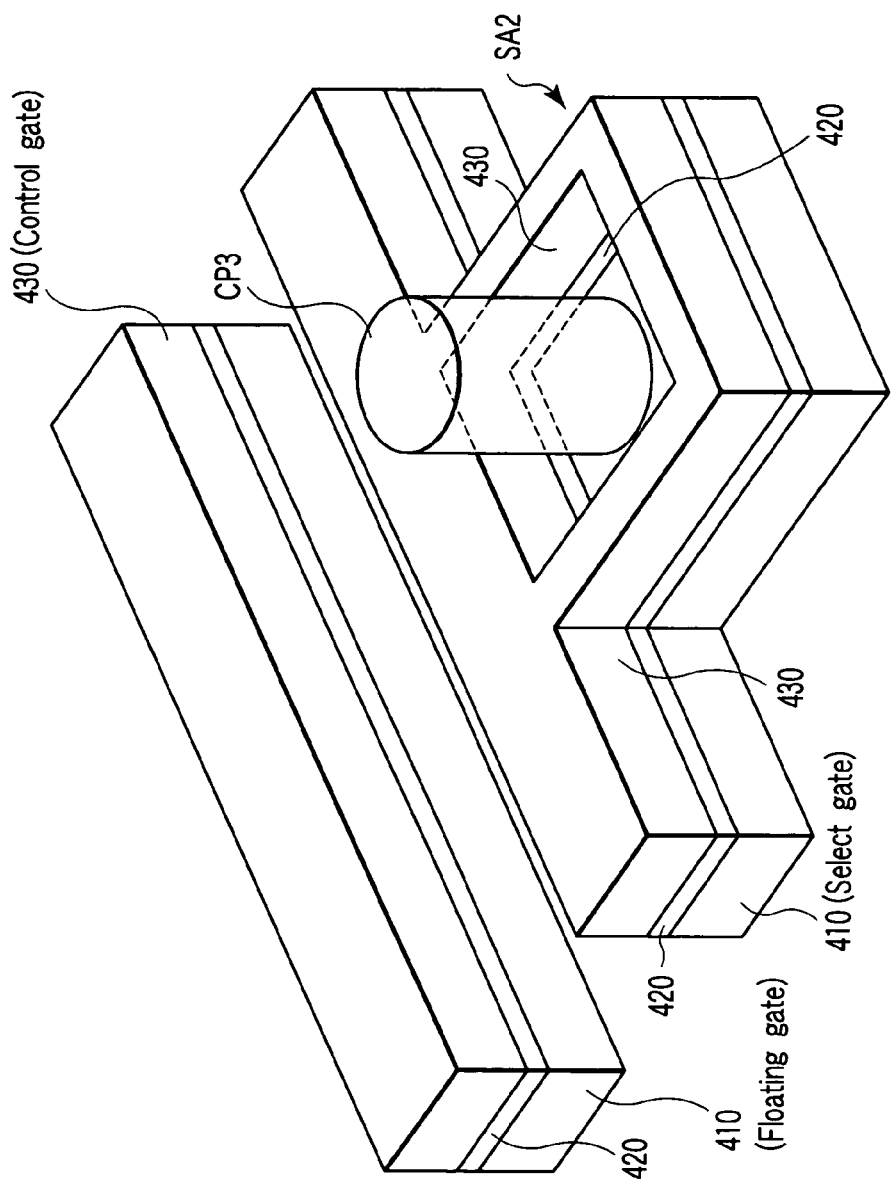
FIG. 18 is a perspective view of the shunt region in FIG. 6.

FIG. 18 is a perspective view of a shunt region SA2. As shown in FIG. 18, a stacked gate structure of a select gate line is made wider in part. In the shunt region SA2, the polysilicon layer 430 and inter-gate insulating film 420 in a part of the wider region are removed, thereby exposing the polysilicon layer 410. A contact plug CP3 is formed so as to contact the exposed polysilicon layer 410. The contact plug CP3 is electrically isolated from the polysilicon layer 430. That is, the polysilicon layer 430 is electrically isolated from the shunt wire 270.

Figure 19:
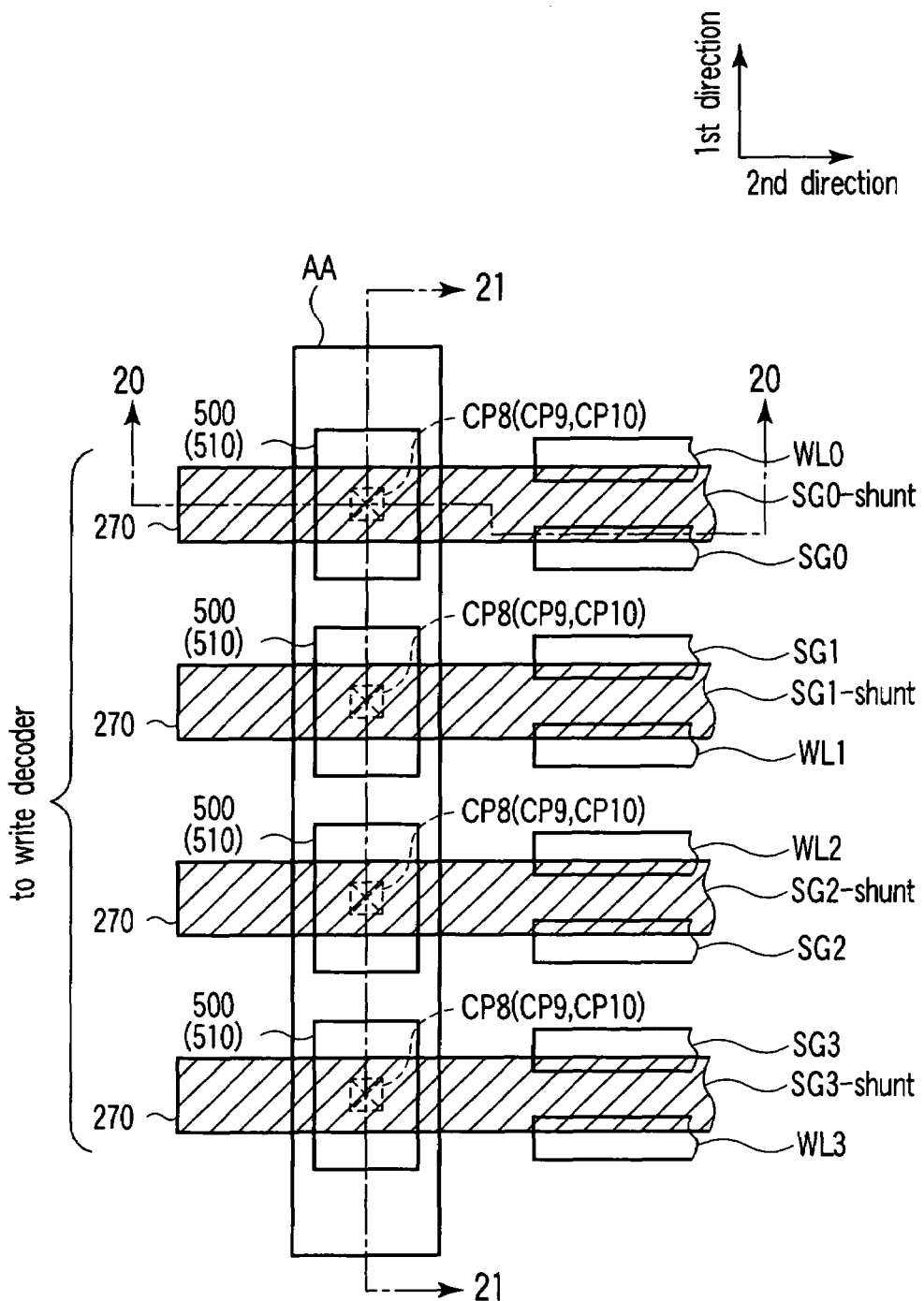
FIG. 19 is a plan view of a region particularly including diodes of the memory cell array in the 2Tr flash memory according to the first embodiment.
Figure 20:
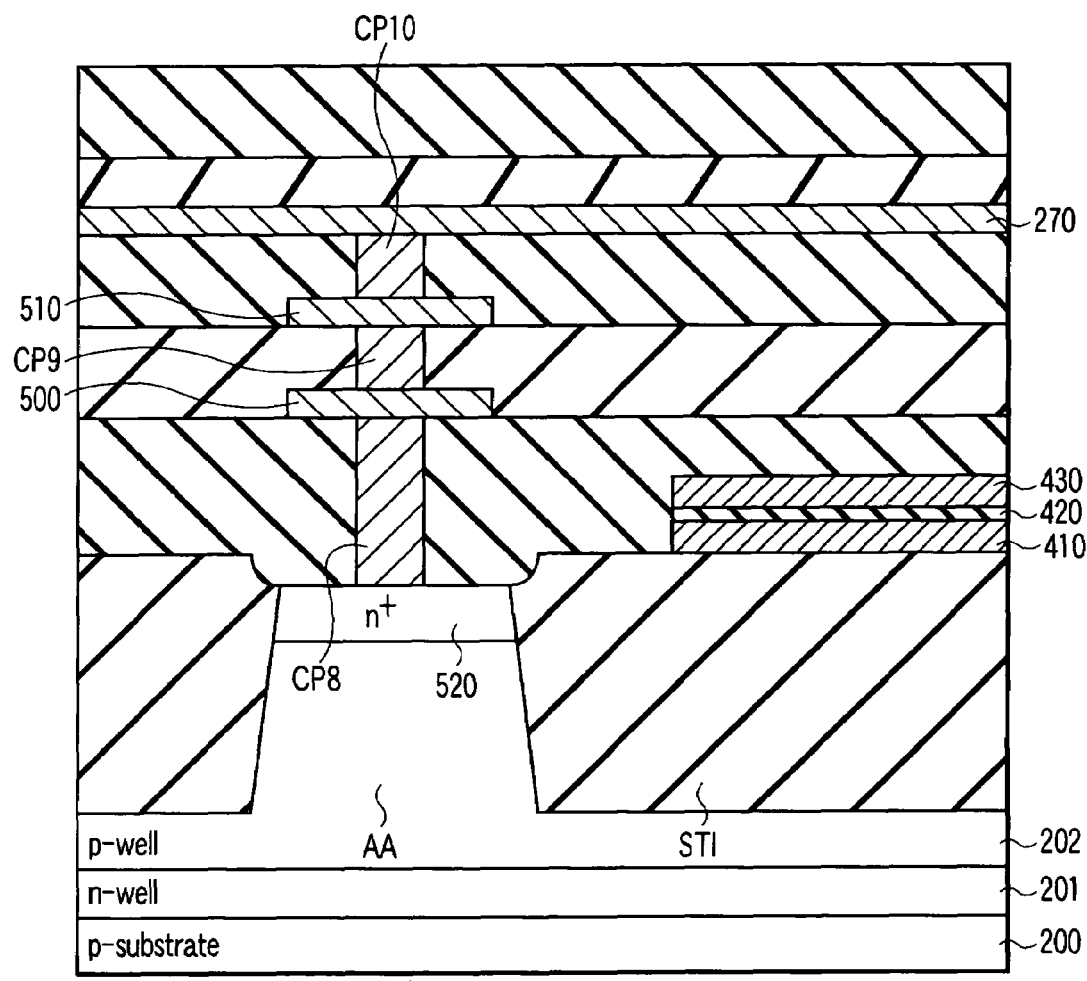
FIG. 20 is a sectional view taken along line 20—20 of FIG. 19.
Figure 21:
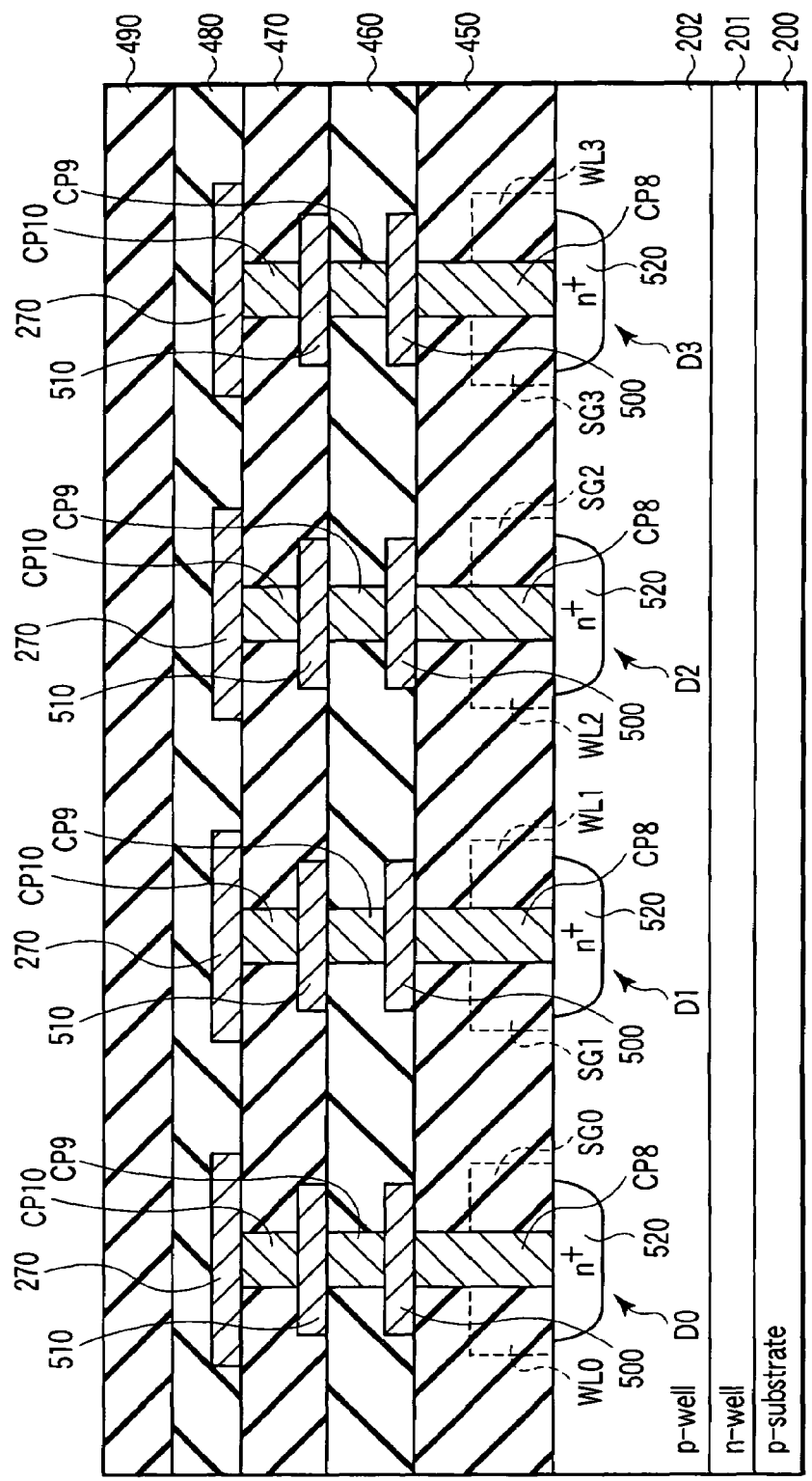
FIG. 21 is a sectional view taken along line 21—21 of FIG. 19.

Next, using FIGS. 19 to 21, the configuration of diodes D0 to D(4m+3) formed in the memory cell array 10 will be explained. FIG. 19 is a plan view of a region where diodes are formed in the memory cell array 10. FIGS. 20 and 21 are sectional views taken along line 20—20 and along line 21—21 in FIG. 19.

As shown in the figures, for example, at one end of the memory cell array 10, a column of element regions AA in the first direction are formed. In an element region AA, at the surface of the p-well region 202, $n^+$-type impurity diffused layers 520 are formed for sets of a word line and a select gate lines in a one-to-one correspondence. The $n^+$-type diffused layer 520 functions as a cathode and the p-well region 202 functions as an anode, thereby forming diodes D0 to D(4m+3). Then, an interlayer insulating film 450 is formed so as to cover the diodes. In the interlayer insulating film 450, a contact plug CP8 reaching the corresponding $n^+$-type diffused layer 520 is formed. On the interlayer insulating film 450, a metal wiring layer 500 connected to the contact plug CP8 is formed.

Further on the interlayer insulating film 450, an interlayer insulating film 460 to cover the metal wiring layer 500 is formed. In the interlayer insulating film 460, a contact plug CP9 reaching the metal wiring layer 500 is formed. On the interlayer insulating film 460, a metal wiring layer 510 connected to the contact plug CP9 is formed and further an interlayer insulating film 470 is formed. Then, in the interlayer insulating film 470, a contact plug CP10 is formed so as to connect with the metal wiring layer 510. The contact plug CP10 is connected to the metal wiring layer 270.

Specifically, the cathodes of diodes D0 to D(4m+3) formed in the p-well region 202 are connected to the shunt wires 270 of the corresponding select gate lines SG0 to SG(4m+3) via the contact plugs CP8 to CP10 and the metal wiring layers 500, 510.

Figure 22:
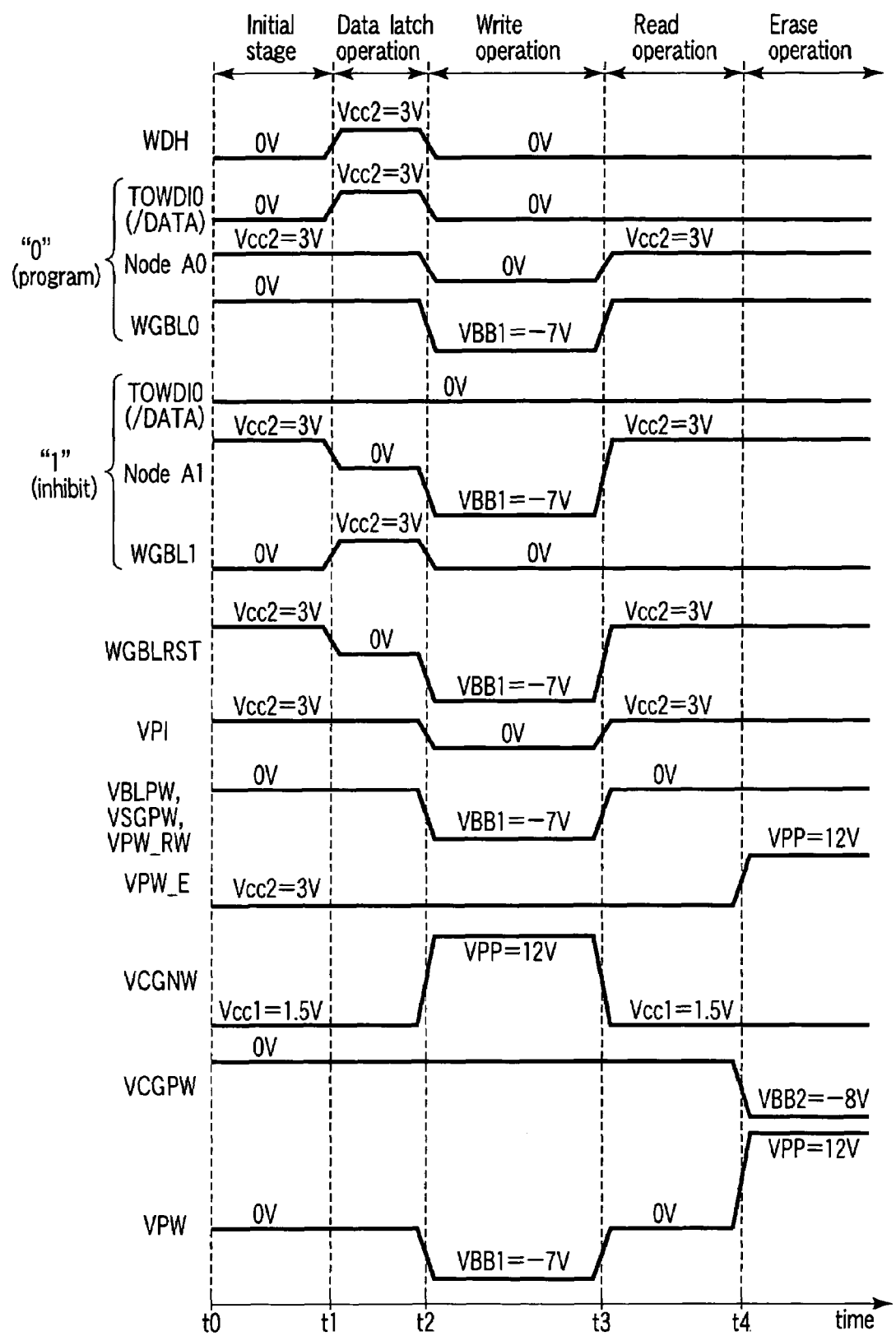
FIG. 22 is a timing chart for various signals in the operation of the 2Tr flash memory according to the first embodiment.

Next, the operation of the 2Tr flash memory 3 with the above configuration will be explained with reference to FIG. 22. FIG. 22 is a timing chart for various signals and voltages at various nodes. Hereinafter, a state where no electron is injected into the floating gate and the threshold voltage is negative is defined as a state where "1" data has been written. A state where electrons are injected into the floating gate and the threshold voltage is positive is defined as a state where "0" data has been written. To simplify explanation, a case where a memory cell array 10 has two write global bit lines WGBL0, WGBL1 and one read global bit line RGBL0 is used as an example.

<Initial Operation>

Figure 23:
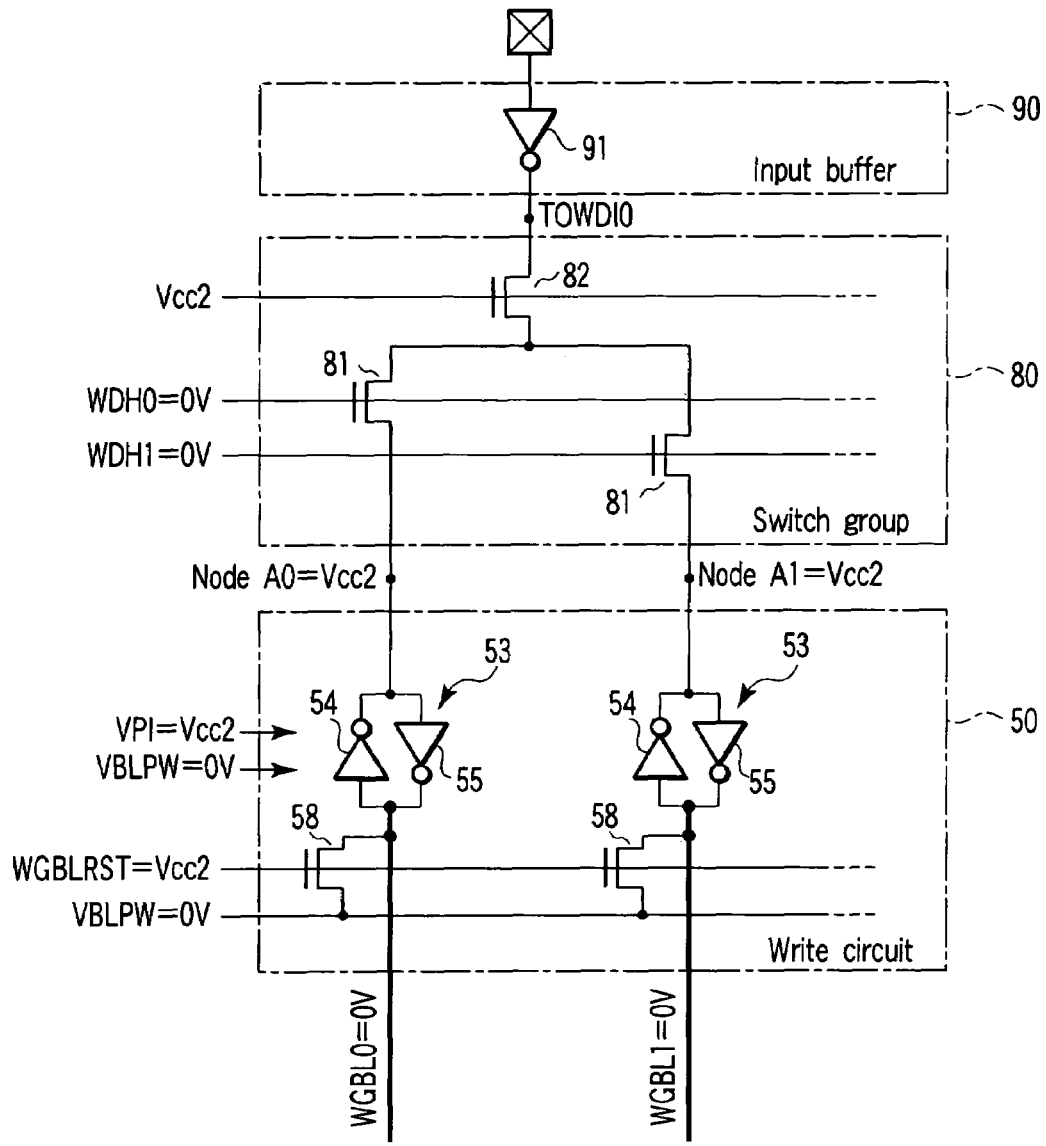
FIG. 23 is a circuit diagram to help explain the states of an input buffer, switch group, and write circuit in the initial operation of the 2Tr flash memory according to the first embodiment.

An initial operation will be explained with reference to FIG. 23. An initial operation is the first operation to be performed in a write, a read, and an erase operation. In FIG. 22, an initial operation is carried out in the period between time t0 to time t1. FIG. 23 is a circuit diagram of the input buffer 90, switch group 80, and write circuit 50 corresponding to the write global bit lines WGBL0, WGBL1 in an initial operation.

Before the initial operation, the signals WDH0 and WDH1 are both set to the low (L) level (0V), turning off the MOS transistors 81 in the switch group 80, which electrically isolates the write circuit 50 from the input buffer 180. The write inhibit voltage VPI supplied as the high voltage power supply voltage of the latch circuit 53 is set to Vcc2 and VBLPW is set to 0V. Then, the signal WGBLRST is set to the high (H) level (Vcc2) and all of the write global bit lines WGBL0, WGBL1 are reset. That is, the MOS transistors 58 in the write circuit 50 are turned on, thereby allowing VBLPW node to apply 0V to the write global bit lines WGBL0, WGBL1. As a result, the output nodes of all of the latch circuits 53 go to the low (L) level (0V) and the input nodes (node A0, node A1) go to the high (H) level (Vcc2).

As described above, in the initial operation, the write global bit lines are set to 0V and Vcc2 is applied to node A0 and node A1.

<Data Latch Operation>

Figure 24:
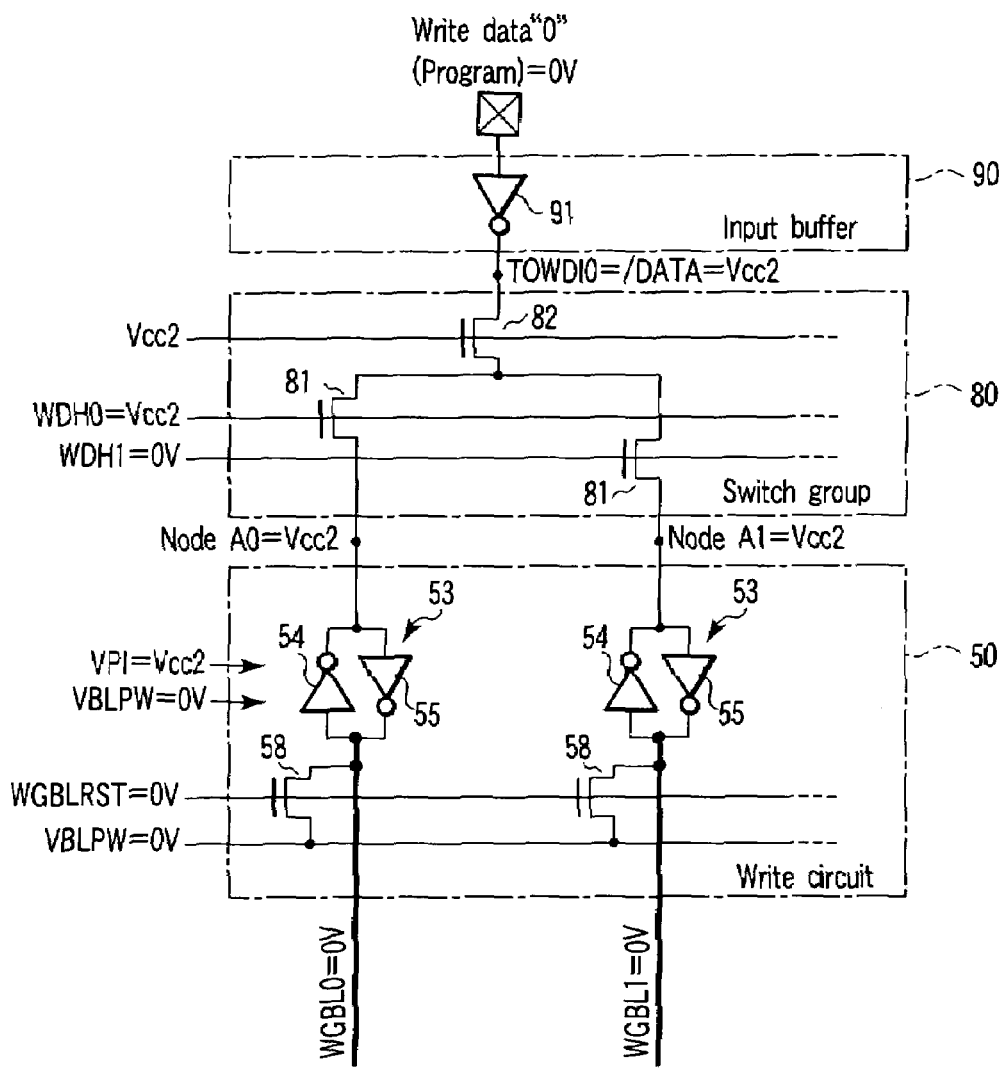
FIG. 24 is a circuit diagram to help explain the states of the input buffer, switch group, and write circuit in a data latch operation of the 2Tr flash memory according to the first embodiment.
Figure 25:
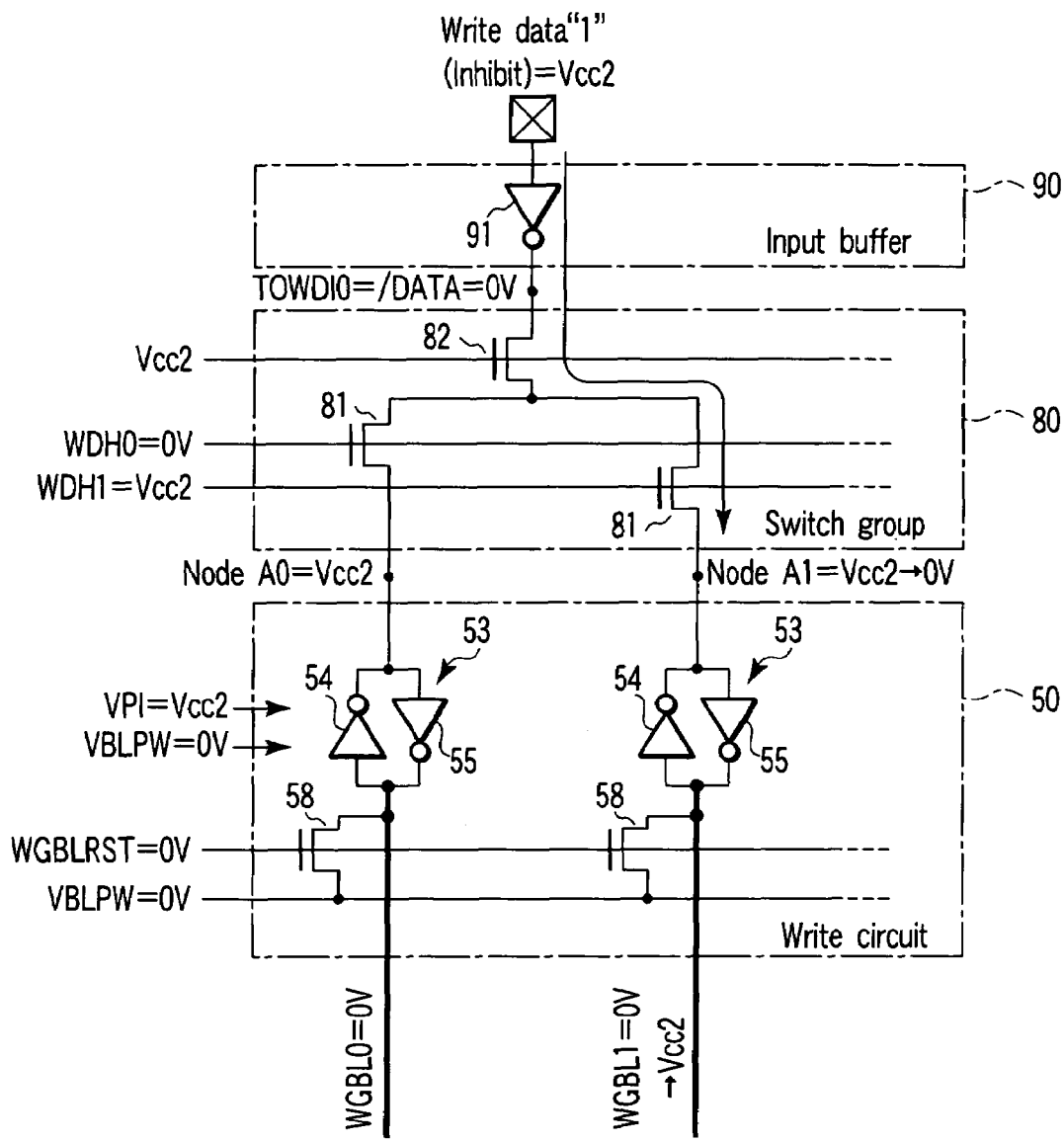
FIG. 25 is a circuit diagram to help explain the states of the input buffer, switch group, and write circuit in a data latch operation of the 2Tr flash memory according to the first embodiment.

Next, a data latch operation will be explained with reference to FIGS. 24 and 25. A data latch operation is the operation of inputting the write data to each latch circuit 53 in a write operation. A data latch operation is carried out between time t1 to time t2 in FIG. 22. FIGS. 24 and 25 are circuit diagrams of the input buffer 90, switch group 80, and write circuit 50 in a data latch operation. FIG. 24 shows a case where "0" data has been input. FIG. 25 shows a case where "1" data has been input. Hereinafter, explanation will be given using a case where "0" data is written into the memory cells connected to write global bit line WGBL0 (that is, WGBL0 is selected) and "1" data is written into the memory cells connected to WGBL1 (that is, WGBL1 is unselected).

First, a case where "0" data is input will be explained with reference to FIG. 24. Before a data latch operation, the signal WGBLRST is set to 0V, thereby turning off the MOS transistor 58, which electrically isolates write global bit lines WGBL0, WGBL1 from VBLPW node. To latch the data in the latch circuit 53 corresponding to write global bit line WGBL, the signal WDH0 is set to the high (H) level (Vcc2), which turns on the MOS transistor 81 corresponding to write global bit line WGBL0. On the other hand, the MOS transistor 81 corresponding to write global bit line WGBL1 is turned off. Therefore, the input buffer 90 is electrically connected to the latch circuit 53 corresponding to write global bit line WGBL0.

Then, the CPU 2 inputs "0" data to the inverter of the input buffer 90. When "0" data is input, 0V is applied to the input node of the inverter 91. The "0" data is inverted by the inverter 91. As a result, the potential of TOWDI0 node goes to Vcc2. Then, since Vcc2 has been applied to the gate of the MOS transistor 82, the MOS transistor 82 goes into the cutoff state. Therefore, the latch circuit 53 keeps holding the data given in the period between time t0 to time t1. That is, node A0 remains at Vcc2 and write global bit line WGBL0 remains at 0V.

Next, a case where "1" data is input will be explained with reference to FIG. 25. What differs from the case where "0" data is input is that setting WDH0 to 0V (WDH0=0V) and WDH1 to Vcc2 (WDH1=Vcc2) brings the MOS transistor 81 corresponding to write global bit line WGBL1 into the on state.

Then, the CPU 2 inputs "1" data to the input buffer 90. When "1" data is input, Vcc2 is applied to the input node of the inverter 91. Consequently, the potential at the TOWDI0 node goes to 0V. The potential at TOWDI0 node is input to the latch circuit 53 via the current path of the MOS transistor 81. As a result, the potential at node A1 is inverted from Vcc2 to 0V, which inverts the potential on write global bit line WGBL1 from 0V to Vcc2.

As described above, in the data latch operation, the data in the latch circuit corresponding to the memory cell into which "1" data is to be written is reversed from its initial state. That is, when "0" writing is done (or when electrons are injected), virtually no data is input from the outside. When "1" writing (or when no electron is injected=the memory is unselected), the data is taken in from the outside.

<Write Operation>

A write operation will be explained with reference to FIG. 26. Data is written simultaneously into all of the memory cell blocks in a row. In each of the memory cell blocks, the memory cells written into simultaneously include those connected to one of the local bit lines LBL0 and LBL1 and those connected to one of the local bit lines LBL2 and LBL3.

In FIG. 22, a write operation is carried in the period between time t2 and t3. FIG. 26 is a circuit diagram of a part of the memory cell array 10, write selector 50, and select gate decoder 30 in a write operation. In FIG. 13, it is assumed that data is written into the memory cell transistors MT connected to word line WL0 and local bit lines LBL0, LBL2 and that, of the memory cell transistors MT, "0" data is written into the one connected to local bit line LBL0 and "1" data is written into the one connected to local bit line LBL2. In other words, the memory cell connected to local bit line LBL0 is selected and the memory cell connected to local bit line LBL2 is unselected.

First, before a write operation, the signal WGBLRST still remains at 0V. Then, at time t2, the write inhibit voltage VPI changes from Vcc2 to 0V and the potential at VBLPW node changes from 0V to VBB1 (−7V). Under the control of the write state machine 120, the voltage generator 130 outputs the negative potential VBB1. The potential of VPI may be a negative potential instead of 0V.

Then, the low-voltage-side power supply voltage of the inverters 54, 55 in the latch circuit 53 changes from 0V to VBB1 and the high-voltage-side power supply voltage changes from Vcc2 to 0V, with the result that the potentials at node A0 and node A1 change to 0V and VBB1, respectively. The potentials on write global bit lines WGBL0, WGBL1 also change to VBB1 and 0V, respectively.

Then, the write decoder 20 selects word line WL0 and applies the positive voltage VPP (12V) to the selected word line WL0. In addition, the isolating MOS transistor 25 is turned on, which allows the negative potential VBB1 (−7V) to be applied from VSGPW node to all of the select gate lines SG0 to SG(4m+3). Moreover, the output of the level shift circuit 27 goes to the low (L) level, causing VPW_RW node to change from 0V to VBB1, with the result that the negative potential VBB1 is applied to the substrate (p-well region 202) in which memory cells have been formed. In a write operation, the signal ZISOG is kept at the low (L) level, which electrically isolates the row address decode circuit 31 of the select gate decoder 30 from the select gate lines.

The column decoder 40 selects write column select line WCSL0 from the two write column select lines connected to the write column selector WCS corresponding to the memory cell block BLK including the selected word line WL0. This turns on the MOS transistors 11, 13 in the write column selector WCS. As a result, write global bit line WGBL0 and local bit line LBL0 are electrically connected and write global bit line WGBL1 and local bit line LBL2 are electrically connected.

Furthermore, the column decoder 40 makes unselected all of the write column select lines connected to the write column selector WCS corresponding to the memory cell block BLK which does not include the selected word line WL0. Therefore, the MOS transistors 11 to 14 in the write column selector WCS corresponding to the memory cell block BLK not including the selected word line are turned off.

Furthermore, the column decoder 40 makes unselected all of the read column select lines RCSL0 to RCSL(4m+3). This turns off the MOS transistors 15 to 18 in all of the read column selectors RCS. Therefore, the read global bit lines RGBL are electrically isolated from local bit lines LBL0 to LBL3.

In addition, to turn on the MOS transistors 42, 44 connected to local bit lines LBL1, LBL3 made unselected, the column decoder 40 sets the write inhibit column select line ICSL1 to the high (H) level (Vcc2). Write inhibit column select line ICSL0 connected to the MOS transistors 41, 43 corresponding to the selected local bit lines LBL0, LBL2 is set to the low (L) level, which turns off the MOS transistors 41, 43. As a result, the write inhibit voltage VPI=0V is applied to the unselected local bit lines LBL1, LBL3.

Consequently, the write voltage (VBB1) is applied from write global bit line WGBL0 via the MOS transistor 11 in the write column selector WCS to the local bit line LBL0 in the memory cell block BLK including the selected word line WL0. Moreover, the write inhibit voltage VPI (0V) is applied from write global bit line WGBL1 via the MOS transistor 13 to local bit line LBL2 in the memory cell block BLK including the selected word line WL0.

As a result, in the memory cell transistor MT connected to write global bit lines WGBL1 and word line WL0, since the potential difference between the gate and channel is insufficient (VPP1−VPI=12V), no electron is injected into the floating gate. Thus, the memory cell MC holds the negative threshold value. That is, "1" data is written. Furthermore, in the memory cell transistors MT connected to the unselected local bit lines LBL1, LBL3 and word line WL0, since VPI is applied to the channel, no electron is injected into the floating gate, which enables the memory cell MC to hold the negative threshold value. On the other hand, in the memory cell transistor MT connected to write global bit line WGBL0 and word line WL0, since the potential difference between the gate and channel is sufficient (VPP1−VBB1=19V), electrons are injected into the floating gate by FN tunneling. As a result, the threshold value of the memory cell transistor MT changes to positive. That is, "0" data is written.

As described above, the data is written into one page of memory cell transistors simultaneously.

<Read Operation>

Figure 27:
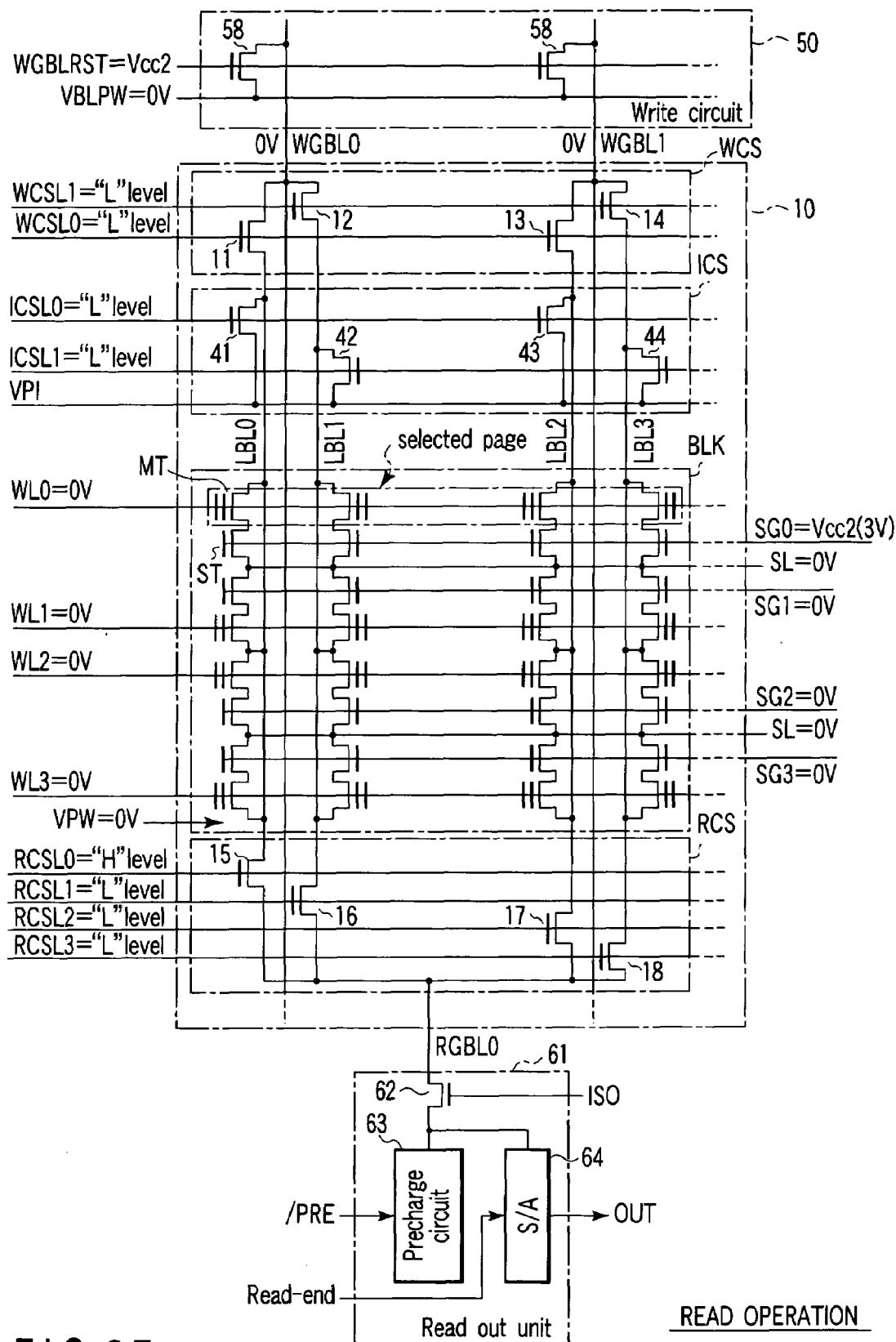
FIG. 27 is a circuit diagram to help explain the state of the memory cell array in a read operation of the 2Tr flash memory according to the first embodiment.

Next, using FIG. 27, a read operation will be explained. In FIG. 22, a read operation is carried out in the period between time t3 and time t4. FIG. 27 is a circuit diagram of the memory cell array 10, write circuit 50, and read unit 61 of the 2Tr flash memory 3. FIG. 27 shows a case where the data is read from the memory cell transistor MT connected to local bit line LBL0 and word line WL0. The data is read from one memory cell MC per memory cell block BLK. However, when there are a plurality of read global bit lines per memory cell block BLK, as many items of data as correspond to the read global bit lines are read out.

As shown in FIG. 27, first, the column decoder 40 selects read column select line RCSL0 from the four read column select lines RCSL0 to RCSL3 connected to the read column selector RCS corresponding to the memory cell block BLK including the selected select gate line SG0. This turns on the MOS transistor 15 in the read column selector RCS corresponding to the memory cell block BLK including the selected select gate line SG0.

Furthermore, the column decoder 40 makes all of the write column select lines WCSL0 to WCSL(2m+1) unselected, which turns off all of the four MOS transistors 11 to 14 in all of the write column select lines WCSL0 to WCSL(2m+1). Therefore, the write global bit lines WGBL are electrically isolates from local bit lines LBL0 to LBL3.

When the signal WGBLRST is set to the high (H) level (Vcc2), this turns on the MOS transistor 58 in the write circuit 50. In addition, 0V is applied to VBLPW node. Therefore, all of the write global bit lines WGBL0, WGBL1 are set to 0V in the read operation.

Furthermore, the signal BIAS is set to the high (H) level, the signal /PRE is set to the low (L) level, and the signal ISO is set to the high (H) level. This turns on the MOS transistor 62 in the read unit 61, which allows the precharge circuit 63 to precharge read global bit line RGBL0.

After the potential on the read global bit line has reached a specific precharge potential, the signal ZISOG is set to the high (H) level, turning on the isolating MOS transistor 35. Then, the select gate decoder 30 selects select gate line SG0 (H level: Vcc2=3V). Furthermore, the write decoder 20 makes all of the word lines WL0 to WL(4m+3) unselected (0V) and sets the potential VPW at the p-well region 202 to 0V. Moreover, the source line driver 70 sets the potential on the source line to 0V. In the read operation, the signal WSG is set to the low (L) level, which electrically isolates the row address decode circuit 21 of the write decoder 20 from the select gate lines. The output of the level shift circuit 27 is at the low (L) level and the VPW_RW node is set at 0V, with the result that 0V is applied to the p-well region 202.

Then, the select transistor ST connected to select gate line SG0 is turned on. As a result, if the data written in the memory cell transistor MT connected to the selected word line WL0 and selected local bit line LBL0 is "1", current flows from read global bit line RGBL0 to the source line. On the other hand, if the data written in the memory cell transistor MT is "0", no current flows.

Then, a change in the potential on the read global bit line as a result of current flowing in the memory cell MC is amplified by the sense amplifier 64.

As described above, the read operation is carried out.

<Erase Operation>

Figure 28:
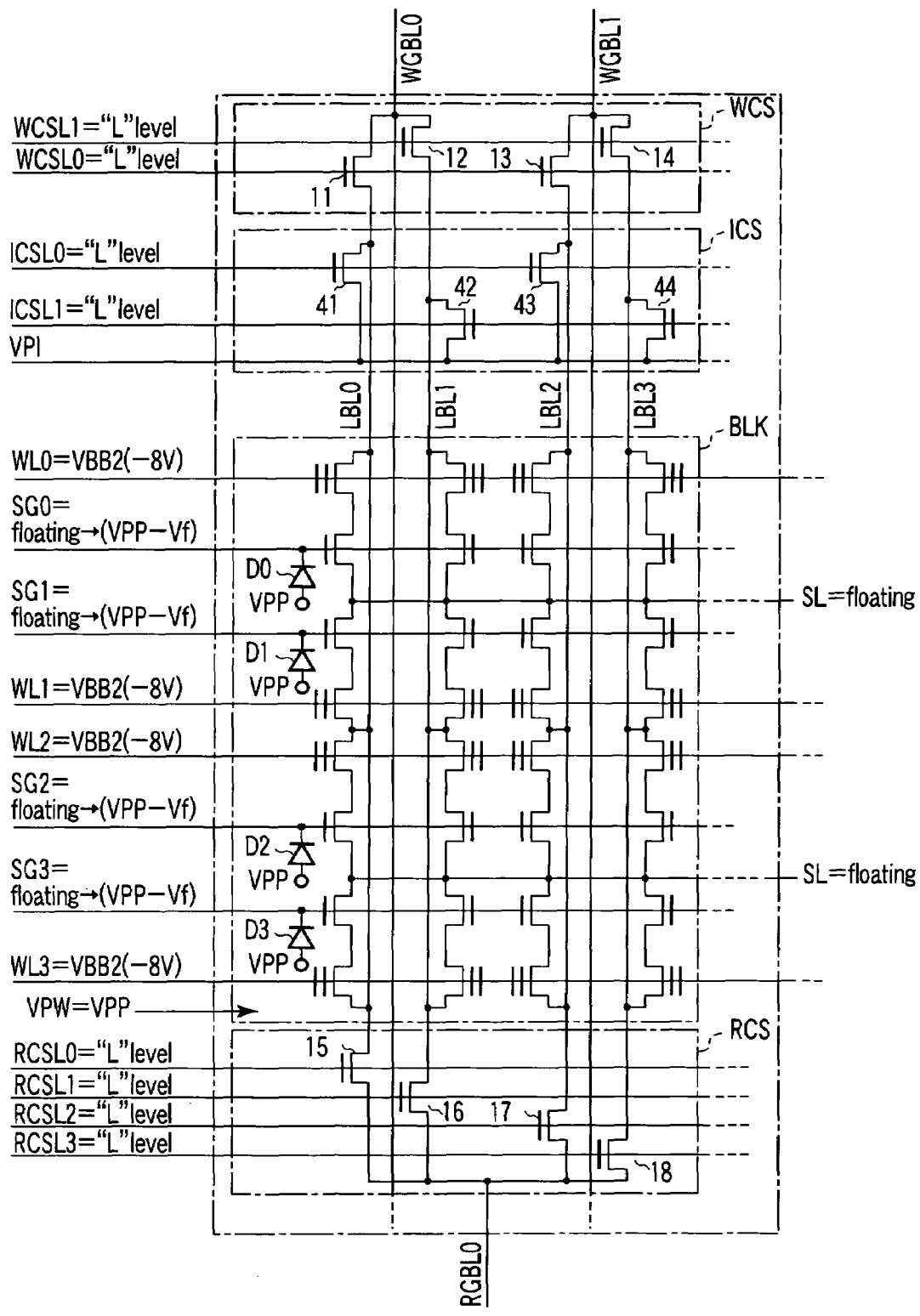
FIG. 28 is a circuit diagram to help explain the state of the memory cell array in an erase operation of the 2Tr flash memory according to the first embodiment.

Next, using FIG. 28, an erase operation will be explained. An erase operation is carried out at time t4 and later in FIG. 22. FIG. 28 is a circuit diagram of the memory cell array 10 in an erase operation. Data is erased from all of the memory cells MC sharing the p-well region 202 simultaneously. An erase operation is carried out by pulling electrons out of the floating gates by FN tunneling.

Before an erase operation, all of the MOS transistors 11 to 16 are turned off. Therefore, all of the write global bit lines WGBL0, WGBL1 are electrically isolated from the latch circuit 51 and from VBLPW node and VPI node and therefore go into the floating state.

Then, the write decoder 20 applies the negative voltage VBB2 to all of the word lines WL0 to WL(4m+3) in the selected block. In addition, since the erase signal ERASE is input to the multiplexer 26 in the erase operation, the output of the level shift circuit 27 goes to the high (H) level. Moreover, since VPW_E node changes from Vcc2 to VPP, the high potential VPP is applied to the substrate (p-well region 202) in which memory cells have been formed. In the erase operation, the signals ZISOG and WSG are kept at the low (L) level, which electrically isolates the row address decode circuits 31, 21 of the select gate decoder 30 and write decoder 20 from the select gate lines.

As a result, electrons are extracted from the floating gates of the memory cell transistors of the memory cells MC into the substrate by FN tunneling, thereby erasing the data in all of the memory cells MC connected to word lines WL0 to WL(4m+3), which makes the threshold voltage negative.

The positive voltage VPP is applied to the p-well region 202, with the result that diodes D0 to D(4m+3) are forward-biased. Thus, the potentials on all of the select gate lines SG0 to SG(4m+3) will rise to (VPP−Vf), where Vf is the voltage drop at each of the diodes D0 to D(4m+3) (e.g., 0.7V).

In this way, data is erased simultaneously.

As described above, the flash memory according to the first embodiment produces the effects in item (1) to item (5) below.

(1) The reliability of the memory cells can be improved.

In the flash memory of the first embodiment, diodes D0 to D(4m+3) are provided between the p-well region 202 where the memory cells MC are formed and the select gate lines SG0 to SG(4m+3). The diodes prevent an excessive voltage stress from being applied to the gate insulating films of the select transistors ST in an erase operation. This will be explained below.

Figure 29:
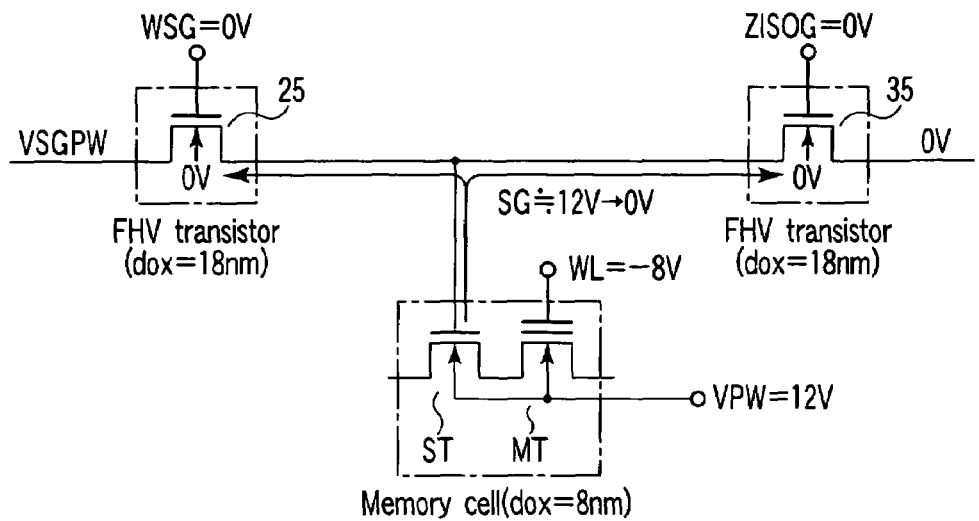
FIG. 29 is a circuit diagram to help explain the connection between the memory cells and the select gate lines when the select gate lines have no diode.

FIG. 29 is a circuit diagram to help explain the connection between a memory cell MC and isolating transistors 25, 35 and the way erasing is done in a circuit configuration with no diodes. In an erase operation, the isolating transistors 25, 35 are turned off. Therefore, the select gate line SG is electrically in the floating state. Then, the positive voltage VPW=VPP (12V) is applied to the p-well region 202. Thus, the select gate line rises to about VPP as a result of coupling with the p-well region 202.

However, even when the isolating transistors 25, 35 are turned off, leakage current never fails to flow. The leakage current may be current flowing from the drain of the isolating transistor to its source or junction leakage current flowing from the impurity diffused layer to the semiconductor substrate.

For example, suppose the potential on the select gate line raised to VPP by coupling has dropped to 0V by leakage current in time t (VPP) since the start of the erase operation. In this case, at time t (VPP), the potential difference of VPP is applied to the gate insulating film 400 of the select transistor ST. However, if the film thickness of the select transistor ST is made equal to that of the memory cell transistor MT, the gate insulating film 400 generally cannot withstand VPP. Its threshold voltage (or the upper limit voltage the gate insulating film can withstand) is Vbreak (<VPP).

Let the time required to reach the threshold voltage Vbreak be t(break). If an erase operation is completed during the time shorter than t(break) since the start of the erase operation, a voltage higher than the threshold voltage Vbreak will not be applied to the gate insulating film 400 of the select gate transistor ST. However, the 2Tr flash memory embedded on the system LSI has a much smaller memory capacity than that of a NAND flash memory or the like used as a memory chip. Therefore, as compared with such a memory, the peripheral circuits occupy a larger area than the memory cell array 10 in the 2Tr flash memory. Accordingly, it is important to reduce the area of the peripheral circuits in the 2Tr flash memory from the viewpoint of chip size reduction. In the 2Tr flash memory, the elimination of an erase verify operation can be considered to reduce the area of the peripheral circuits (or to simply the circuit configuration). To realize this, all of the memory cells have to be erased from completely in one erase operation, which makes the erase time longer than that of a memory chip.

Consequently, it is difficult to complete the erase operation within t(break) since the erase operation was started as described above. When the erase operation has been completed, a high voltage higher than the threshold voltage has been already applied to the gate insulating film 400 of the select transistor ST. Therefore, the gate insulating film 400 can be fatally damaged.

Figure 30:
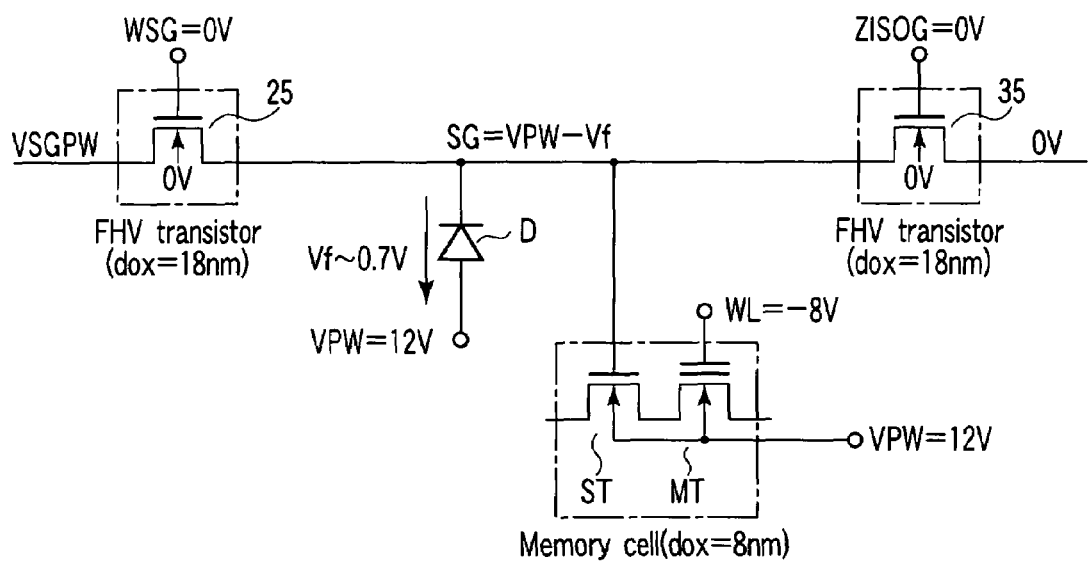
FIG. 30 is a circuit diagram to help explain the connection between the memory cells and the select gate lines in the 2Tr flash memory according to the first embodiment.
Figure 31:
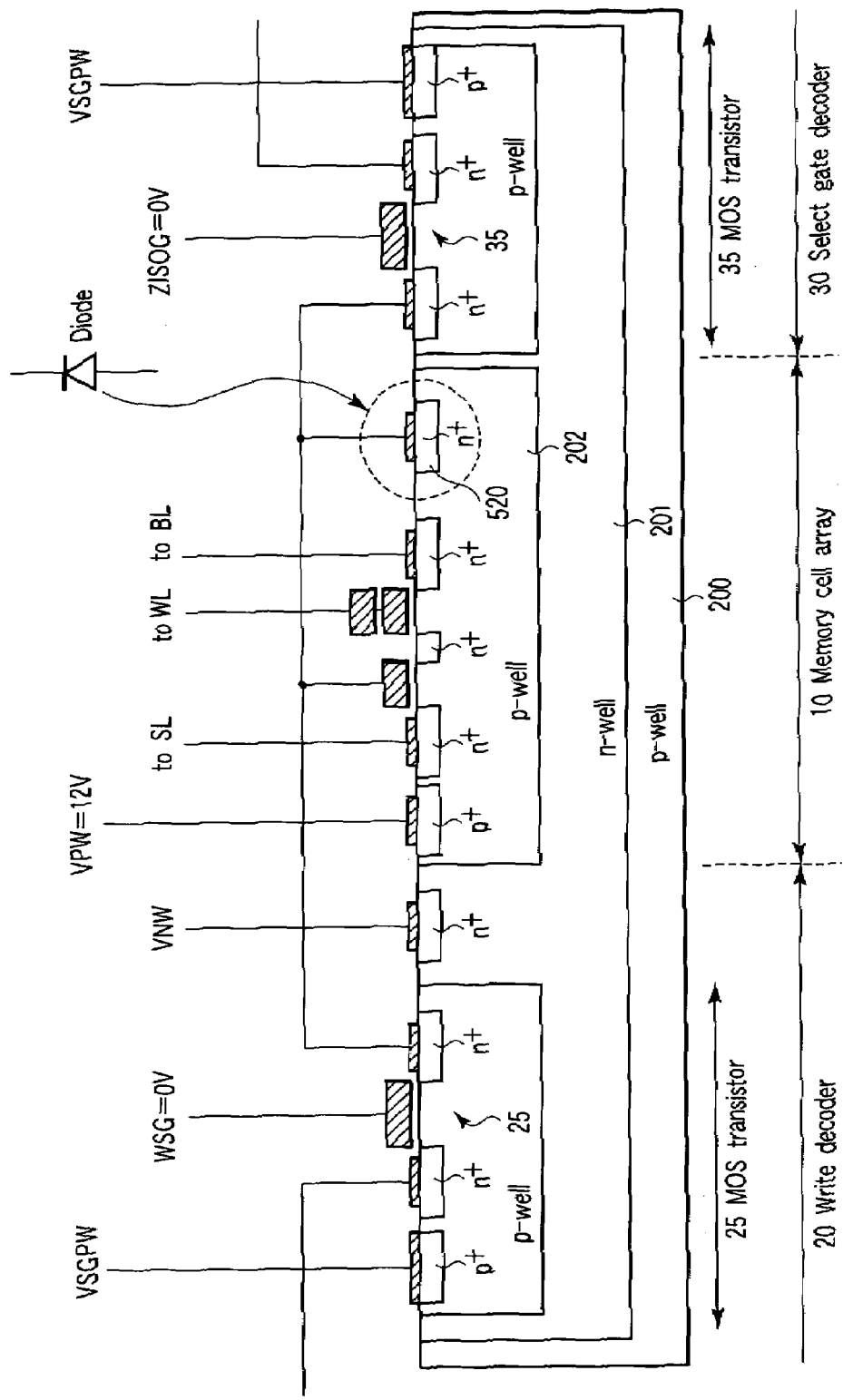
FIG. 31 is a sectional view of the memory cell array and isolating transistors included in the 2Tr flash memory according to the first embodiment.

However, in the 2Tr flash memory of the first embodiment, diodes D0 to D(4m+3) are provided between the p-well region 202 where memory cells MC are formed and the select gate lines SG0 to SG(4m+3). FIG. 30 is a circuit diagram to help explain the connection between a memory cell MC, a diode, and isolating transistors 25, 35. FIG. 30 shows the way erasing is done. In an erase operation, the isolating transistors 25, 35 are turned off. Therefore, the select gate line SG is electrically in the floating state. Then, the positive voltage VPW=VPP (12V) is applied to the p-well region 202, or the anodes of the diodes D0 to D(4m+3). Therefore, diodes D0 to D(4m+3) are forward-biased. As a result, a potential is applied to the select gate line SG via the p-n junctions of the diodes D0 to D(4m+3), not by coupling as in FIG. 29. Accordingly, the potential on the select gate line SG is set to (VPP−Vf) reliably. In addition, the potential on the select gate line is prevented from being lowered by the isolating transistors 25, 35. As a result, a voltage higher than the threshold voltage is prevented from being applied to the gate insulating film 400 of the select transistor ST, which improves the reliability of the memory cells.

Furthermore, to form diodes D0 to D(4m+3) according to the first embodiment, the n$^+$-type impurity diffused layer 520 has only to be formed in the p-well region 202. Therefore, the manufacturing process is prevented from being complicated and an increase in the area caused by the use of diodes is very small.

In addition, as explained in the first embodiment, when the decoder circuit is divided into a write decode circuit and a read decode circuit, there are two leakage current paths: one path in which leakage current flows through the MOS transistor 25 and the other path in which leakage current flows through the MOS transistor 35 as shown in FIG. 29. Therefore, since the total leakage current is larger than when only a single decoder is used, the effect of the first embodiment is more noticeable.

In the above explanation, the voltage applied to the gate insulating film of the select transistor has exceeded the threshold voltage before the completion of the erase operation. However, when the voltage on the select gate line is raised by coupling, however short the erase time may be, leakage current never fails to cause the voltage on the select gate line to drop. Therefore, even when such a 2Tr flash memory as prevents the threshold voltage from being reached is used, the voltage applied to the gate insulating film of the select transistor can be made lower, which makes it possible to effectively prevent the gate insulating film from being damaged.

(2) The operating speed of the flash memory can be improved.

With the configuration of the first embodiment, the bit lines are hierarchized into the local bit lines and the global bit lines (read global bit lines and write global bit lines). That is, a plurality of memory cells are connected to each of a plurality of local bit lines. A plurality of local bit lines are connected to each of a plurality of global bit lines. In the example of FIG. 2, 2(m+1) local bit lines (LBL0 and LBL1 or LBL2 and LBL3) are connected to one write global bit line WGBL via the write column selector WCS. Then, four memory cells are connected to each of the local bit lines LBL. In addition, 4(m+1) local bit lines (LBL0 to LBL3) are connected to one read global bit line RGBL via the read column selector RCS. Then, four memory cells are connected to each of the local bit lines.

In a write operation, only the local bit line LBL to which the selected memory cell has been connected is connected to the write global bit line WGBL. The local bit lines LBL to which the selected memory cell has not been connected are electrically isolated from the write global bit line WGBL by the write column selector WCS. Therefore, only one local bit line including the selected memory cell, that is, four memory cells, can be seen from one write global bit line WGBL. Therefore, only the four memory cells MC contribute to the parasitic capacitance on the write global bit line WGBL. The unselected memory cells which are in the same column as the selected memory cell and are connected to a different local bit line LBL do not contribute to the parasitic capacitance on the write global bit line. Therefore, it is possible to decrease the parasitic capacitance on the write global bit line remarkably. The same holds true for a read operation.

As described above, since the parasitic capacitance on the write global bit line and read global bit line are reduced, the operating speed of the flash memory can be improved.

(3) The read speed can be improved.

In the flash memory, relatively high voltages, including VPP1 and VBB1, have to be handled in a write operation. To meet this requirement, high-withstand-voltage MOS transistors whose gate insulating film is thick have to be used. On the other hand, the voltages handled in a read operation are lower than in a write operation. Therefore, as far as a read operation is concerned, it is desirable that low-withstand-voltage MOS transistors whose gate insulating film is thin should be used. Even from the viewpoint of operating speed, it is desirable that low-withstand-voltage MOS transistors should be used.

In this respect, with the configuration of the first embodiment, the local bit lines are connected to the write global bit lines and read global bit lines. Then, the memory cells are connected to the write circuit 50 via the write global bit lines and to the read circuit 70 via the read global bit lines. That is, the signal route for a write operation differs from the signal route for a read operation. Therefore, in the signal route in a read operation, all of the circuits excluding the read column selector RCS that connects the read global bit lines to the local bit lines can be made using the transistors whose gate insulating film is thin. As a result, the read operating speed can be improved.

(4) The reliability of a write operation can be improved.

As explained in item (2), the bit lines are hierarchized. When the write route is particularly considered, a plurality of local bit lines are connected to one write global bit lines. Then, in a write operation, only one local bit line including the selected memory cell is electrically connected to the write global bit line. The other local bit lines are electrically isolated from the write local bit line. Therefore, the voltage corresponding to the write data is not applied to the local bit lines to which the selected memory cell is not connected. Therefore, the memory cells connected to these local bit lines can be prevented effectively from being written into erroneously, which enables the reliability of the write operation to be improved.

Figure 26:
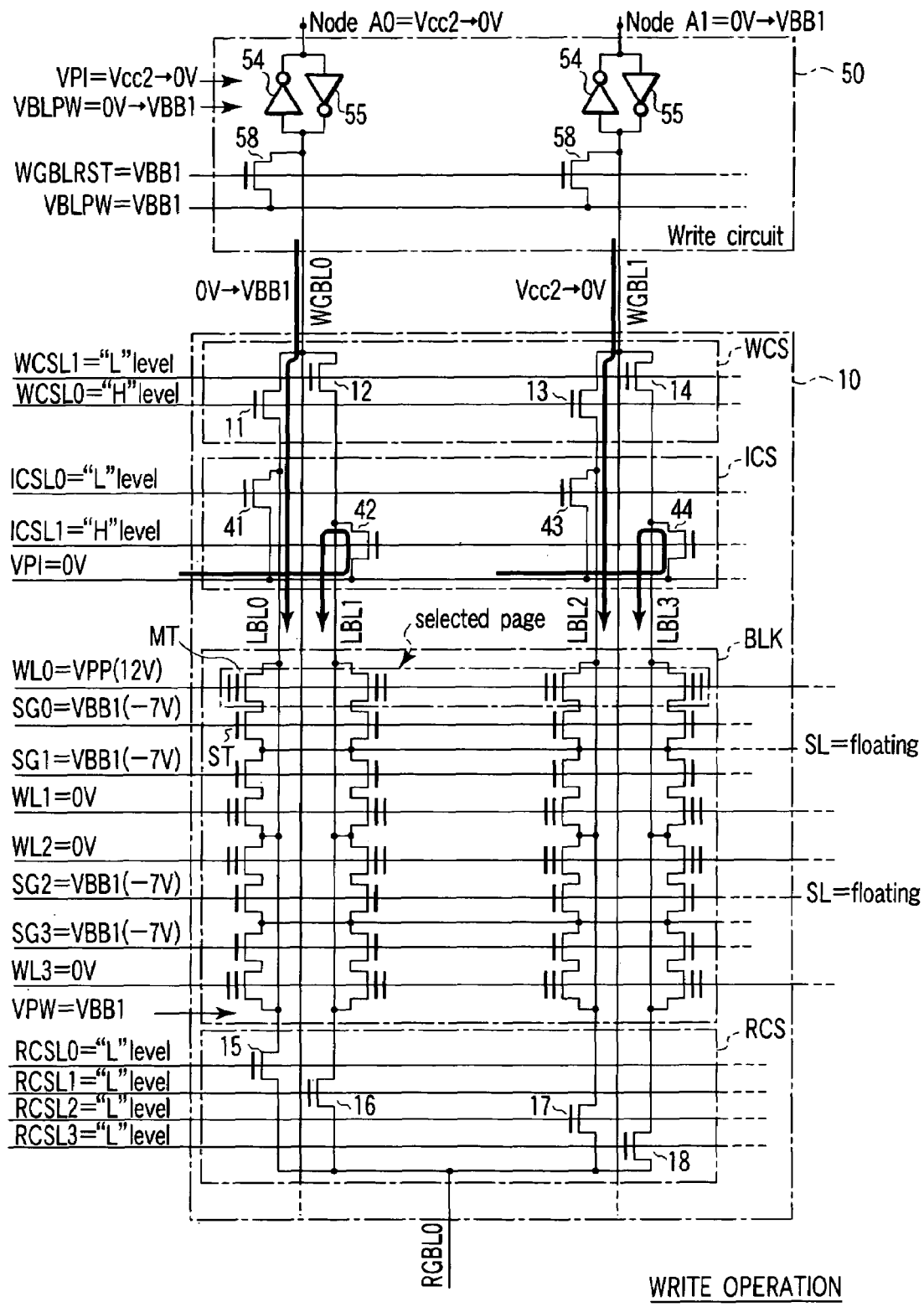
FIG. 26 is a circuit diagram to help explain the states of the memory cell array, select gate decoder, switch group, and write circuit in a write operation of the 2Tr flash memory according to the first embodiment.

Furthermore, as shown in FIG. 26, the write inhibit column selector ICS applies the write inhibit voltage VPI to the unselected local bit lines, which prevents the unselected memory cells from being written into erroneously.

Next, a semiconductor memory device-according to a second embodiment of the present invention will be explained. The second embodiment is such that the charge on the select gate lines is discharged to the decoder circuit in an erase operation in the 2Tr flash memory explained in the first embodiment. Since the configuration of a 2Tr flash memory according to the second embodiment is the same as that of the first embodiment except for the select gate decoder 30, its explanation will be omitted. FIG. 32 is a circuit diagram of the memory cell array 10, write decoder 20, and select gate decoder 30.

As shown in FIG. 32, the NAND gates 33 of the row address decode circuit 31 included in the select gate decoder 30 of the second embodiment carries out the NAND operation of the row address signals RA0 to RAi and an erase set signal /ERSSET. The inverters 34 invert the results of the operations at the NAND gates 33 and supply the inverted signals to select gate lines SG0 to SG(4m+3). The erase set signal /ERSSET is set to the low (L) level at the beginning of the erase operation.

The isolating MOS transistors 25, 35 and row address decode circuit 21 are made of MOS transistors whose gate insulating film is thick (hereinafter, referred to as FHV transistors). Their film thickness is, for example, 18 nanometers. The row address decode circuit 31 is made of MOS transistors whose gate insulating film is thinner than that of an FHV transistor (hereinafter, referred to as FLV transistors). Their film thickness is, for example, 8 nanometers. The reason is that the isolating MOS transistors 25, 35 and row address decode circuit 21 deal with high voltages, including VPP, VBB1, and VBB2, whereas the row address decode circuit 31 operates using Vcc2 and 0V as power supply voltages.

Figure 33:
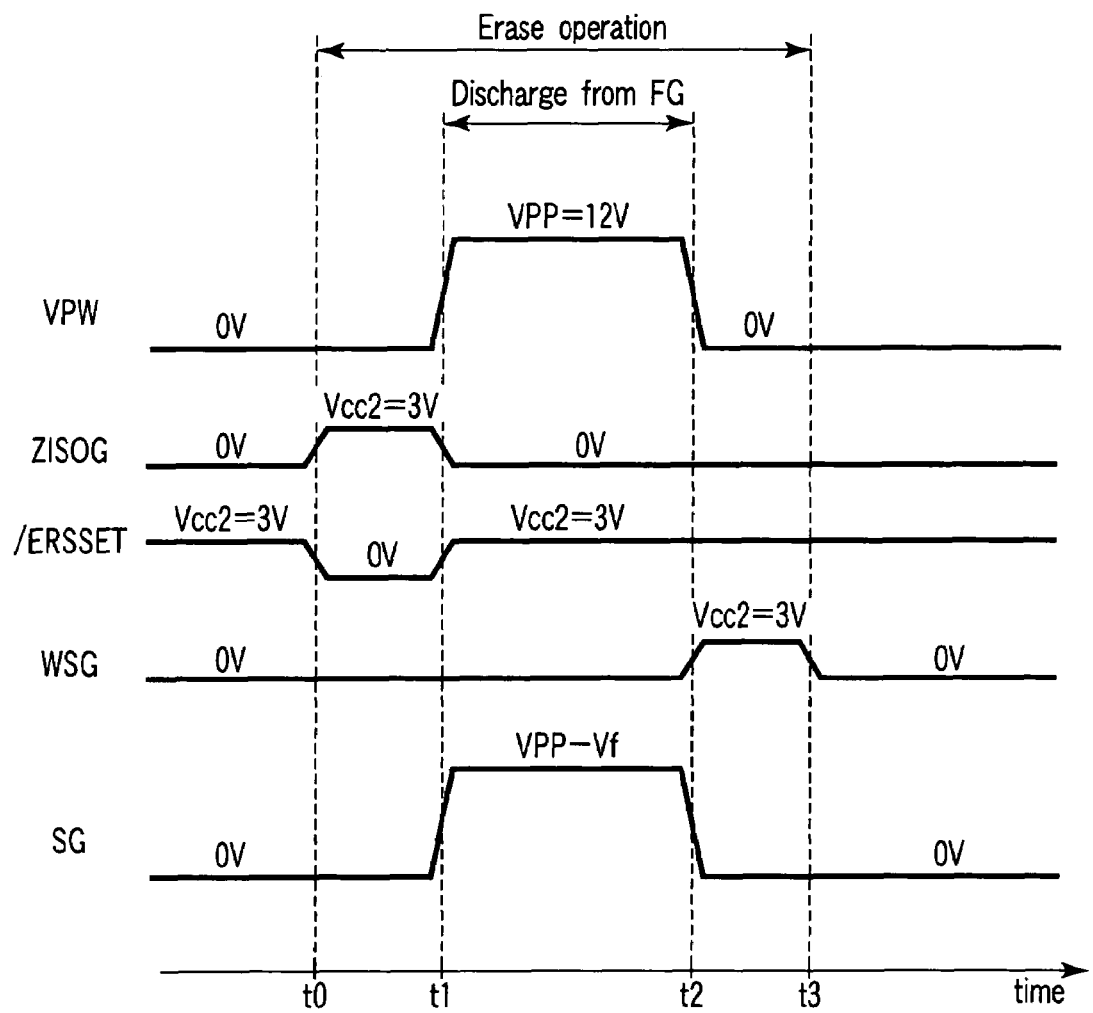
FIG. 33 is a timing chart for various signals in an erase operation of the 2Tr flash memory according to the second embodiment.

Next, the operation of the 2Tr flash memory according to the second embodiment will be explained. Since a write and a read operation are the same as in the first embodiment, only an erase operation will be explained below. FIG. 33 is a timing chart for various signals in an erase operation. The erase operation of the 2Tr flash memory according to the second embodiment includes three steps: a discharging step from the select gate lines to the read decoder 30, a data erasing step, and a discharging step from the select gate lines to the write decoder 20. Hereinafter, these steps will be explained in detail.

<Discharging Step to the Read Decoder>

Figure 34:
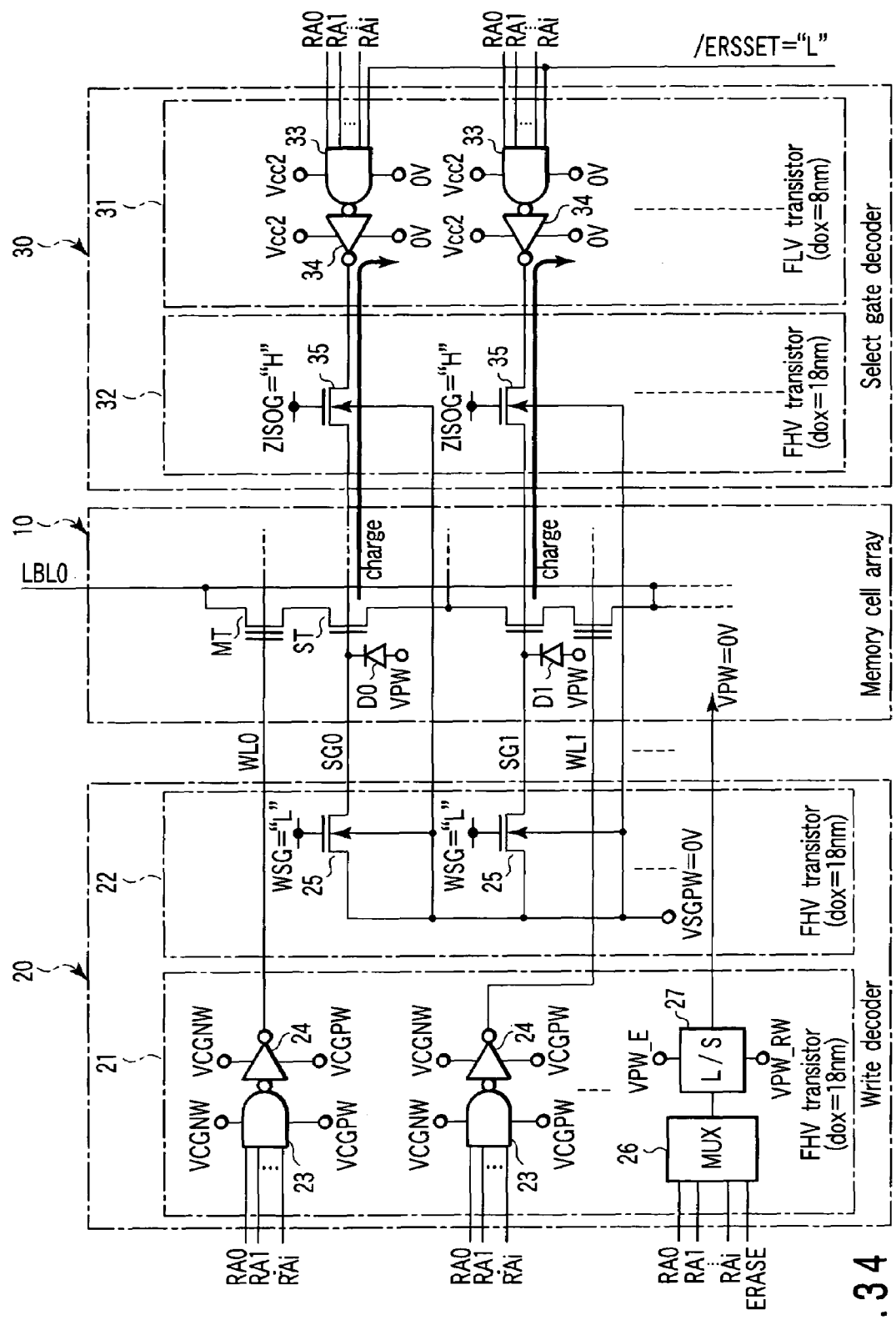
FIG. 34 is a circuit diagram of the memory cell array, write decoder and select gate decoder of the 2Tr flash memory according to the second embodiment.

When an erase operation is started, the step of discharging the charge on the select gate lines to the read decoder 30 is carried out. This step is performed in the period between time t0 and time t1 in FIG. 33. FIG. 34 shows a circuit diagram of the memory cell array 10, write decoder 20, and select gate decoder 30 in this step.

As shown in FIG. 33, ZISOG is set to the high (H) level (Vcc2). WSG is kept at the low (L) level. As a result, the isolating transistors 35 in the select gate decoder 30 are turned on, which electrically connects select gate lines SG0 to SG(4m+3) to the row address decode circuit 31. The isolating MOS transistors 25 in the write decoder 20 are in the off state.

In addition, the erase set signal /ERSSET is set to the low (L) level. As a result, the outputs of the inverters 34 in the select gate decoder 30 go to the low (L) level. Accordingly, select gate lines SG0 to ST(4m+3) are connected to the semiconductor substrate 200 in which the row address decode circuit 31 is formed. The potential of the semiconductor substrate 200 is 0V. Therefore, when charge exists on select gate lines SG0 to SG(4m+3), the charge is discharged to the semiconductor substrate 200, which fixes select gate lines SG0 to SG(4m+3) to 0V.

<Data Erasing Step>

Figure 35:
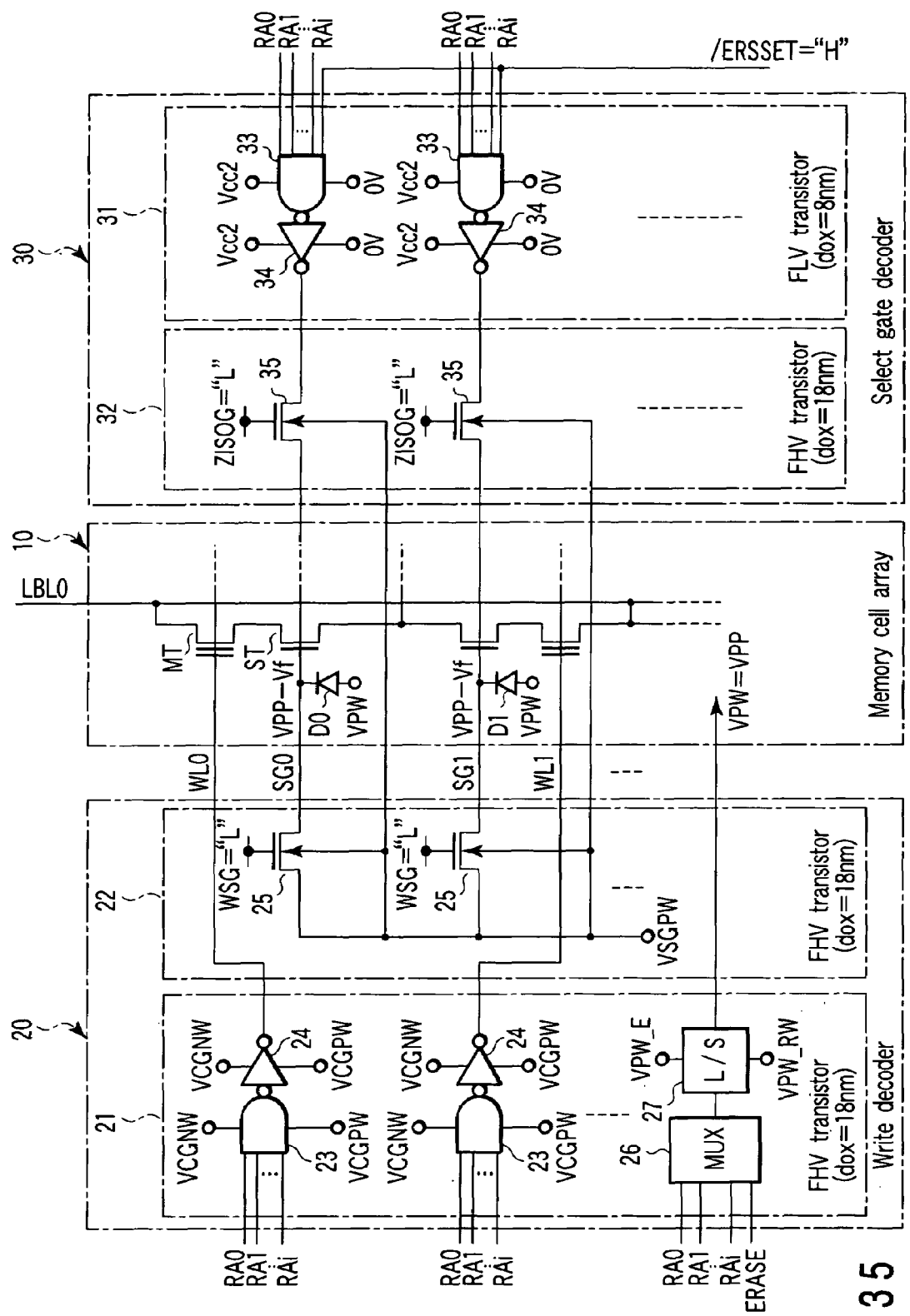
FIG. 35 is a circuit diagram of the memory cell array, write decoder and select gate decoder of the 2Tr flash memory according to the second embodiment.

Next, the data is erased in the period between time t1 and time t2. Specifically, electrons are discharged from the floating gates FG of the memory cells MC to the p-well region 202. This is shown in FIG. 35.

To perform a data erasing step, ZISOG is changed to the low (L) level, turning on the MOS transistor 35. WSG is kept at the low (L) level, which causes the MOS transistor 25 to remain in the off state. As a result, select gate lines SG0 to SG(4m+3) are electrically in the floating state. At time t1, the erase signal ERASE is input, the positive potential VPP is applied to the p-well region 202 and the negative potential VBB2 (−8V) is applied to word lines WL0 to WL(4m+3).

As a result, electrons are pulled out of the floating gates FG of the memory cells MC into the p-well region 202, thereby erasing the data. At this time, since diodes D0 to D(4m+3) are forward-biased, the potentials on select gate lines SG0 to SG(4m+3) are about (VPP−Vf).

<Discharging Step to the Write Decoder>

Figure 36:
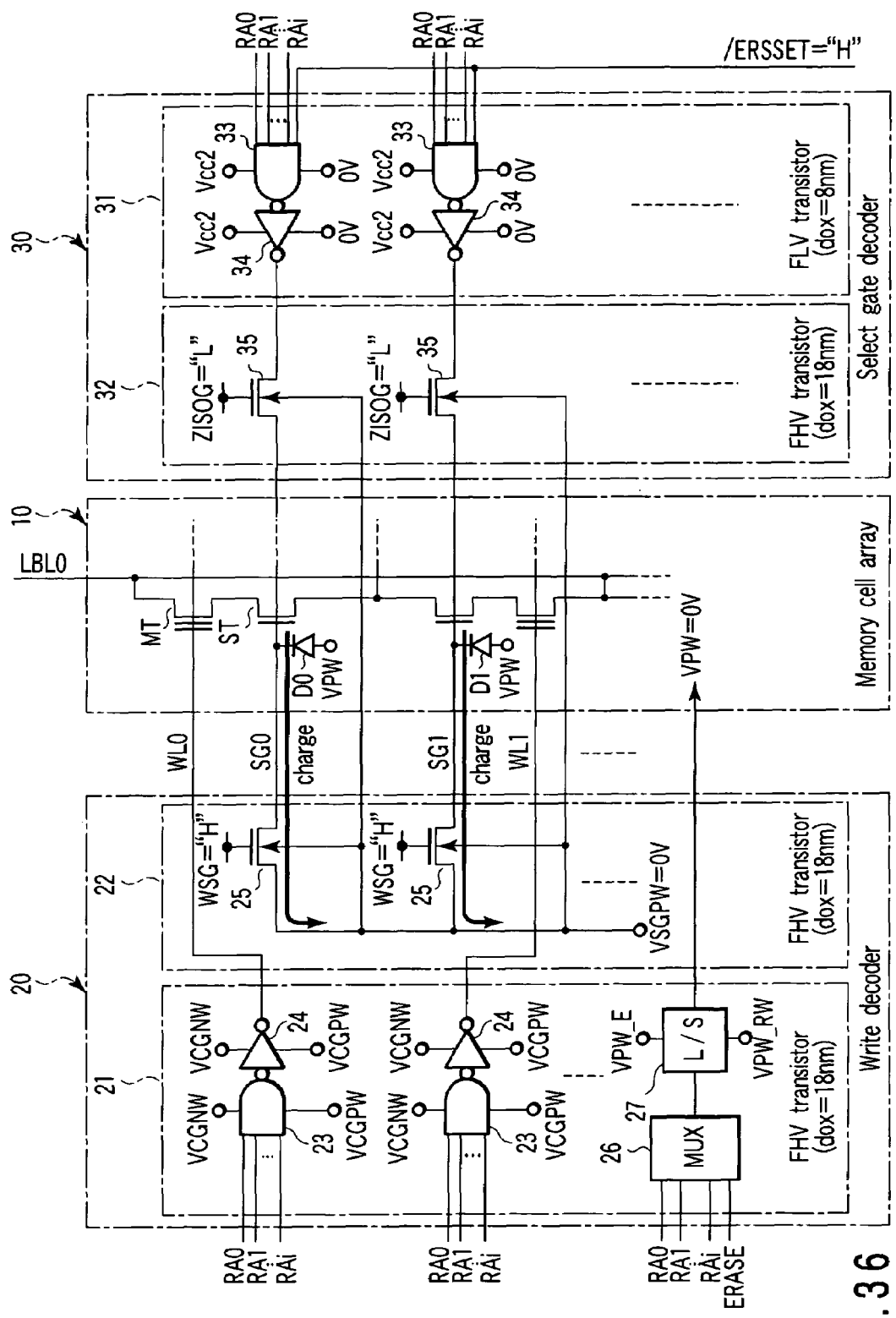
FIG. 36 is a circuit diagram of the memory cell array, write decoder and select gate decoder of the 2Tr flash memory according to the second embodiment.

After electrons have been discharged from the floating gates, the step of discharging the charges on the select gate lines to the write decoder 20 is performed. This step is carried out in the period between time t2 and time t3 in FIG. 33. FIG. 36 is a circuit diagram of the memory cell array 10, write decoder 20, and select gate decoder 30 in this step.

As shown in FIGS. 33 and 36, WSG is set to the high (H) level (Vcc2). ZISOG is kept at the low (L) level. As a result, the isolating transistors 25 in the write decoder 20 are turned on, which electrically connects select gate lines SG0 to SG(4 m+3) to VSGPW node. The isolating MOS transistors 35 in the read decoder 30 are in the off state.

Furthermore, VPW is set to 0V and the potential at VSGPW node is set to 0V. As a result, the charge existing on select gate lines SG0 to SG(4 m+3) is discharged to VSGPW node, causing the potential at VSGPW node to drop from (VPP−Vf) to 0V.

As described above, the 2Tr flash memory of the second embodiment produces not only the effects in item (1) to item (4) explained in the first embodiment but also the effect in item (5) explained below.

(5) The reliability of the memory cells can be improved more.

With the 2Tr flash memory of the second embodiment, the voltages on the select gate lines are set to 0V before electrons are discharged from the floating gates FG. More specifically, the output node of the row address decode circuit 31 is electrically connected by the /ERSSET signal to the semiconductor substrate 200 fixed to 0V and further the isolating MOS transistor 35 is turned on, thereby electrically connecting the selected gate lines to the semiconductor substrate. In this way, after the voltages on the select gate lines are set to 0V, the positive voltage VPP is applied to the p-well region 202 and the negative voltage VBB2 is applied to the word lines, thereby discharging electrons from the floating gates to the p-well region 202.

As described above, before the positive voltage VPP is applied to the p-well region 202, the potentials on the select gate lines are brought to 0V, thereby preventing the potentials on the select gate lines from rising too much. For example, if VPP is applied to the p-well region 202, with the potentials on the select gate lines higher than 0V, the potential on the select gate lines might rise that much more. With the second embodiment, however, the select gate lines have been set to 0V, which enables the potentials on the select gate lines to be (VPP−Vf) and therefore prevents voltage damage from being done to the gate insulating films 400 of the select transistors ST.

In the 2Tr flash memory of the second embodiment, after electrons are discharged from the floating gates FG, the charge on the select gate lines is discharged to VSGPW node, thereby bringing the potentials on the select gate lines to 0V. Therefore, the operation reliability of the 2Tr flash memory after the erase operation can be improved. The reason why the charge is discharged to the write decoder 20 in this step is that the potentials on the select gate lines are a relatively high voltage of (VPP−Vf).

In the second embodiment, the case where electrons are discharged to the read decoder 30 and write decoder 20 before and after the erase operation, respectively, has been explained. However, electrons may be discharged to the write decoder 20 before and after the erase operation. In addition, the case where the row address decode circuit is divided into the write route (i.e., the write decoder 20) and the read route (i.e., the read decoder 30) has been explained in the first and second embodiments. These decoders 20, 30 may be combined into a single decoder. However, use of the write decoder and the read decoder produces the effect in item (6) below.

(6) The row decoders can be made more compact and the operating speed of the row decoders can be improved.

In the flash memory according to the first and second embodiments, the positive high voltage VPP (12V) and the negative high voltage VBB1 (−7V) and VBB2 (−8V) are used in a write and an erase operation. The relatively low voltage Vcc2 (3V) is used in a read operation. In this case, for the row decoder to deal with a write and an erase operation and a read operation, the decoder has to be made of high-withstand-voltage MOS transistors capable of withstanding the high voltages VPP, VBB1, VBB2. However, as far as a read operation is concerned, such high-withstand-voltage MOS transistors have only a high breakdown voltage to no purpose, which contributes to a decrease in the read speed.

In this respect, in the first and second embodiments, the row decoder is divided into the write decoder 20 and the read decoder 30. Then, the isolating MOS transistors 25, 35 separate the select gate lines from the row address decode circuit 31 and connect the select gate lines to VSGPW node in a write operation, whereas they connect the select gate lines to the row address decode circuit 31 and separate the select gate lines from VSGPW node in a read operation.

As a result, the read decode circuit 31 using a low voltage can be protected from such a high voltage as VPP or VBB1, VBB2 being applied. Therefore, the row address decode circuit 31 can be composed of low-withstand-voltage MOS transistors. Thus, the read operation can be carried out at higher speed. High-breakdown-voltage MOS transistors have only to be used in the write row address decode circuit 21 and isolating MOS transistors 25, 35, which helps minimize the number of high-withstand-voltage MOS transistors. This enables the size of the row decoder to be made smaller.

Figure 37:
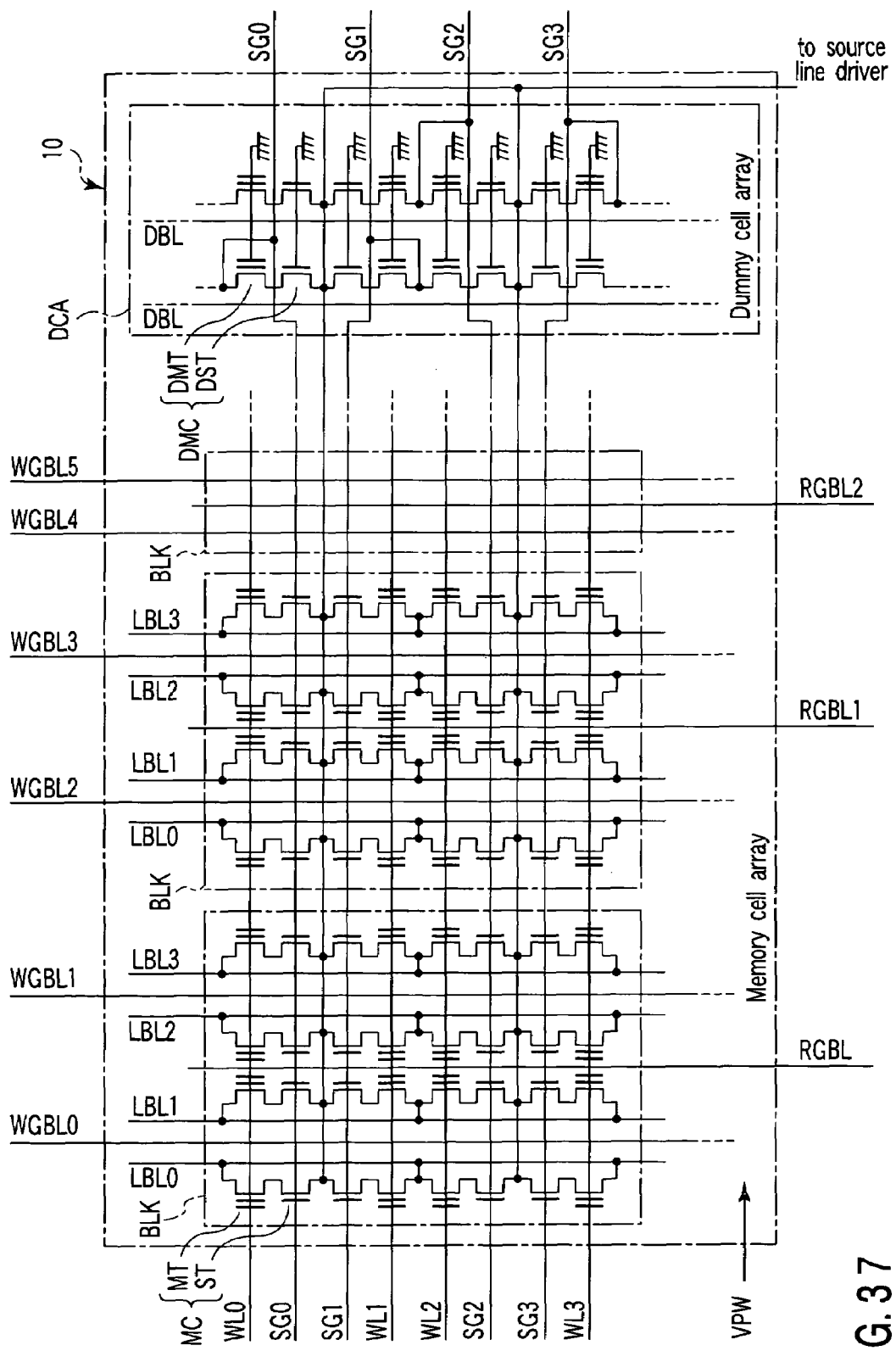
FIG. 37 is a circuit diagram of the memory cell array of the 2Tr flash memory according to the third embodiment.

Next, a semiconductor memory device according to a third embodiment of the present invention will be explained. The third embodiment is such that the diodes in the first and second embodiments are realized by dummy cells. Using FIG. 37, the memory cell array 10 included in a 2Tr flash memory according to the third embodiment will be explained. FIG. 37 is a plan view of the memory cell array. Since the configuration and operation of the third embodiment are the same as those of the first and second embodiments except for the memory cell array 10, explanation of the configuration and operation of the third embodiment will be omitted.

As shown in FIG. 37, the memory cell array 10 further has a dummy cell array DCA in the configuration of FIG. 2 in the first embodiment. The dummy cell array DCA is provided at one end of the memory cell array 10. While FIG. 37 shows a case where the dummy cell array DCA is provided to the side of the select gate decoder 30, it may be provided to the side of the write decoder 20.

The dummy cell array DCA includes at least two columns of dummy cells. One dummy cell column has the same configuration as that of a memory cell column connected to any one of the local bit lines in a memory cell block BLK. That is, in one dummy cell column, a plurality of dummy cells DMC are provided. Each of the dummy cells DMC includes a dummy memory cell transistor DMT having the same structure as that of the memory cell transistor MT of a memory cell MC and a dummy select transistor having the same structure as that of the select transistor of the memory cell MC. The source of the dummy memory cell transistor DMT is connected to the drain of the dummy select transistor DST, thereby forming a dummy cell DMC. Like the memory cells, adjacent dummy cells are arranged in such a manner that they share the drain of the dummy memory cell transistor DMT or the source of the dummy select transistor DST. The source of the dummy select transistor DST is connected to a source line SL. Like the local bit lines, dummy bit lines DBL may be formed for the dummy cell columns in a one-to-one correspondence. In this case, too, a dummy bit line DBL is not connected to the drain of a dummy memory cell transistor DMT. Then, the drain of each of the dummy memory cell transistors DMT is connected to any one of the select gate lines SG0 to SG(4m+3). Specifically, the dummy cells DMC in two columns are caused to correspond to select gate lines SG0 to SG(4m+3). The p-n junction of the drain of the dummy cell DMC and the p-well region caused to correspond to each other functions as one of the diodes D0 to D(4m+3).

Figure 38:
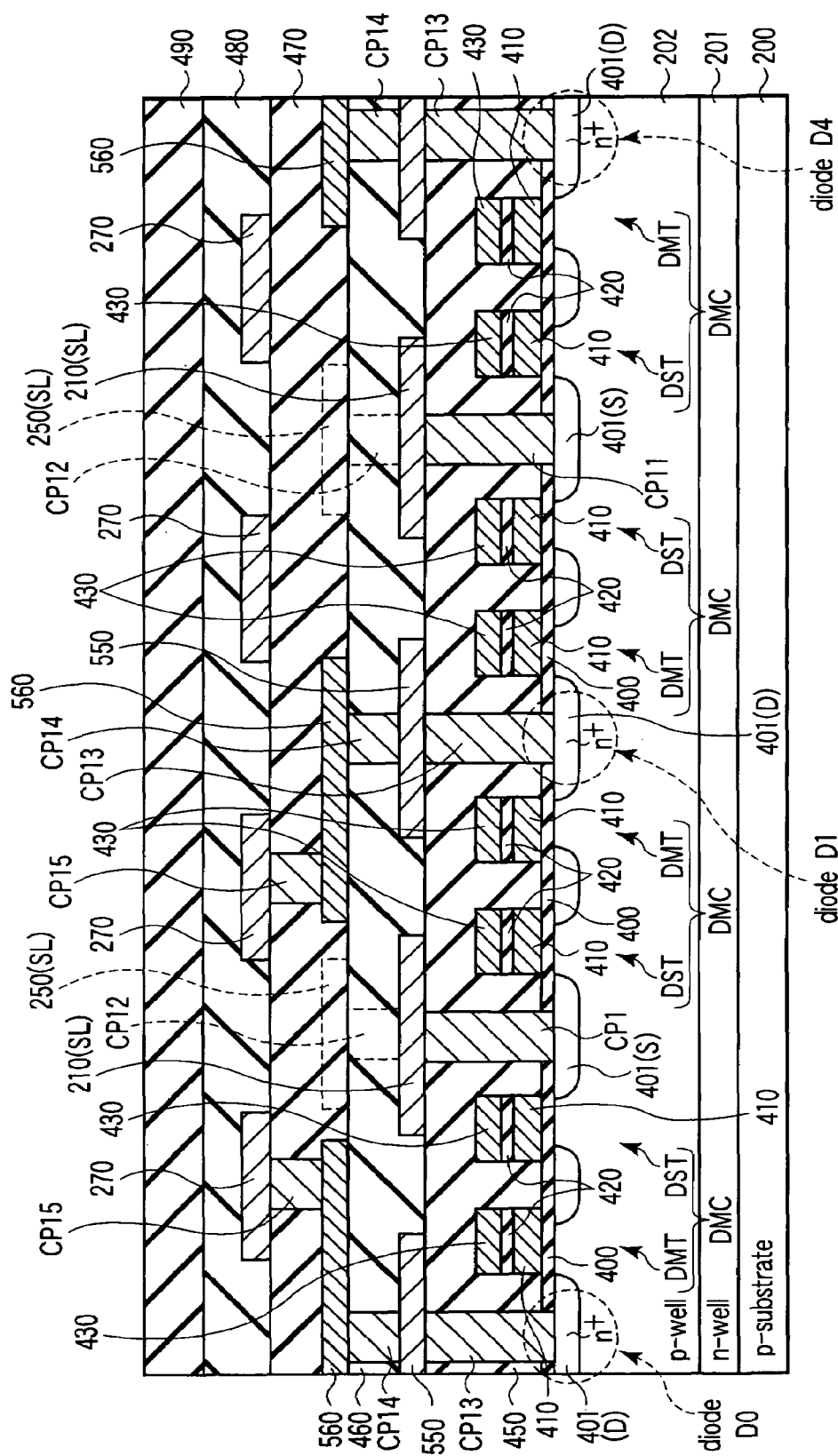
FIG. 38 is a sectional view of the dummy cell array in the 2Tr flash memory according to the third embodiment.

FIG. 38 is a sectional view of the dummy cell array DCA taken along a bit line. As shown in FIG. 38, like a memory cell block BLK, an n-well region 201 is formed at the surface of the semiconductor 200. At the surface of the n-well region 201, a p-well region 202 is formed. The p-well region 202 is also used as a p-well region 202 where a memory cell block BLK is formed. Above the p-well region 202, the stacked gates of a dummy memory cell transistor DMT and a dummy select transistor DST are formed with a gate insulating film 400 interposed therebetween. Each of the stacked gates includes a polysilicon layer 410 on the gate insulating film 400 and a polysilicon layer 430 on the polysilicon layer 410 with an inter-gate insulating film 420 interposed therebetween. At the surface of the p-well region 202, n$^+$-type impurity diffused layers 401 functioning as the sources and drains of a dummy memory cell transistor DMT and a dummy select transistor DST are formed. Then, as described above, the drain (D) of each dummy memory cell transistor DMT makes a cathode and the p-well region 202 functions as an anode, thereby forming diodes D0 to D(4m+3).

On the p-well region 202, an interlayer insulating film 450 is formed so as to cover the dummy memory cell transistors DMT and dummy select transistors DST. In the interlayer insulating film, contact plugs CP11 reaching the sources (S) 401 of the dummy select transistors DST and contact plugs CP13 reaching the drains (D) of the dummy memory cell transistors DMT, or the cathodes of the diodes D0 to D(4m−1), are formed.

On the interlayer insulating film 450, metal wiring layers 210, 550 connected to the contact plugs CP11, CP13 respectively are formed. Each metal wiring layer 210 functions as a part of a source line. Then, an interlayer insulating film 460 is formed so as to cover the metal wiring layers 201, 550. In the interlayer insulating film 460, contact plugs C14 reaching the metal wiring layers 550 are formed. Contact plugs CP12 reaching the metal wiring layers 210 may be further formed.

On the interlayer insulating film 460, metal wiring layers 560 connected to the contact plugs CP14 are formed. Metal wiring layers 250 may be formed on the interlayer insulating film 460. Each metal wiring layer 250, which functions as a part of a source line, connects a plurality of contact plugs CP12 to one another in the bit line direction. Then, an interlayer insulating film 470 is formed on the interlayer insulating film 460 so as to cover the metal wiring layers 560, 250.

On the interlayer insulating film 470, metal wiring layer 270 functioning as shunt wires for the select gate lines are formed. Then, contact plugs CP15 formed in the interlayer insulating film 470 connect the metal wiring layers 560 electrically connected to the diodes D0 to D(4m+3) to the shunt wires 270 for the corresponding select gate lines SG0 to SG(4m+3).

As described above, the 2Tr flash memory of the third embodiment produces not only the effects in item (1) to item (6) explained in the first and second embodiments but also the effect in item (7) below.

(7) The effect in item (1) can be achieved without an increase in the area.

In the 2Tr flash memory of the third embodiment, diodes D0 to D(4m+3) are made of the p-n junctions of the p-well region 202 and the drain regions of the dummy memory cell transistors DMT. The dummy cells DMC never fail to be formed in manufacturing a semiconductor memory. The dummy cells DMC are just used, for example, to control a declination in the lithographic alignment or to secure a lithographic reliability margin at the ends of a repetitive pattern in the manufacturing processes. After the shipment of the products, the dummy cells do not operate at all. As described above, diodes D0 to D(4m+3) are formed using dummy cells DMC, which makes it unnecessary to provide an additional region in which diodes D0 to D(4m+3) are to be formed. Therefore, it is possible to minimize an increase in the area resulting from the formation of diodes D0 to D(4m+3).

Furthermore, the dummy cells DMC do not operate at all after the shipment of the products. More specifically, for example, since the gates have been connected to the ground potential, they will not be selected by the row decoder. Therefore, even if diodes D0 to D(4m+3) are made of dummy cells DMC, this has no effect on the operation of the other circuits.

In the third embodiment, the case where the dummy cell array DCA includes two dummy cell columns has been explained. However, the number of dummy cell columns may be two or more. When there are three or more dummy cell columns, two of them have only to be used for forming diodes.

Figure 40:
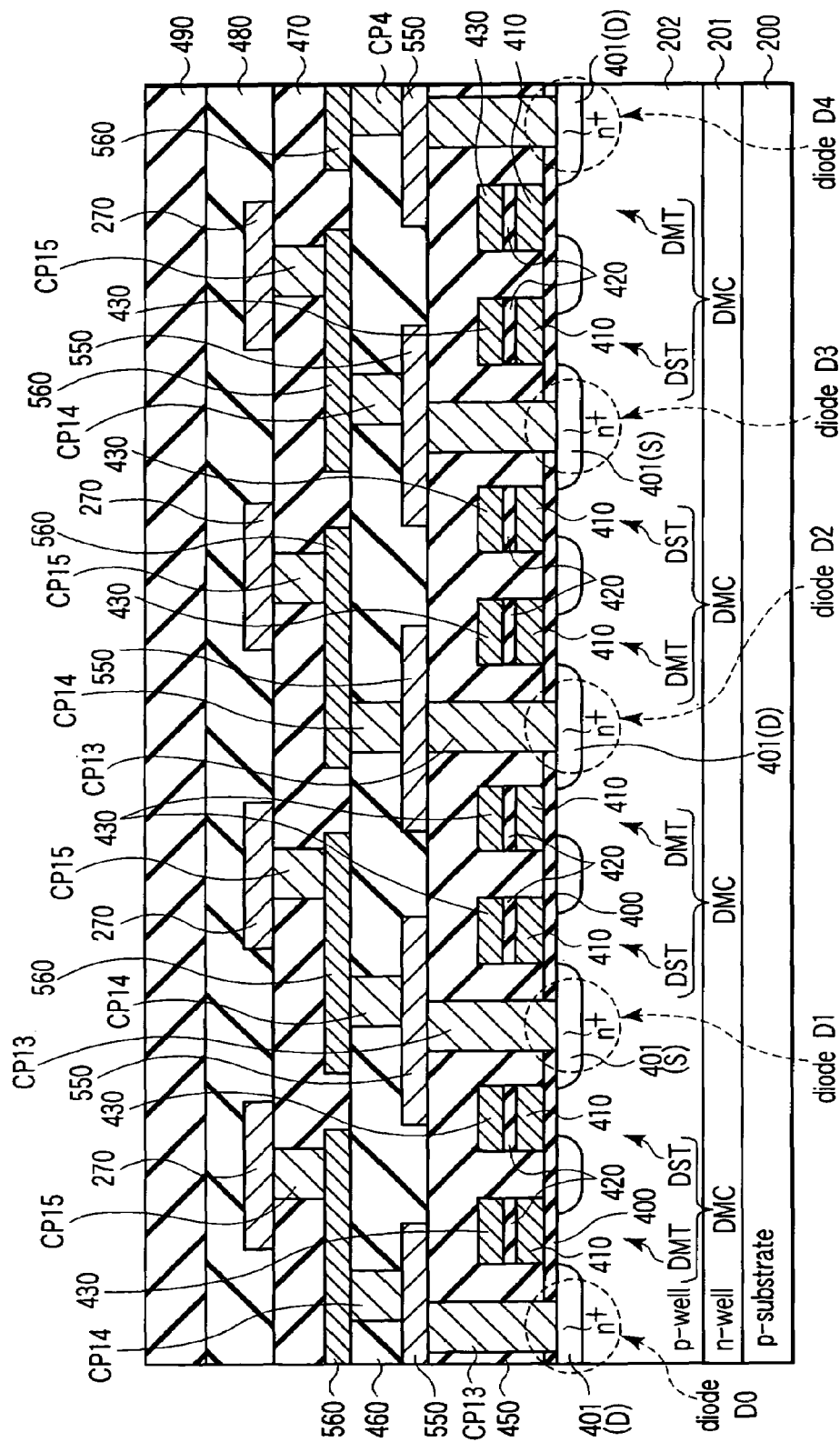
FIG. 40 is a sectional view of the dummy cell array in the 2Tr flash memory according to the modification of the third embodiment.

FIG. 39 is a circuit diagram of the memory cell array 10 of a 2Tr flash memory according to a modification of the third embodiment. This modification is such that all of the diodes D0 to D(4m+3) are formed using only a single dummy cell column. FIG. 40 is a sectional view of the dummy cell array DCA along a bit line.

As shown in FIGS. 39 and 40, this modification differs from the third embodiment in that the source 401 (S) of a dummy select transistor DST is not connected to a source line and the p-n junction of the p-well region 202 and the source 401 (S) of the dummy select transistor DST is used as a diode. Therefore, as shown in FIG. 40, the source 401 of the dummy select transistor DST is also connected to the shunt wire 270 for a select gate line via contact plugs CP13, CP14, CP15 and metal wiring layers 550, 560.

As described above, not only the p-n junction of the p-well region 202 and the drain of a dummy memory cell transistor DMT but also the p-n junction of the p-well region and the source of a dummy select transistor DMT are used as diodes, which enables all of the diodes D0 to D(4m+3) to be formed of at least one dummy cell column.

Next, a semiconductor memory device according to a fourth embodiment of the present invention will be explained. The fourth embodiment is such that the first and second embodiments are applied to a 3Tr-NAND flash memory. Hereinafter, only what differs from the second embodiment will be explained.

Figure 41:
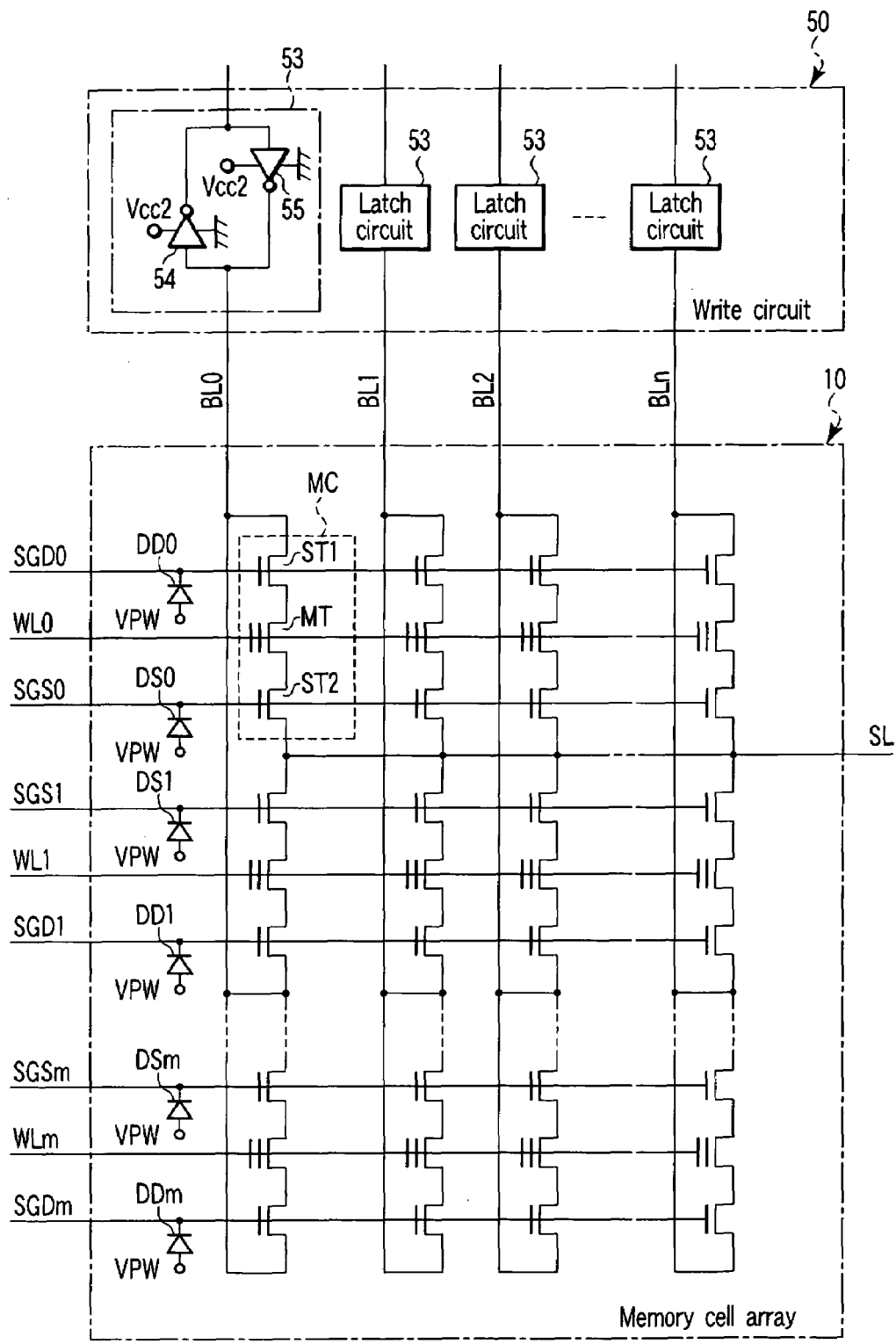
FIG. 41 is a circuit diagram of the memory cell array and write circuit of a 3Tr-NAND flash memory according to the fourth embodiment.
Figure 42:
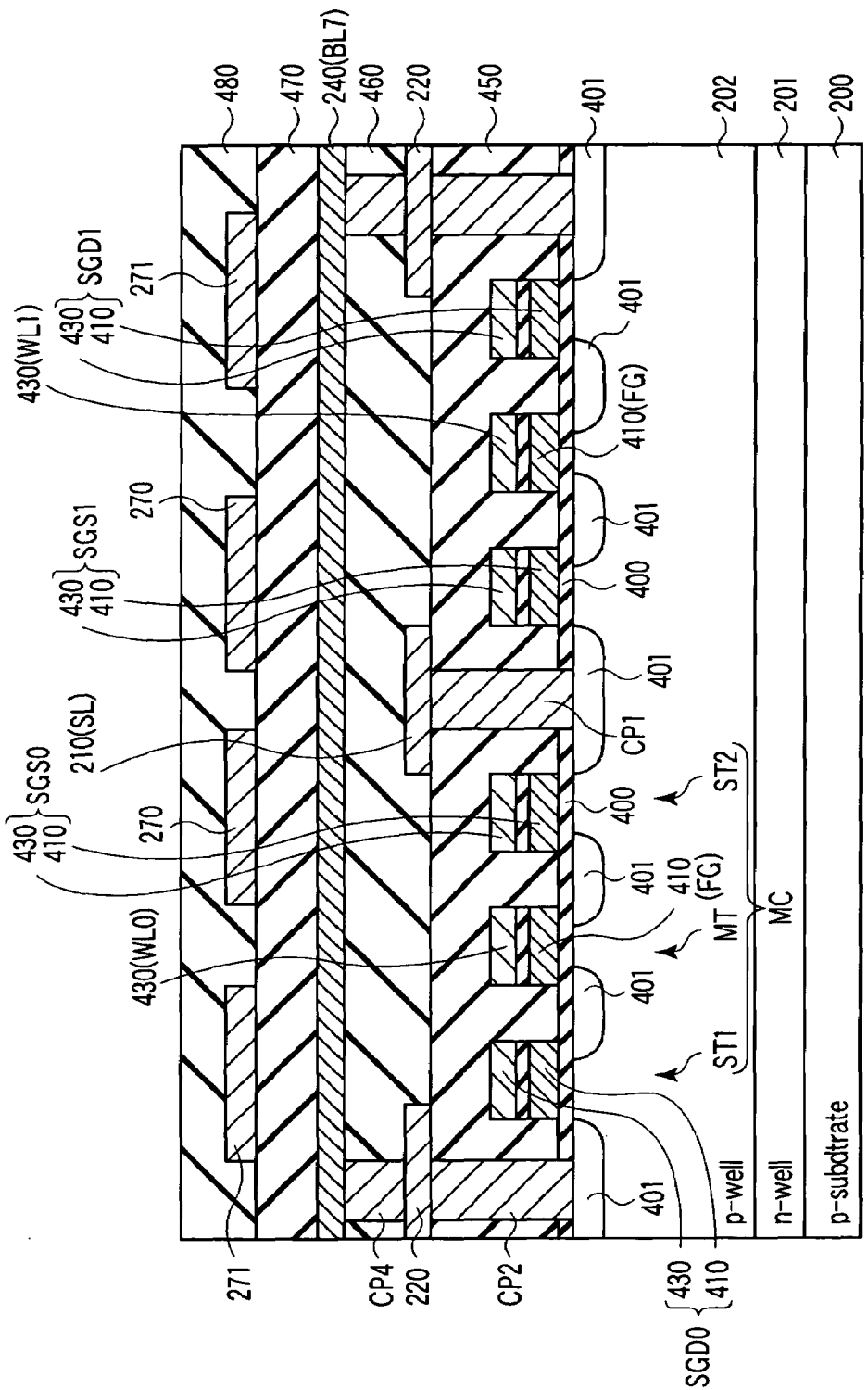
FIG. 42 is a sectional view, taken along a bit line, of the memory cell array of the 3Tr-NAND flash memory according to the fourth embodiment.

As shown in FIG. 41, a system LSI1 according to the fourth embodiment is such that the configuration of the memory cell array 10 of FIG. 1 in the first embodiment is replaced with the configuration of FIG. 41. FIG. 41 is a circuit diagram of the memory cell array 10 and write circuit 10 in the 3Tr-NAND flash memory according to the fourth embodiment. One row decoder may be used as the write decoder 20 and select gate decoder 30.

As shown in FIG. 41, the memory cell array 10 has (m+1)×(n+1) memory cells MC arranged in a matrix.

Each of the memory cell MCs includes a memory cell transistor MT and select transistors ST1, ST2, which have their current paths connected in series with one another. The current path of the memory cell transistor MT is connected between the current paths of the select transistors ST1, ST2. The memory cell transistor MT has a stacked gate structure that includes a floating gate on a semiconductor substrate with a gate insulating film interposed therebetween and a control gate on the floating gate with an inter-gate insulating film interposed therebetween. Each of the select transistors ST1, ST2 has a multilayer gate structure that includes a first polysilicon layer on the semiconductor substrate with a gate insulating film interposed therebetween and a second polysilicon layer on the first polysilicon layer with an inter-gate insulating film interposed therebetween. The source region of the select transistor ST1 is connected to the drain region of the memory cell transistor MT. The source region of the memory cell transistor MT is connected to the drain region of the select transistor ST2. Memory cells adjoining each other in the column direction share the drain region of the select transistor ST1 or the source region of the select transistor ST2.

The control gates of the memory cell transistors MT of the memory cells MC in a same row are connected commonly to any one of the word lines WL0 to WLm. The gates of the select transistors ST1 of the memory cells MC in a same row are connected commonly to any one of select gate lines SGD0 to SGDm. The gates of the select transistors ST2 of the memory cell MC in a same row are connected commonly to any one of select gate lines SGS0 to SGSm. The drain regions of the select transistors ST1 of the memory cell MCs in a same column are connected commonly to any one of bit lines BL0 to BLn.

Bit lines BL0 to BLn are connected to the corresponding latch circuits 53, respectively. The latch circuits 53 operate using Vcc2 (3V) and 0V as power supply voltages. The source regions of the select transistors ST2 of the memory cells MC are connected equally to a source line SL and then are connected to the source line driver 70.

Between the select gate lines SGD0 to SGDm and the p-well region where the memory cells MC are formed, diodes DD0 to DDm are formed respectively. Between the select gate line SGS0 to SGSm and the p-well region, diodes DS0 to DSm are formed respectively. The cathodes of diodes DD0 to DDm are connected to select gate lines SGD0 to SGDm, respectively. The cathodes of DS0 to DSm are connected to select gate lines SGS0 to SGSm, respectively. Their anodes are connected to the p-well region. The configuration of each of the diodes DD0 to DDm, DS0 to DSm is the same as that of each of the diodes D0 to D(4m+3) explained in the first embodiment.

Next, a sectional structure of the memory cell array 10 configured as described above will be explained by reference to FIG. 41. FIG. 41 is a sectional view of the memory cell array 10 taken along a bit line. As shown in FIG. 41, at the surface of the p-type semiconductor substrate 200, an n-well region 201 is formed. At the surface of the n-well region 201, a p-well region 202 is formed. On the p-well region 202, the gate electrodes of a memory cell transistor MT and select transistors ST1, ST2 are formed with a gate insulating film 204 interposed therebetween. Each of the gate electrodes of the memory cell transistor MT and select transistors ST1, ST2 has a polysilicon layer 210 formed on the gate insulating film 204, an inter-gate insulating film 220 formed on the polysilicon layer 210, and a polysilicon layer 230 formed on the inter-gate insulating film 220 as in the first embodiment.

In the memory cell transistor MT, the polysilicon layers 210, which are isolated from one another between adjacent element regions AA along the word line, function as floating gates. The polysilicon layers 230 function as control gates (or word lines WL) and are connected to each other between adjacent element regions AA.

In each of the select transistors ST1, ST2, the polysilicon layers 210, 230, are connected to each other between adjacent element regions AA, function as select gate lines SGS, SGD, respectively. The polysilicon layers 230 of the select transistors ST1, ST2 are put in an electrically floating state as described in the first embodiment. Therefore, it is only the polysilicon layers 210 that practically function as select gate lines SGS, SGD.

Then, at the surface of the p-well region 202 located between adjacent gate electrodes, an impurity diffused layer 401 is formed. The impurity diffused layer 401 is shared by adjacent transistors.

As described above, memory cells MC including memory cell transistors MT and select transistors ST are formed so as to have the following relationship. Adjacent memory cells MC, MC have their select transistors ST1 adjoining each other and their select transistors ST2 adjoining each other. The adjoining ones share an impurity diffused layer 401.

On the p-well region 202, an interlayer insulating film 450 is formed so as to cover the memory cell transistor MT and select transistor ST. In the interlayer insulating film 450, a contact plug CP1 reaching the impurity diffused layer (or source region) 401 shared by two select transistors ST2, ST2 is formed. On the interlayer insulating film 450, a metal wiring layer 210 connected to the contact plug CP1 is formed. The metal wiring layer 210 functions as a source line SL. Further in the interlayer film 450, a contact plug CP2 reaching the impurity diffused layer (or drain region) 401 shared by two select transistors ST2, ST2 is formed. On the interlayer insulating film 450, a metal wiring layer 220 connected to the contact plug CP2 is formed.

On the interlayer insulating film 450, an interlayer insulating film 460 is formed so as to cover the metal wiring layers 210, 220. In the interlayer insulating film 460, a contact plug CP4 reaching the metal wiring layer 220 is formed. On the interlayer insulating film 460, a metal wiring layer 240 connected commonly to a plurality of contact plugs CP4 is formed. The metal wiring layers 240 function as bit lines BL0 to BLn.

On the interlayer insulating film 460, an interlayer insulating film 470 is formed so as to cover the metal wiring layer 240. On the interlayer insulating film 470, metal wiring layers 270, 271 are formed. The metal wiring layers 270, 271, which function as shunt wires for the select gate lines SGS, SGD, are arranged at equal intervals. On the interlayer insulating film 470, an interlayer insulating film 480 is formed so as to cover the metal wiring layers 270, 271.

Next, the operation of the 3Tr-NAND flash memory configured as described above will be explained.

<Write Operation>

Figure 43:
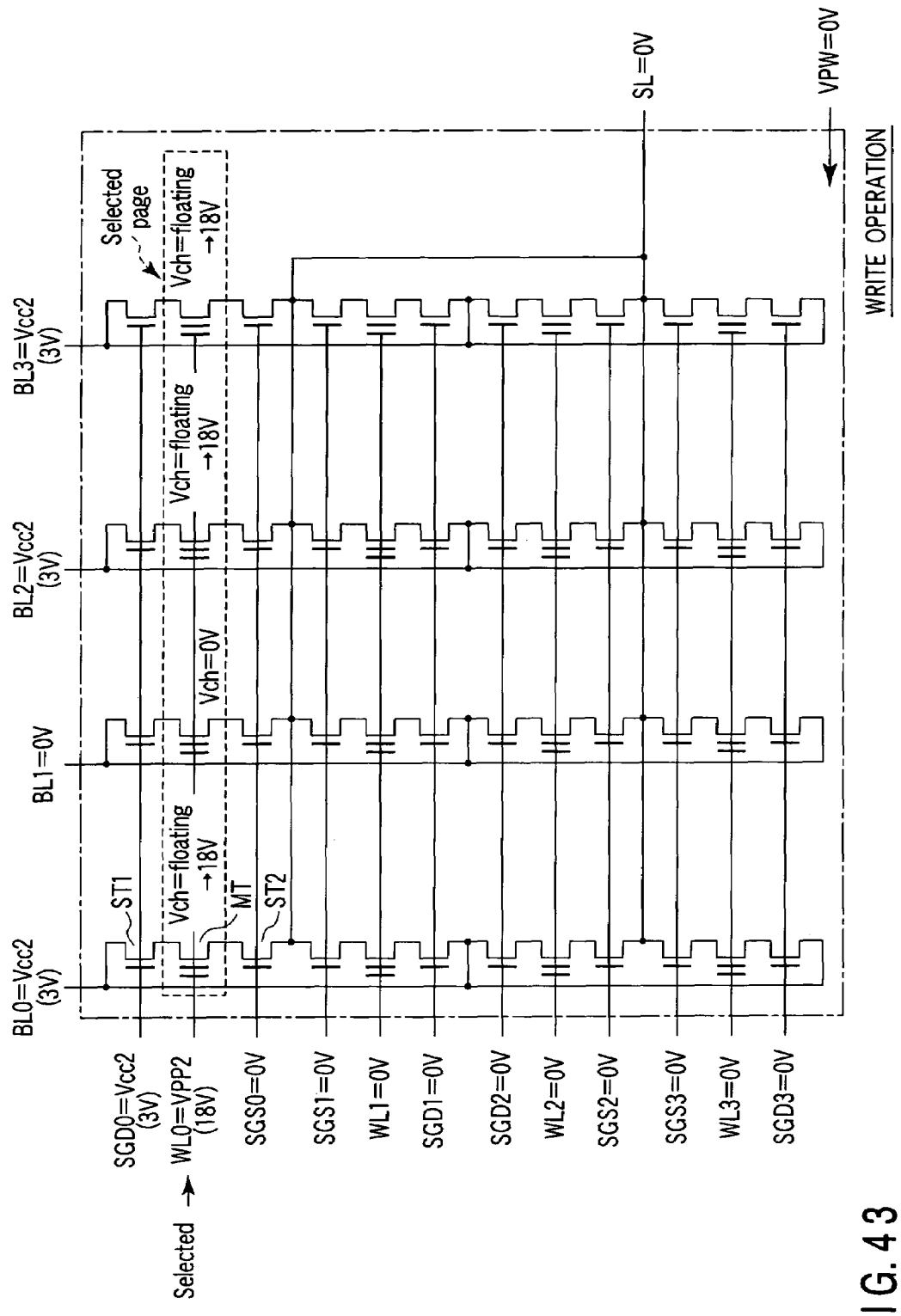
FIG. 43 is a circuit diagram to help explain the state of the memory cell array in a write operation of the 3Tr-NAND flash memory according to the fourth embodiment.

A write operation will be explained by reference to FIG. 43. FIG. 43 is a circuit diagram of the memory cell array 10 of the 3Tr-NAND flash memory 3. For simplification, FIG. 43 shows a case where the number of memory cells is (4×4). Data is written simultaneously into all of the memory cell transistors connected to any one of the word lines. Either "0" data or "1" data is written, depending on whether electrons are injected into the floating gate of a memory cell transistor MT. Electrons are injected into the floating gate by FN tunneling. In FIG. 43, it is assumed that data is written into the memory cell transistors MT connected to word line WL0. Of the memory cell transistors MT, "0" data is written into the memory cell transistor MT connected to bit line BL1 and "1" data is written into the memory cell transistors MT connected to bit lines BL0, BL2, BL3.

First, the CPU 2 inputs write data ("1" or "0"). Then, the latch circuit 51 in the write circuit 50 latches the write data on a bit line basis. If "1" data is input, the latch circuit 51 applies Vcc2 (e.g., 3V) to the bit line. Conversely, if "0" data is input, the latch circuit 51 applies 0V to the bit line. That is, as shown in FIG. 43, the latch circuit 51 applies Vcc2 to bit lines BL0, BL1, BL3 and 0V to bit line BL1.

Then, the row decoder selects any one of the select gate lines SGD and applies Vcc1 to the selected select gate line SGD and 0V to the unselected select gate lines SGD and all of the select gate lines SGS. That is, as shown in FIG. 43, the row decoder selects select gate line SGD0 and applies Vcc1 to the selected select gate line SGD0 and 0V to the other select gate lines SGS0, SGD1, SGS1, SGD2, SGS2, SGD3, SGS3.

As a result, of the select transistors ST1 connected to the selected select gate line SGD, the select transistor ST1 connected to the bit line BL to which Vcc2 is applied is in the cut-off state. On the other hand, the select transistor ST1 connected to the bit line BL to which 0V is applied is in the on state.

Furthermore, the row decoder selects any one of the word lines and applies VPP2 (18V) to the selected word line WL. In addition, the row decoder applies 0V to all of the unselected word lines. Here, the word line WL selected is the one connected to the memory cell MC including the selected select gate line SGD. As a result, a channel region is formed in the memory cell transistor MT connected to the selected word line WL. Since the select transistor ST1 connected to the selected select gate line SGD and the bit line to which Vcc2 is applied is in the cut-off state, the channel potential of the memory cell transistor MT connected to the select transistor ST1 is in the floating state. Then, coupling with the word line WL, the channel potential rises to about 18V. On the other hand, since the select transistor ST1 connected to the selected select gate line SGD and the bit line to which 0V is applied is in the on state, the channel potential of the memory cell transistor MT connected to the select transistor ST1 is at 0V.

Specifically, as shown in FIG. 43, the row decoder not only selects word line WL0 and applies VPP2 to the selected word line WL0 but also applies 0V to the unselected word lines WL1 to WL3. Therefore, a channel region is formed in the memory cell transistors MT connected to word line WL0. Then, since 0V is applied to bit line BL1, the channel potential Vch of the memory cell transistors MT in the memory cell including the select transistor ST1 connected to bit line BL1 is 0V. On the other hand, since Vcc1 is applied to bit lines BL0, BL2, BL3, the channel potential Vch of the memory cell transistors MT in the memory cell including the select transistors ST1 connected to bit lines BL0, BL2, BL3 rises to about 18V as a result of coupling with the word line WL0.

Moreover, the row decoder applies 0V to the p-well region 202 in which memory cells have been formed.

As a result, in the memory cell transistor MT in the memory cell including the select transistor ST1 cut off, since the potential difference between the gate and channel is insufficient, no electron is injected into the floating gate. That is, the threshold value of the memory cell connected to the bit line applied with Vcc1 and the selected word line WL (or the memory cell into which "1" data is to be written) remains negative. In the example of FIG. 43, no electron is injected into the floating gate of the memory cell transistors MT connected to bit lines BL0, BL2, BL3 and word line WL0. In other words, "1" data is written into the memory cell transistors MT connected to bit lines BL0, BL2, BL3 and the selected word line WL0.

On the other hand, in the memory cell transistor MT in the memory cell including the select transistor ST1 connected to the selected select gate line SGD and to the bit line BL applied with 0V, since the potential difference between the gate and channel is 18V, electrons are injected into the floating gate by FN tunneling. As a result, the threshold value of the memory cell transistor MT changes to positive. That is, "0" data is written. In the example of FIG. 43, VPP2 is applied to word line WL0, with the result that the potential difference between the gate and channel of the memory cell transistor MT connected to bit line BL1 and word line WL0 is 18V. Therefore, electrons are injected into the floating gate of the memory cell transistor MT connected to bit line BL1 and word line WL0. The threshold value of the memory cell transistor MT into which electrons have been injected changes to positive, which means that "0" data has been written.

As described above, the data is written into one page of memory cell transistors simultaneously.

<Erase Operation>

Figure 44:
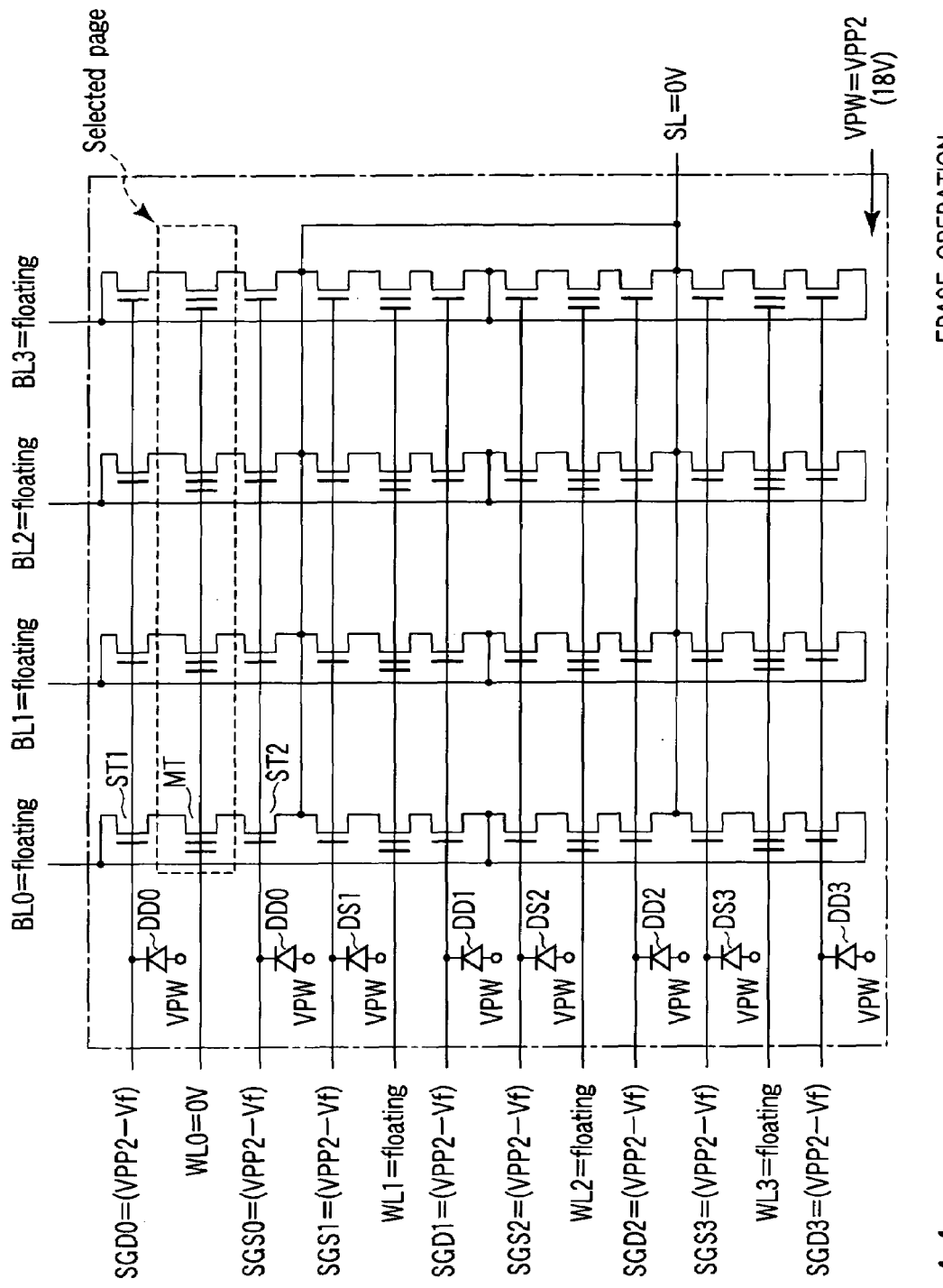
FIG. 44 is a circuit diagram to help explain the state of the memory cell array in an erase operation of the 3Tr-NAND flash memory according to the fourth embodiment.

An erase operation will be explained by reference to FIG. 44. FIG. 44 is a circuit diagram of the memory cell array 10 of the 3Tr-NAND flash memory 3. For simplification, FIG. 44 shows a case where the number of memory cells is (4×4). Data is erased in pages simultaneously. An erase operation is carried out by pulling electrons out of the floating gate by FN tunneling. FIG. 44 shows a case where the data is erased from the memory cell transistors connected to word line WL0.

Before an erase operation, all of the bit lines BL are brought into the floating state. In addition, the row decoder brings all of the select gate lines SGD, SGS into the floating state. Then, the row decoder not only selects any one of the word lines and applies 0V to the selected word line WL but also brings the unselected word lines WL into the floating state. In addition, the row decoder applies VPP2 (18V) to the p-well region 202 in which memory cells have been formed. That is, as shown in FIG. 44, 0V is applied to the selected word line WL0 and the unselected word lines WL1 to WL3 are brought into the floating state. Moreover, all of the select gate lines SGD0 to SGD3, SGS0 to SGS3 are brought into the floating state. Then, diodes DD0 to DD3, DS0 to DS3 are forward-biased. As a result, all of the select gate lines SGD0 to SGD3, SGS0 to SGS0 to SGS3 rise from the floating state to (VPP2−Vf).

Then, the potential difference between the memory cell transistors MT connected to the selected word line WL and the well region 202 is 18V, causing the electrons in the floating gates to be pulled out into the semiconductor substrate 200 by FN tunneling. As a result, the data is erased from the memory cell transistors MT connected to the selected word line, with the result that the threshold value of the memory cell transistors MT becomes negative. That is, as shown in FIG. 44, electrons are pulled out of the floating gates of all the memory cell transistors MT connected to word line WL0 into the semiconductor substrate, thereby erasing the data.

In the memory cell transistors MT connected to the unselected word lines, the potentials on the word lines WL rise to about 18V by coupling with the semiconductor substrate. As a result, electrons are not pulled out of the floating gates, with the result that the data is not erased. That is, as shown in FIG. 44, the potentials on the word lines WL1 to WL3 rise by coupling. As a result, the data is not erased from all of the memory cell transistors MT connected to word lines WL1 to WL3. In addition, the potentials on the select gate lines rise to about (18V−Vf) through the diodes, which prevents voltage stress from being applied to the gate insulating films of the select transistors ST1, ST2.

As described above, the data is erased simultaneously from the selected page. In the example of FIG. 44, while the data has been erased from (one page of) the memory cell transistors connected to one word line, the data may be erased simultaneously from the memory cell transistors connected to a plurality of word lines. In this case, the row decoder applies 0V to a plurality of word lines.

<Read Operation>

Figure 45:
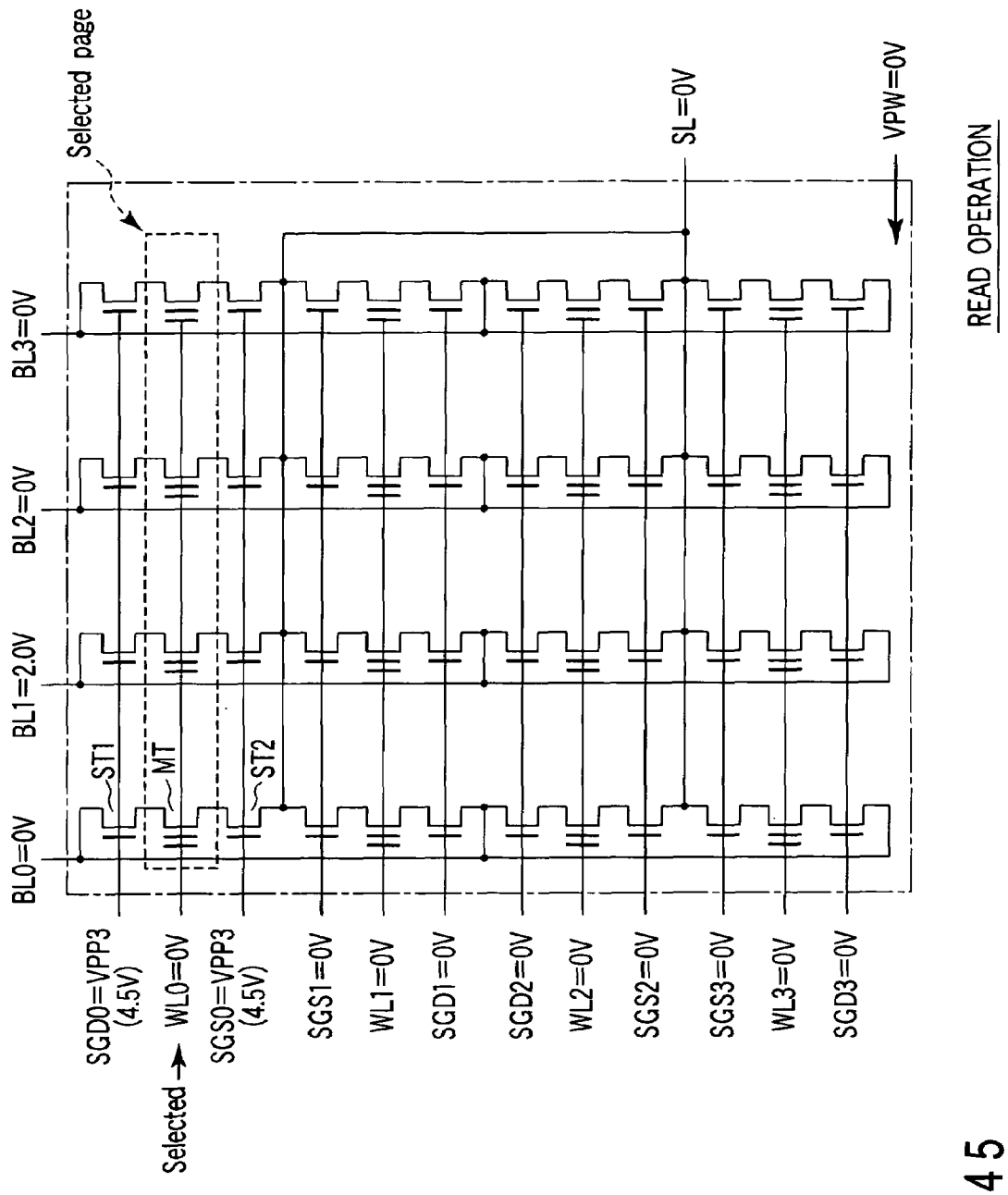
FIG. 45 is a circuit diagram to help explain the state of the memory cell array in a read operation of the 3Tr-NAND flash memory according to the fourth embodiment.

A read operation will be explained by reference to FIG. 45. FIG. 45 is a circuit diagram of the memory cell array 10 of the 3Tr-NAND flash memory 3. For simplification, FIG. 45 shows a case where the number of memory cells is (4×4). FIG. 45 shows a case where the data is read from the memory cell transistor MT connected to bit line BL1 and word line WL0.

First, the row decoder selects select gate lines SGD, SGS to which a memory cell to be read from is connected and applies VPP3 (e.g., 4.5V) to the selected select gate lines SGD, SGS. In addition, the row decoder makes unselected the other select gate lines SGD, SGS and applies 0V to the unselected select gate lines SGD, SGS. As a result, the select transistors ST1, ST2 connected to the selected select gate lines SGD, SGS are brought into the on state. Then, the row decoder applies 0V to all of the word lines WL. That is, as shown in FIG. 45, VPP3 is applied to the selected select gate lines SGD0, SGS0 and 0V is applied to the unselected select gate lines SGD1 to SGD3, SGS1 to SGS3. As a result, the select transistors ST1, ST2 connected to the selected select gate lines SGD0, SGS0 are brought into the on state. In addition, 0V is applied to all of the word lines WL0 to WL3.

Since the memory cell transistor MT has a negative threshold value if the data written in it is "1," the transistor MT is in the on state. Since the memory cell transistor MT has a positive threshold value if the data written in it is "0," the transistor MT is in the off state.

In addition, the precharge circuit 63 precharges the selected bit line BL to, for example, 2.0V. Then, if the data written in the memory cell transistor MT connected to the selected select gate lines SGD, SGS is "1," current flows from the bit line to the source line. On the other hand, if the data written in the memory cell transistor M is "0," no current flows. In the example of FIG. 45, 2.0V is applied to the selected bit line BL1. Then, if the data written in the memory cell transistor MT connected to word line WL0 and the selected bit line BL1 is "1," current flows from bit line BL1 to the source line SL. On the other hand, if the data written in the memory cell transistor M is "0," no current flows.

As described above, the bit line potential varying with the current flowing from the bit line to the source line is amplified by the sense amplifier 64, thereby reading the data. While the data has been read from one bit line in the example of FIG. 45, a potential may be applied to a plurality of bit lines, thereby reading the data from a plurality of memory cell transistors simultaneously.

Even the above-described 3Tr-NAND flash memory produces the effect in item (1) explained in the first embodiment. As explained in the second embodiment, the potentials on the select gate lines may be set to 0V before and after electrons are pulled out of the floating gates in an erase operation. In this case, the effect in item (5) explained in the second embodiment is achieved. Moreover, as explained in the third embodiment and its modification, diodes DD0 to DDm, DS0 to DSm may be composed of dummy cells. In this case, the effect in item (7) explained in the third embodiment is achieved.

Figure 46:
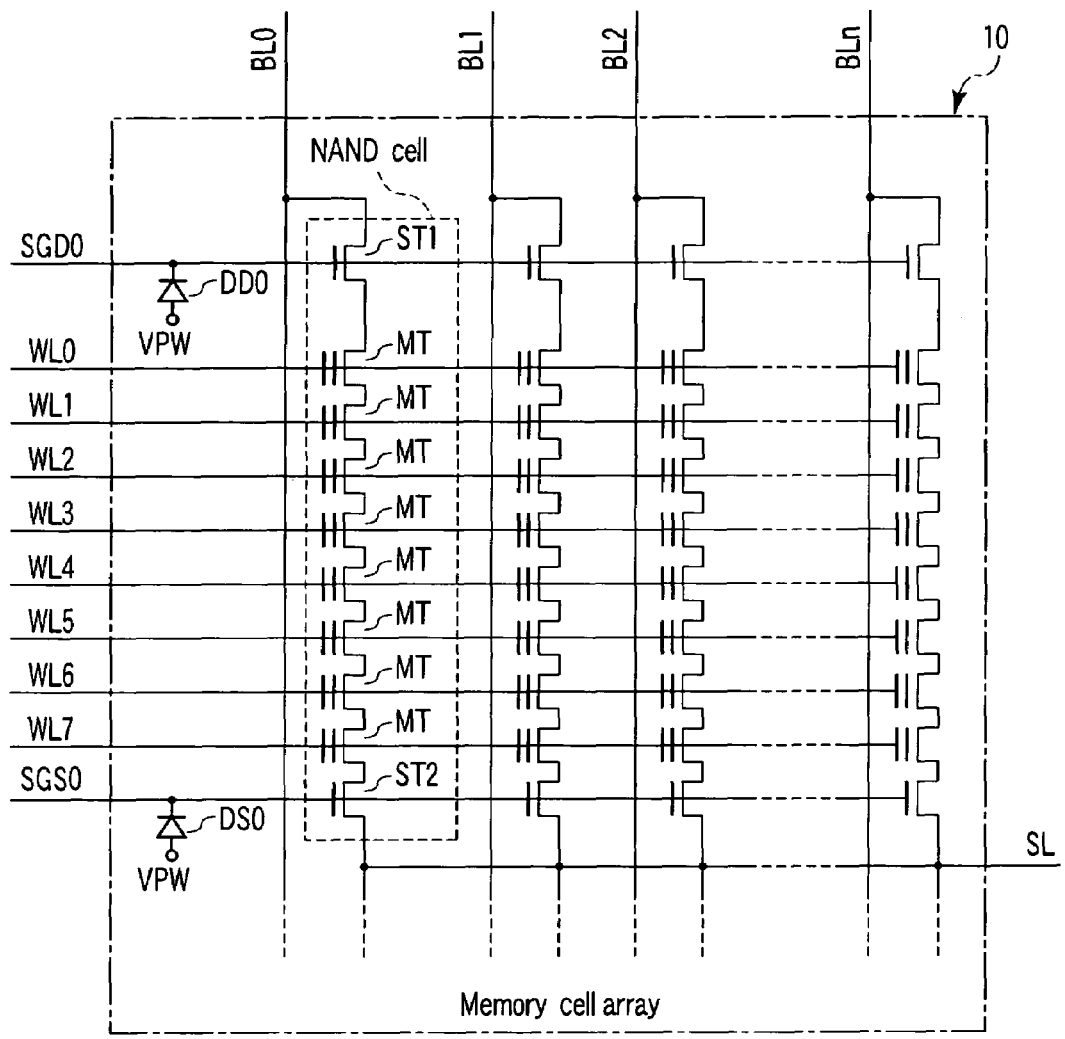
FIG. 46 is a circuit diagram of the memory cell array of a NAND flash memory according to a fifth embodiment of the present invention.

Next, a semiconductor memory device according to a fifth embodiment of the present invention will be explained. The fifth embodiment is such that the first embodiment is applied to a NAND flash memory. Therefore, the configuration of the fifth embodiment is such that the memory cells in the fourth embodiment are replaced with the NAND cells shown in FIG. 46. FIG. 46 is a circuit diagram of the memory cell array 10.

As shown in FIG. 46, the memory cell array has a plurality of NAND cells arranged in a matrix. Each of the NAND cells includes eight memory cell transistors MT and select transistors ST1, ST2. A memory cell transistor MT has a stacked-gate structure that includes a floating gate on a semiconductor substrate with a gate insulating film interposed therebetween and a control gate on the floating gate with an inter-gate insulating film interposed therebetween. The number of memory cell transistors MT is not limited to 8 and may be 16 or 32. The number is illustrative and not restrictive. The adjoining ones of the memory cell transistors MT share their source and drain. They are arranged in such a manner that their current paths are connected in series between the select transistors ST1, ST2. The drain region at one end of the series connection of the memory cell transistors MT is connected to the source region of the select transistor ST1. The source region at the other end is connected to the drain region of the select transistor ST2. That is, a NAND cell is such that a plurality of memory cell transistors MT are used in a 3Tr-NAND flash memory.

The control gates of the memory cell transistors MT in a same row are connected commonly to any one of word lines WL0 to WLm. The gates of the select transistors ST1, ST2 in the same row are connected commonly to select gate lines SGD, SGS, respectively. Word lines WL0 to WLm and select gate lines SGS, SGD are connected to the row decoder. The drains of the select transistors ST1 in a same column are connected commonly to any one of bit lines BL0 to BLn. The bit lines are then connected to the write circuit 50 and read circuit 60. The sources of the select transistors ST2 are connected commonly to a source line SL and then connected to a source line driver 70. Both of the select transistors ST1, ST2 are not necessarily needed. Only one of them may be used, provided that it can select a NAND cell.

Then, between the select gate lines SGD, SGD and the p-well region where memory cells MC are formed, diodes DD0, DS0 are formed. The cathodes of the diodes DD0, DS0 are connected to select gate lines SGD0, SGS0, respectively. The anodes of the diodes DD0, DS0 are connected to the p-well region. The configuration of the diodes DD0, DS0 is the same as that of the diodes D0 to D(4m+3) explained in the first embodiment.

Figure 47:
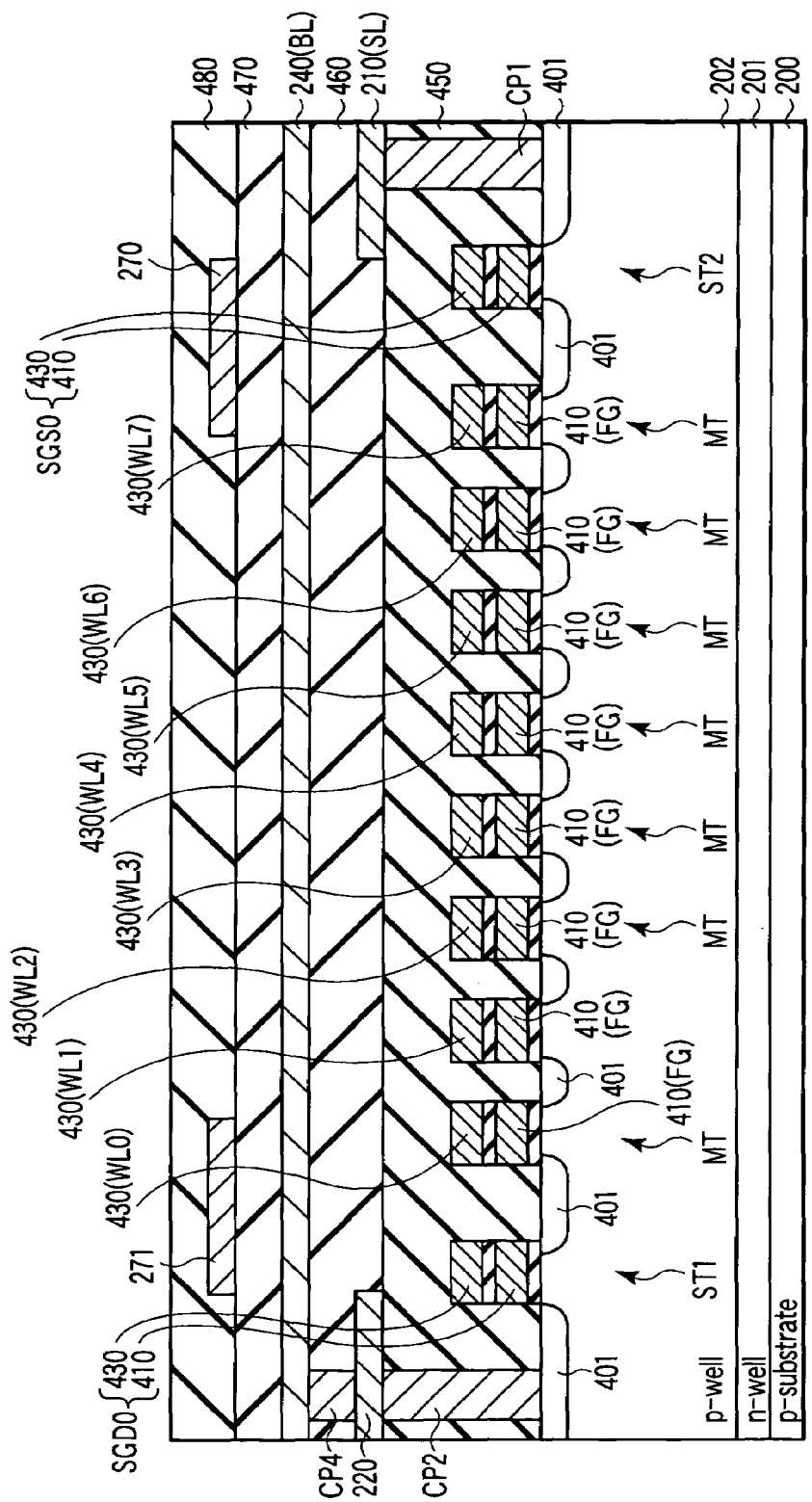
FIG. 47 is a sectional view, taken along a bit line, of the memory cell array of the NAND flash memory according to the fifth embodiment.

FIG. 47 is a sectional view of a NAND cell taken along a bit line. As shown in FIG. 47, at the surface of the p-type semiconductor (silicon) substrate 200, an n-well region 201 is formed. At the surface of the n-well region 201, a p-well region 202 is formed. On the p-well region 202, a gate insulating film 410 is formed. On the gate insulating film 410, the gate electrodes of a memory cell transistor MT and select transistors ST1, ST2 are formed. Each of the gate electrodes of the memory cell transistor MT and select transistors ST1, ST2 includes a polysilicon layer 410 formed on the gate insulating film 410, an inter-gate insulating film 420 formed on the polysilicon layer 410, and a polysilicon layer 430 formed on the inter-gate insulating film 420. The inter-gate insulating film 420 is made of, for example, a silicon oxide film, or an ON film, NO film, or ONO film having a stacked structure of a silicon oxide film and a silicon nitride film. In a memory cell transistor MT, the polysilicon layers 410, which are separated from each other between adjacent element regions AA, function as floating gates (FG). The polysilicon layers 230 function as control gate (or word lines WL). The polysilicon layers 430 are shared by element regions AA adjoining in the word line direction.

In each of the select transistors ST1, ST2, a part of the inter-gate insulating film 430 is removed and the polysilicon layers 410, 430 are electrically connected to each other. Then, the polysilicon layers 410, 430 function as select gate lines SGD, SGS. In each of the select transistors ST1, ST2, the polysilicon layer 410 and polysilicon layer 430 are not separated from each other between element regions AA adjoining in the word line direction, but are connected to each other.

At the surface of the p-well region 202 located between adjacent gate electrodes, impurity diffused layers 203 functioning as source-drain regions are formed. An impurity diffused layer 203 is shared by adjacent transistors. Specifically, an impurity diffuse layer 203 between two adjacent select transistors ST1 functions as the drain region of the two select transistors ST1. An impurity diffuse layer 203 between two adjacent select transistors ST2 functions as the source region of the two select transistors ST2. An impurity diffuse layer 203 between two adjacent memory cell transistors MT functions as the source-drain region of the two memory cell transistors MT. Moreover, an impurity diffuse layer 203 between a memory cell transistor MT and a select transistor ST1 adjoining each other functions as the drain region of the memory cell transistor MT and the source region of the select transistor ST1. An impurity diffuse layer 203 between a memory cell transistor MT and a select transistor ST2 adjoining each other functions as the source region of the memory cell transistor MT and the drain region of the select transistor ST2.

Then, on the semiconductor substrate 200, an interlayer insulating film 450 is formed so as to cover the memory cell transistor MT and select transistors ST1, ST2. In the interlayer insulating film 450, a contact plug CP1 reaching the source region 203 of the select transistor ST2 is formed. On the interlayer insulating film 450, a metal wiring layer 210 connected to the contact plug CP1 is formed. The metal wiring layer 210 functions as a source line SL. Further in the interlayer insulating film 450, a contact plug CP2 reaching the drain region of the select transistor ST1 is formed. On the interlayer insulating film 450, a metal wiring layer 220 connected to the contact plug CP2 is formed.

On the interlayer insulating film 450, an interlayer insulating film 460 is formed so as to cover the metal wiring layers 210, 220. In the interlayer insulating film 460, a contact plug CP4 reaching the metal wiring layer 220 is formed. On the interlayer insulating film 460, a metal wiring layer 240 commonly connected to a plurality of contact plugs CP4 are formed.

The metal wiring layer 240 function as bit lines.

On the interlayer insulating film 460, an interlayer insulating film 470 is formed so as to cover the metal wiring layers 240. On the interlayer insulating film 470, metal wiring layers 270, 271 are formed. The metal wiring layers 270, 271, which are connected to the polysilicon layers 210 of the select transistors ST2, ST1 respectively in specific regions (not shown), function as shunt wires for the select gate lines SGS, SGD. On the interlayer insulating film 470, an interlayer insulating film 480 is formed so as to cover the metal wiring layers 270, 271.

Even the above-described NAND flash memory produces the effect in item (1) explained in the first embodiment. As explained in the second embodiment, the potentials on the select gate lines may be set to 0V before and after electrons are pulled out of the floating gates in an erase operation. In this case, the effect in item (5) explained in the second embodiment is achieved. Moreover, as explained in the third embodiment and its modification, diodes DD0, DS0*m* may be composed of dummy cells. In this case, the effect in item (7) explained in the third embodiment is achieved.

Figure 48:
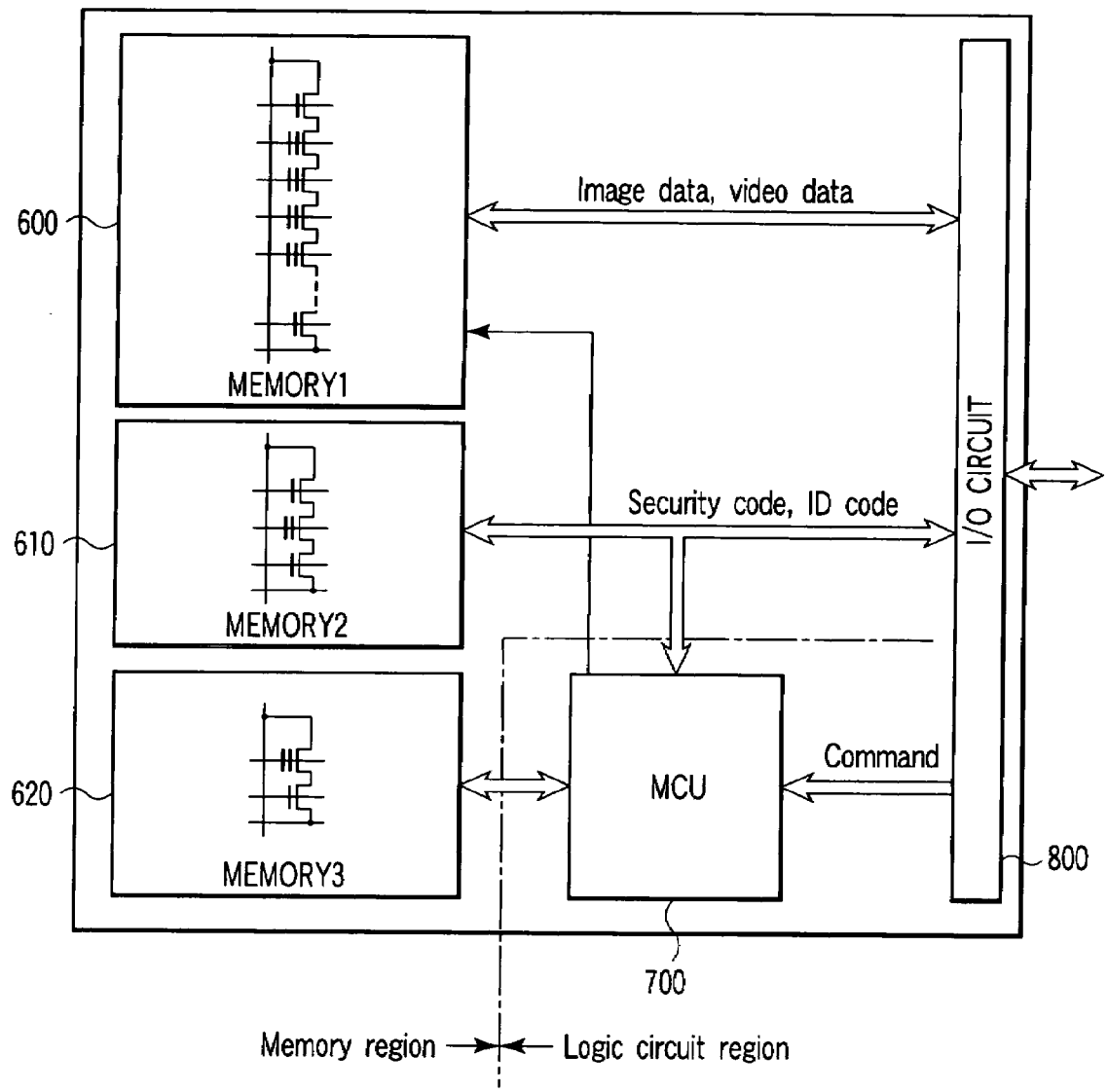
FIG. 48 is a block diagram of a system LSI according to a sixth embodiment of the present invention.
Figure 49:
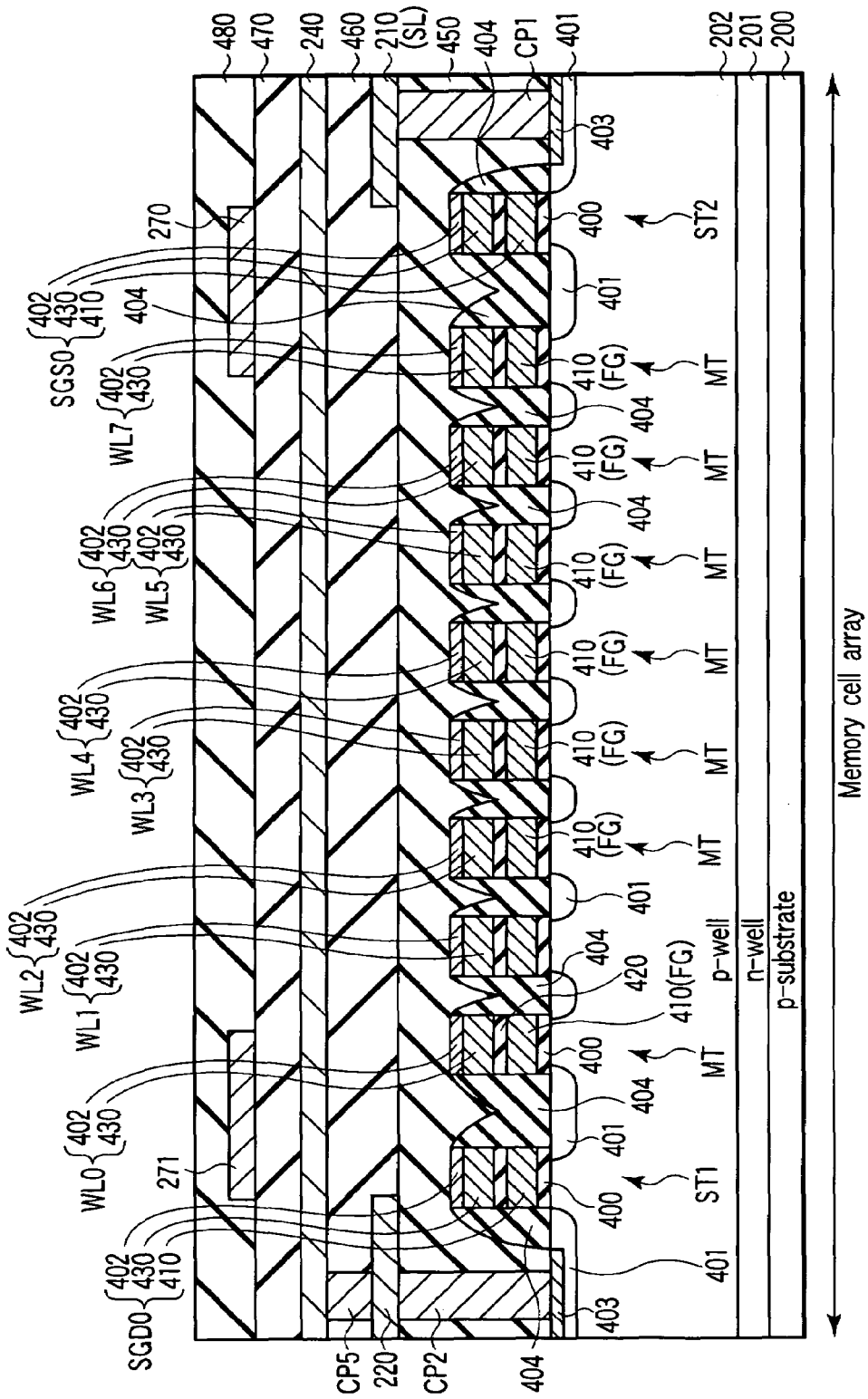
FIG. 49 is a sectional view, taken along a bit line, of a NAND flash memory according to the sixth embodiment.

Next, a semiconductor memory device according to a sixth embodiment of the present invention will be explained. The sixth embodiment is such that the flash memories explained in the first to fifth embodiments are embedded on a same chip of an LSI. FIG. 48 is a block diagram of a system LSI according to the sixth embodiment.

As shown in FIG. 48, a system LSI 1 comprises a NAND flash memory 600, a 3Tr-NAND flash memory 610, a 2Tr flash memory 620, an MCU 700, and an I/O circuit 800 formed on a single semiconductor substrate.

The NAND flash memory 600 is used as a storage memory for storing image data or video data. The configuration of the NAND flash memory is as explained in the fifth embodiment.

The 3Tr-NAND flash memory 610 holds an ID code for accessing the LSI 1 and a security code. The configuration of the 3Tr-NAND flash memory 610 is as explained in the fourth embodiment.

The 2Tr flash memory 620 holds program data for the MCU 700 to operate. The configuration of the 2Tr flash memory 620 is as explained in the first to third embodiments.

The MCU 700 does processing on the basis of the program read from the 2Tr flash memory 620, in response to various commands externally input. At this time, the MCU 700 accesses the 2Tr flash memory 620 directly without intervention of an SRAM (Static Random Access Memory) or the like. The processing done by the MCU 700 includes the compression or decompression of the data input to the NAND flash memory 600 and control of an external device. In addition, the MCU 700 reads specific data from the 3Tr-NAND flash memory 610, when the data held in the NAND flash memory 600 is accessed from the outside. Then, the MCU 700 checks the readout data against the externally input ID code and security data. If they coincide with each other, the MCU 700 permits access to the NAND flash memory 600. When access to the NAND flash memory 600 is permitted, the data in the NAND flash memory 600 is accessed from the outside (host). Specifically, the MCU 700 triggers the NAND flash memory 600 in response to the command received from the outside, thereby reading (or writing) the data.

The I/O circuit 800 controls the exchange of signals between the LSI 1 and the outside.

FIGS. 32 to 34 are sectional views taken along a bit line, showing the configurations of the three semiconductor memories 600, 610, 620 included in the LSI 1, respectively.

<NAND Flash Memory>

The sectional structure of the memory cell array 10 of the NAND flash memory 500 is basically as explained in the fifth embodiment. As shown in FIG. 39, at the surfaces of the polysilicon layer 230 and impurity diffused layer 203, silicide layers 205, 207 may be formed respectively and a sidewall insulating film 206 may be formed on the sidewalls of the stacked gate. In a memory cell transistor MT, the polysilicon layer 230 and silicide layer 205 function as a control gate (or a word line WL).

The silicide layer 207 is formed at the surface of the drain region 203 of a select transistor ST1 and at the surface of the source region 203 of a select transistor ST2. No silicide layer is formed in the source and drain regions 203 of the memory cell transistor MT, in the source region 203 of the select transistor ST1, and in the drain region 203 of the select transistor ST2. The region between the stacked gates of adjacent memory cell transistors MT and the region between the stacked gates of the memory cell transistor MT and select transistors ST1, ST2 are filled with the sidewall insulating film 206. Thus, the top of the source and drain regions of the memory cell transistor MT, the top of the source region of the select transistor ST1, and the top of the drain region of the select transistor ST2 are covered with the sidewall insulating film 206.

<3Tr-NAND Flash Memory>

Figure 50:
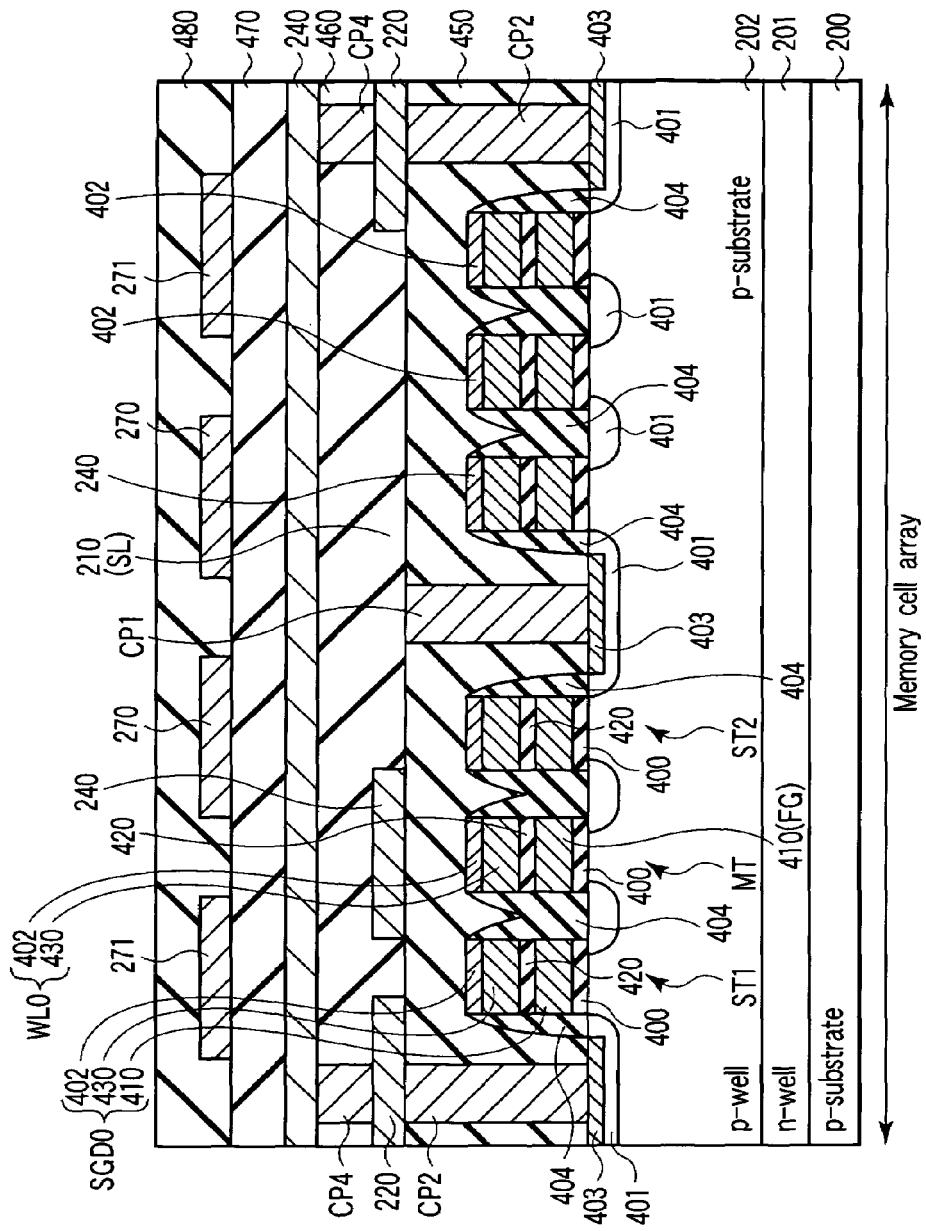
FIG. 50 is a sectional view, taken along a bit line, of a 3Tr-NAND flash memory according to the sixth embodiment.
Figure 51:
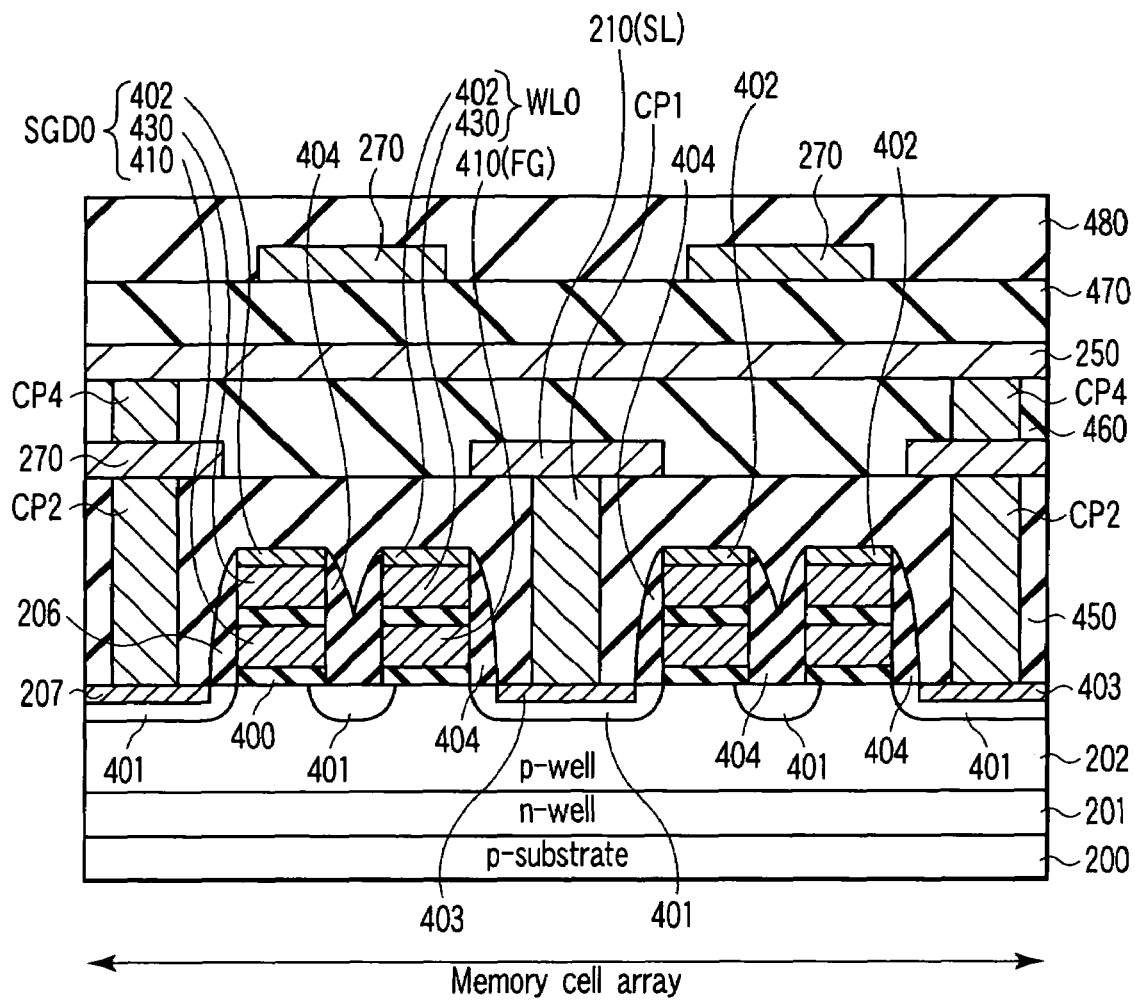
FIG. 51 is a sectional view, taken along a bit line, of a 2Tr flash memory according to the sixth embodiment.

The configuration of the 3Tr-NAND flash memory 610 is as explained in the fourth embodiment. As shown in FIG. 50, on the polysilicon layer 430 and at the surface of the impurity diffused layer 401, silicide layers 402, 403 may be formed respectively. Then, a sidewall insulating film 404 may be formed on the sidewalls of the stacked gate. In a memory cell transistor MT, the polysilicon layer 430 and silicide layer 402 function as a control gate (or word line WL).

No silicide layer is formed in the source and drain regions 401 of the memory cell transistor MT, in the source region 401 of the select transistor ST1, and in the drain region 401 of the select transistor ST2. The region between the stacked gates of the memory cell transistor MT and select transistors ST1, ST2 is filled with the sidewall insulating film 404. Thus, the top of the source and drain regions of the memory cell transistor MT, the top of the source region of the select transistor ST1, and the top of the drain region of the select transistor ST2 are covered with the sidewall insulating film 404.

<2Tr Flash Memory>

The configuration of the 2Tr flash memory 620 is as explained in the first to third embodiments. As shown in FIG. 50, on the polysilicon layer 430 and at the surface of the impurity diffused layer 401, silicide layers 402, 403 may be formed respectively. Then, a sidewall insulating film 404 may be formed on the sidewalls of the stacked gate. In a memory cell transistor MT, the polysilicon layer 430 and silicide layer 402 function as a control gate (or word line WL).

No silicide layer is formed in the source region 401 of the memory cell transistor MT and in the drain region 401 of the select transistor ST. The region between the stacked gates of the memory cell transistor MT and select transistor ST is filled with the sidewall insulating film 404. Thus, the top of the source region of the memory cell transistor MT and the top of the drain region of the select transistor ST are covered with the sidewall insulating film 404.

As described above, the system LSI of the sixth embodiment produces not only the effects in item (1) to item (7) explained in the first to fifth embodiments but also the effects described below.

(8) It is possible to embed a plurality of types of flash memories in a single chip, while suppressing the manufacturing cost.

With the configuration of the sixth embodiment, the memory cell transistors MT and select transistors ST1, ST2, ST included in the NAND flash memory 600, 3Tr-NAND flash memory 610, and 2Tr flash memory 620 are formed in the same processes. That is, the individual MOS transistors are formed in the same oxidizing process, film-forming process, impurity implanting process, photolithographic etching process. As a result, the gate insulating film, inter-gate insulating film, the floating gates and control gates of the memory cell transistors MT, and the select gates of the select transistors are the same in the three flash memories

600, 610, 620. In such a manufacturing method, the memory cell arrays of the three flash memories can be formed by the number of processes required to form a single flash memory. Therefore, the manufacturing cost of a system LSI including three types of semiconductor memories can be reduced.

(9) The performance of the system LSI can be made higher.

The system LSI of the sixth embodiment has the NAND flash memory 600, 3Tr-NAND flash memory 610, and 2Tr flash memory 620 as described above.

Unlike the NAND flash memory 600 and 3Tr-NAND flash memory 610, the 2Tr flash memory 620 uses a positive voltage (VPP1=12V) and a negative voltage (VBB1=−7V, VBB2=−8V) in a write and an erase operation. That is, the potential difference applied across the gate insulating film of the MOS transistor used in the row decoder is 12V or −8V. Therefore, the gate insulating film of the MOS transistors used in the row decoder included in the 2Tr flash memory 620 may be thinner than that of the MOS transistors used in the row decoders included in the NAND flash memory 600 and 3Tr-NAND flash memory 610. Thus, the row decoder of the 2Tr flash memory can be made more compact. In addition, the operating speed of the row decoder can be made faster than that of the row decoders in the NAND flash memory 500 and 3Tr-NAND flash memory 610.

In the sixth embodiment, the program data for the MCU 700 to operate is stored in the 2Tr flash memory 620. Thus, the 2Tr flash memory can operate at high speed as described above. The data can be read directly from the 2Tr flash memory 620 without the intervention of the MCU 700 or RAM. As a result, a RAM or the like is not needed, which helps simplify the configuration of the system LSI and improve the operating speed.

In addition, the 3Tr-NAND flash memory 610 holds an ID code and a security code. These code data are not so large in the amount of data, but are frequently changed and updated. Thus, the memory to hold the code data is required to operate at some high speed. In this respect, the 3Tr-NAND flash memory 610 uses a smaller erase unit than that in the NAND flash memory 600 and can rewrite the data in pages. Therefore, it can be said that the 3Tr-NAND flash memory 610 is the preferable semiconductor memory to hold the code data.

A conventional LSI including a NAND flash memory requires the following controller to prevent rewriting from concentrating on a specific block. The controller converts addresses input in ware leveling or logic form into physical addresses or, when a block malfunctions, determines the block to be faulty and performs control to prevent the faulty block from being used. In the sixth embodiment, however, such a controller is not needed. The reason is that the 2Tr flash memory 620 is caused to hold a firmware program to control the blocks in the NAND flash memory 600 and the MCU 700 is caused to perform such control. The MCU 700 performs the control in an interval of time between its original jobs (such as the process of controlling an external device or the process of computing the data input to the NAND flash memory 600). Of course, when the comparison of the capacity of the MCU 700 with the amount of work the MCU 700 has to process has shown that the amount of work has exceeded the capacity, a hardware sequencer or the like may be provided to control the NAND flash memory 600.

As described above, in the flash memory according to each of the first to sixth embodiments, diodes are provided between the select gate lines and the semiconductor substrate (p-well region) in which memory cells are formed. Each of the diodes has its anode connected to the semiconductor substrate and its cathode connected to the corresponding select gate line. Therefore, in a flash memory where the select gates are brought into the floating state in an erase operation, when an erase voltage is applied to the semiconductor substrate, the diodes are forward-biased, with the result that the potential on the select gate lines becomes almost equal to the erase voltage. Therefore, an excessive voltage is prevented from being applied to the gate insulating films of the select transistors, which improves the reliability of the memory cells.

Furthermore, the anode of a diode is made of a p-well region and the cathode of the diode is made of an n-well region in the p-well region, which enables the above configuration to be realized easily. Using some of the p-n junctions included in the dummy cells as diodes enables an increase in the area to be reduced to almost zero.

Figure 52:
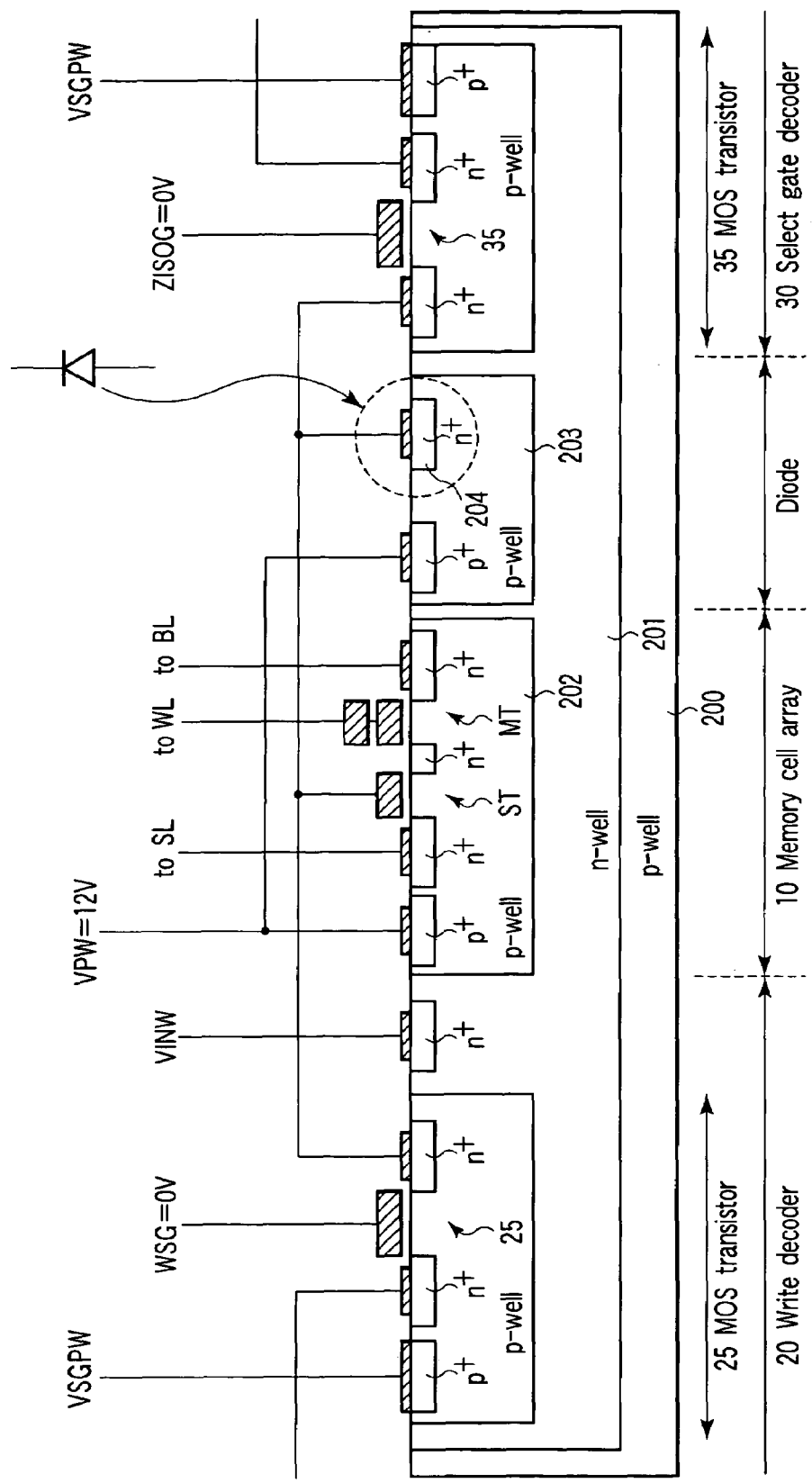
FIG. 52 is a sectional view of a flash memory according to a first modification of each of the first to fifth embodiments.

In the first to sixth embodiments, the p-well region 202 where memory cells are formed has been used as the anode of a diode. However, as shown in the sectional view of FIG. 52, the anode may not be the p-well region 202. Specifically, a new p-well region 203 may be provided which is separated from the p-well region 202 and is set to the same potential as that of the p-well region 202 in an erase operation. Then, the p-well region 203 may be used as the anode and an n$^+$-type diffused layer 204 formed in the p-well region 203 may be used as the cathode.

Figure 53:
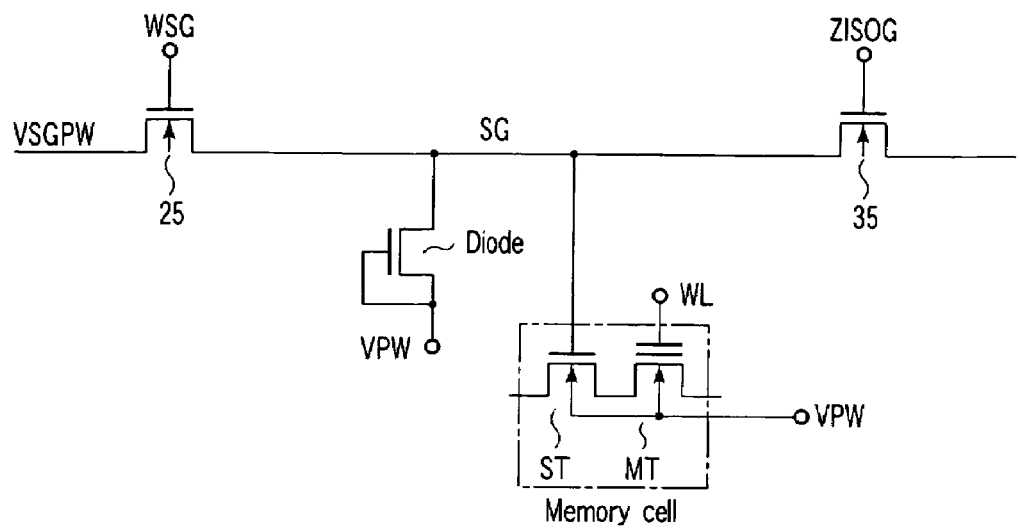
FIG. 53 is a circuit diagram to help explain the connection between the memory cells and the select gate lines in a flash memory according to a second modification of each of the first to fifth embodiments.

Furthermore, a diode may be formed using a MOS transistor as shown in FIG. 53. Specifically, one end of the current path of a MOS transistor may be connected to a select gate line and the other end of the current path and the gate may be connected to each other and then connected to VPW node. Moreover, while the above embodiments have been explained using the case where the cathode of a diode is connected to the shunt wire for a select gate line, the cathode of a diode may be connected directly to the polysilicon layer 410 of a select transistor ST.

Figure 54:
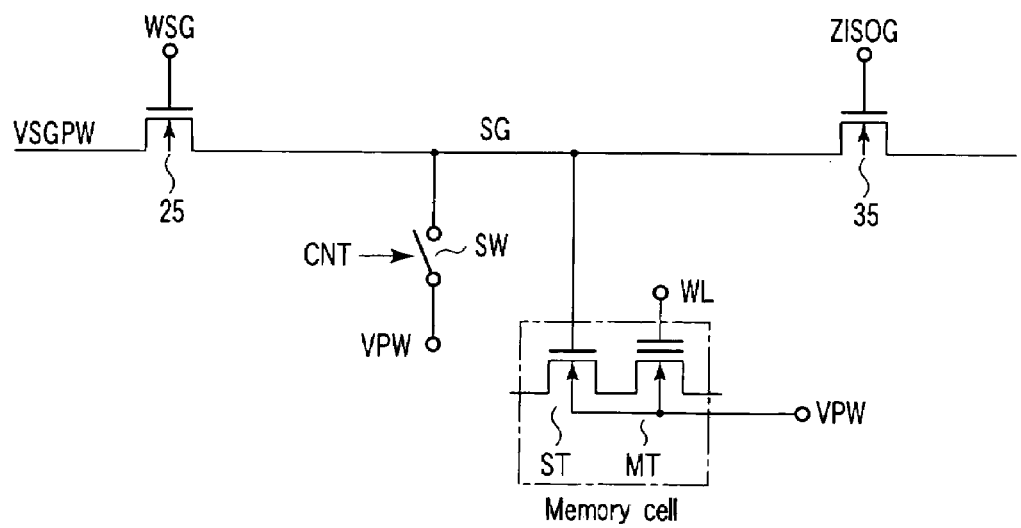
FIG. 54 is a circuit diagram to help explain the connection between the memory cells and the select gate lines in a flash memory according to a third modification of each of the first to fifth embodiments.

In addition, as shown in FIG. 54, another switching element SW may be used instead of a diode. That is, the configuration is not limited to those explained in the embodiments, as long as a region whose potential is equal to that of the p-well region where memory cells MC are formed can be connected to the p-well region where the memory cells are formed. As described in the above embodiments, when a diode whose anode is the p-well region 202 is used, the diode is forward-biased, which enables the potential on the select gate line to be set to about VPW without requiring external control.

Figure 55:
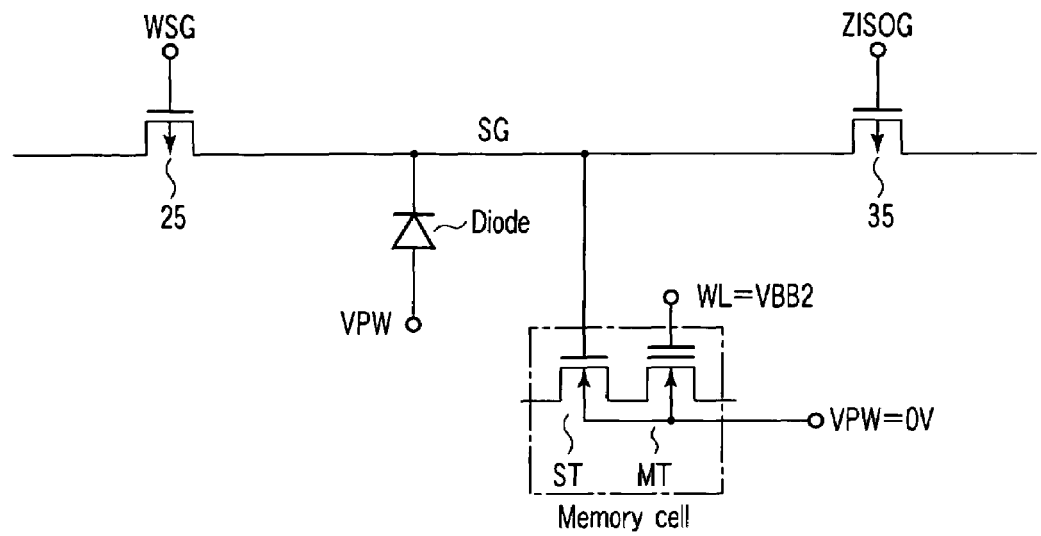
FIG. 55 is a circuit diagram to help explain the connection between the memory cells and the select gate lines in a flash memory according to a fourth modification of each of the first to fifth embodiments.
Figure 56:
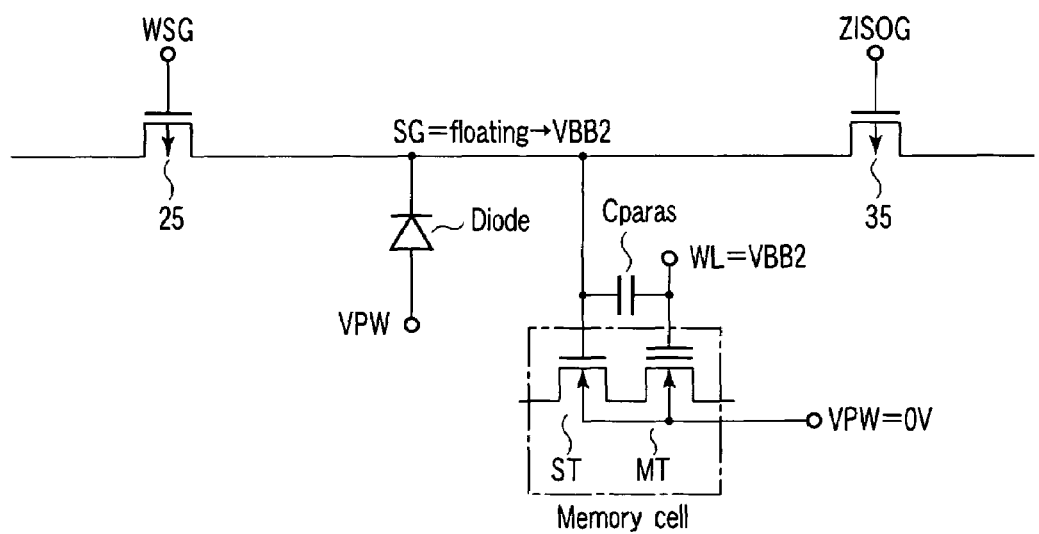
FIG. 56 is a circuit diagram to help explain the connection between the memory cells and the select gate lines in a flash memory according to a fifth modification of each of the first to fifth embodiments.

In the above embodiments, a positive potential has been applied to the semiconductor substrate (p-well region) where the memory cells are formed and a negative potential has been applied to the word lines in an erase operation. However, the above embodiments can also be applied to a case where setting is done as follows in an erase operation: VPW=0V and WL=a negative potential as shown in FIG. 55. For example, consider a case where erasing is done by applying the negative voltage VBB2 to the word lines and 0V to VPW. Then, as shown in FIG. 56, coupling with the parasitic capacitance between the word lines and the semiconductor substrate causes the potentials on the select gate lines in the floating state to reach about VBB2. Then, the diodes D0 to D(4m−1) whose anode is connected to VPW node are forward-biased. Therefore, the potentials on the select gate lines SG go from VBB2 to VPW (almost equal to (0V−Vf)), which achieves the above-described effect. In this case, p-channel MOS transistors can be used as the isolating transistors 25, 35.

Furthermore, in the above embodiments, diodes have been provided in the select gate lines of the memory cell array. However, besides the memory cell array, a diode may be provided for a component whose configuration is similar to that of a memory cell, such as a fuse element. While in the 2Tr flash memory according to each of the above embodiments, the bit lines have been hierarchized, the present embodiment is not limited to this.

Figure 57:
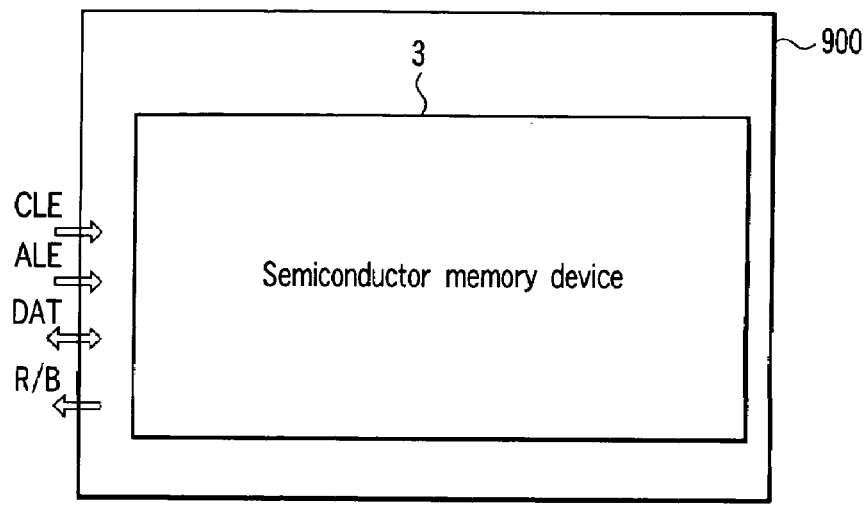
FIG. 57 is a block diagram of a memory card including a flash memory according to the first to sixth embodiments.

Next, an application of the flash memory will be explained. FIG. 57 shows an example of a memory card. As shown in FIG. 57, the memory card 900 includes a flash memory 3 (3Tr-NAND flash memory, NAND flash memory, or 2Tr flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Figure 58:
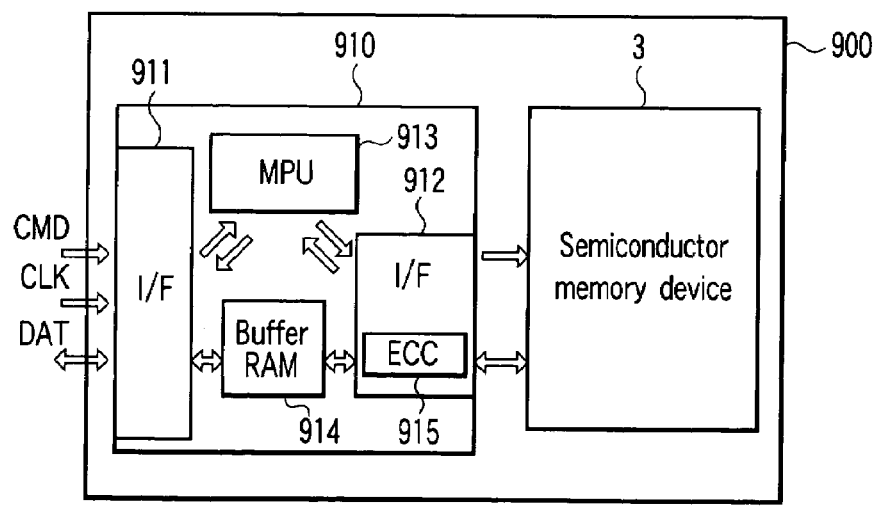
FIG. 58 is a block diagram of a memory card including a flash memory according to the first to sixth embodiments.

Another exemplary implementation is shown in FIG. 58. The memory card shown in FIG. 58 differs from the memory card presented in FIG. 57 in that the memory card of FIG. 58 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 59:
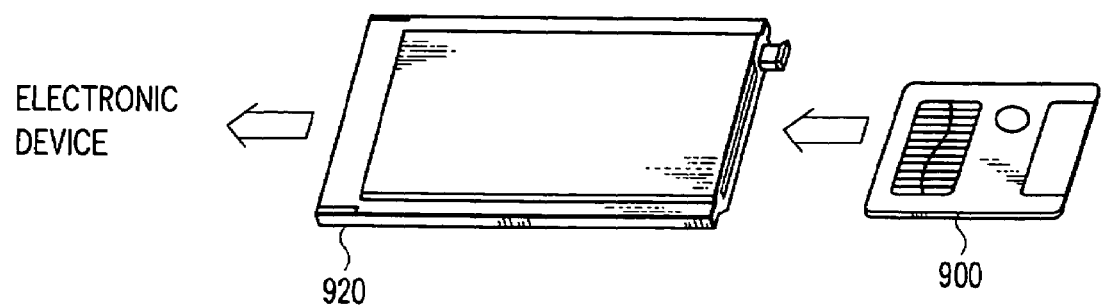
FIG. 59 is the outward appearance of a memory card including a flash memory according to the first to sixth embodiments and a card holder.

FIG. 59 shows another application. As shown in FIG. 59, the memory card 900 is inserted into a cardholder 920, which is then connected to electronic equipment (not shown). The cardholder 920 may have a part of the function of the controller 910.

Figure 60:
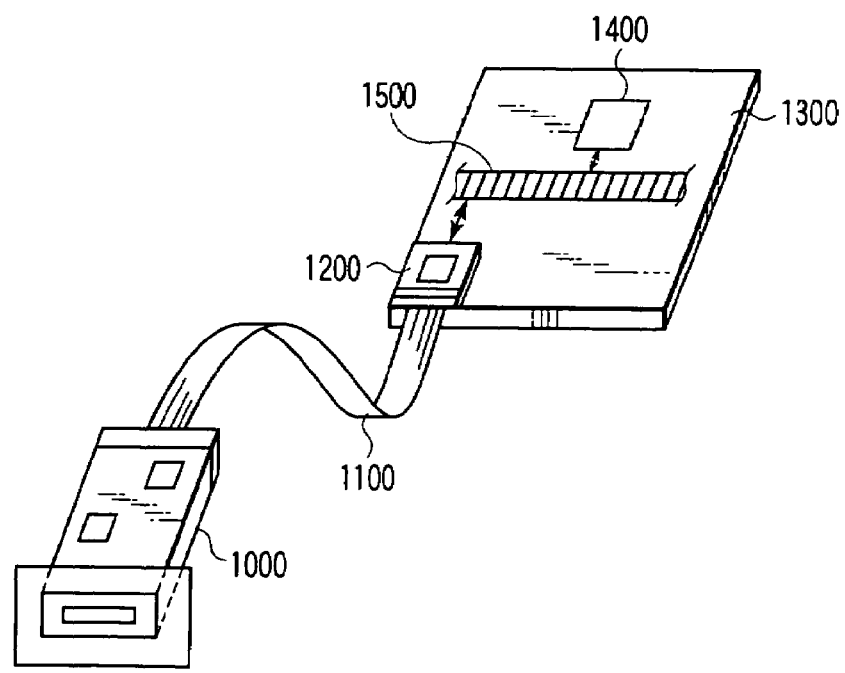
FIG. 60 is the outward appearance of a connection unit which enables connection with a memory card including a flash memory according to the first to sixth embodiments.

FIG. 60 shows another application. As shown in FIG. 60, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 61:
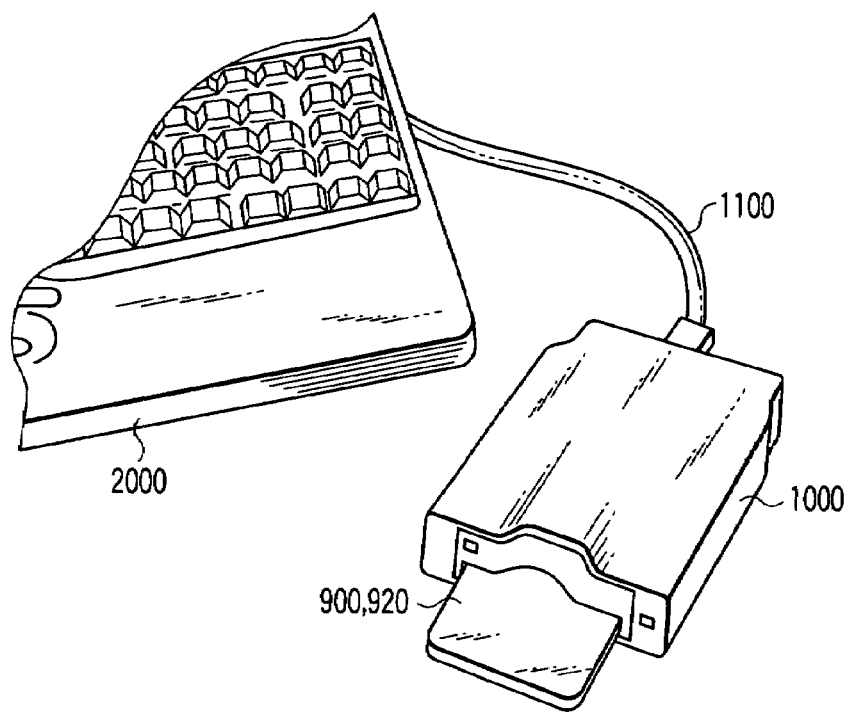
FIG. 61 is the outward appearance of a connection unit which enables connection with a memory card including a flash memory according to the first to sixth embodiments.

FIG. 61 shows another application. The memory card 900 or the cardholder 920 in which the memory card 900 has been inserted is inserted into the connection unit 1000. The connection unit 1000 is connected to a personal computer 2000 via the connection cable 1100.

Figure 62:
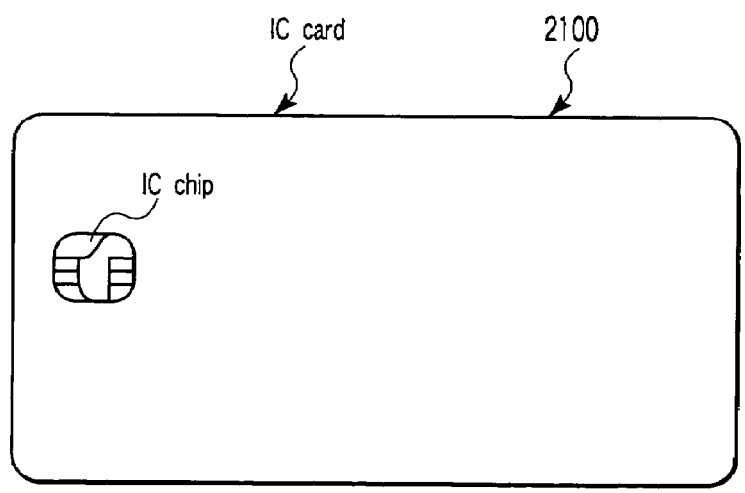
FIG. 62 is the outward appearance of an IC card including a flash memory according to the first to sixth embodiments.
Figure 63:
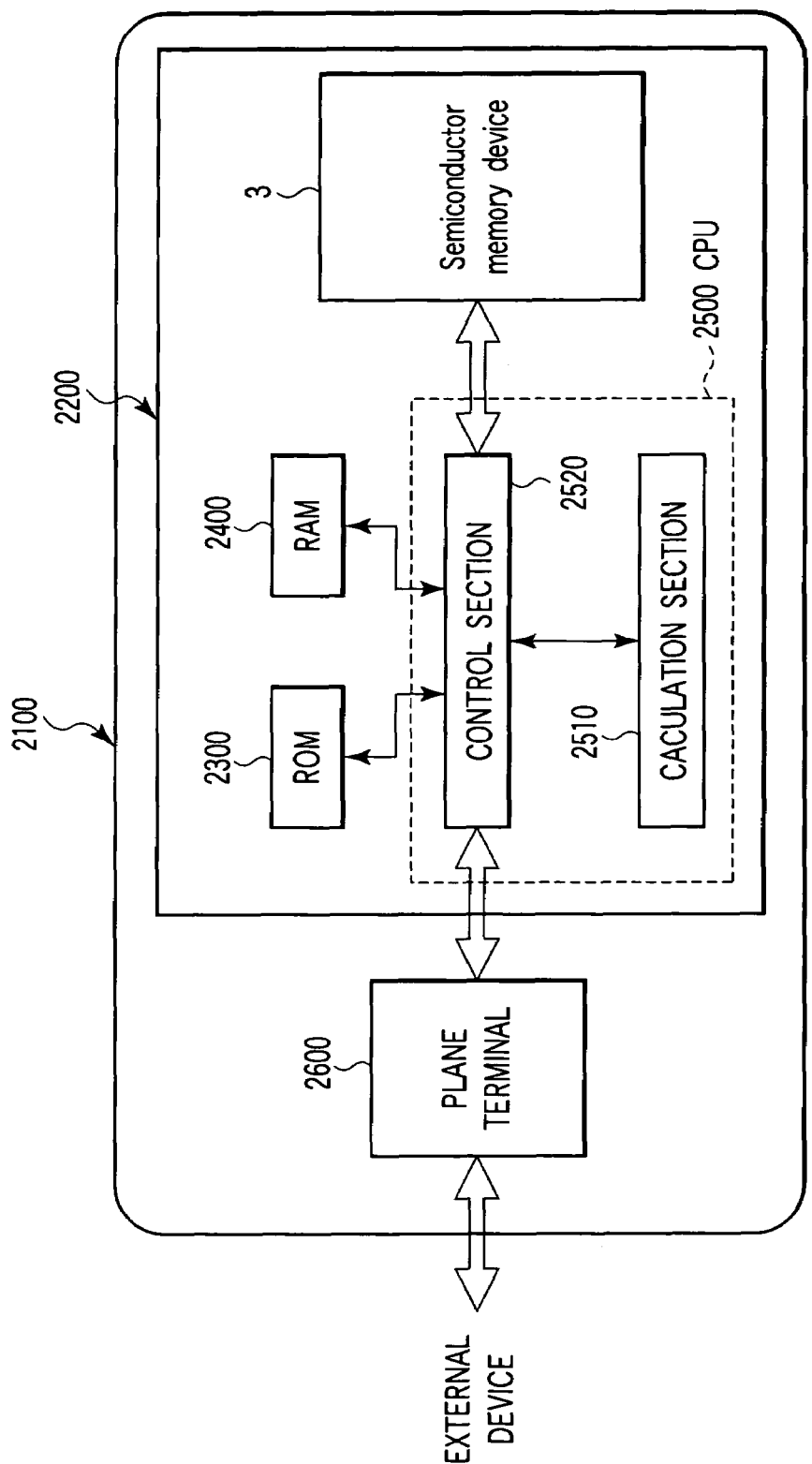
FIG. 63 is a block diagram of an IC card including a flash memory according to the first to sixth embodiments.

FIGS. 62 and 63 show another application. As shown in FIGS. 62 and 63, an IC card 2100 includes an MCU 2200. The MCU 2200 includes the flash memory 3 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array in which a plurality of memory cells are arranged in a matrix, each including a first MOS transistor having a charge accumulation layer and a control gate and a second MOS transistor which has a drain connected to a source of the first MOS transistor;
    word lines each of which connects commonly the control gates of the first MOS transistors in a same row;
    select gate lines each of which connects commonly the gates of the second MOS transistors in a same row; and
    switch elements which, in an erase operation, electrically connect the select gate lines to a semiconductor substrate in which the memory cell array is formed.

2. The semiconductor memory device according to claim 1, wherein each of the switch elements is a diode which has an anode connected to the semiconductor substrate and a cathode,
    in an erase operation, an erase voltage is applied to the semiconductor substrate, making the substrate higher in potential than the cathode of the diode.

3. The semiconductor memory device according to claim 2, wherein the diode is a part of a dummy cell which is provided at one end of the memory cell array and which includes a third MOS transistor having a first gate electrode and a second gate electrode formed on the first gate electrode with an inter-gate insulating film interposed therebetween, the second gate electrode being connected to the semiconductor substrate, and
    the anode of the diode is the semiconductor substrate and the cathode of the diode is formed in the semiconductor substrate so as to include an impurity diffused layer performing as the source or drain region of the dummy cell.

4. The semiconductor memory device according to claim 1, wherein the memory cells erased from simultaneously in an erase operation are formed on a same well region of the semiconductor substrate.

5. The semiconductor memory device according to claim 1, further comprising:
    bit lines each of which connects commonly the drains of the first MOS transistors in a same column; and
    source lines each of which connects commonly the sources of the second MOS transistors.

6. The semiconductor memory device according to claim 1, further comprising a well region with a first conductivity type formed at the surface of the semiconductor substrate, the memory cell array being formed on the well region, and a semiconductor layer with a second conductivity type formed in the well region and connected to the corresponding select gate line, wherein each of the switch elements is a diode which includes an anode and a cathode, the well region performing as the anode, the semiconductor layer performing as the cathode.

7. The semiconductor memory device according to claim 1, further comprising a well region formed at the surface of the semiconductor substrate, the memory cell array being formed on the well region;

a first semiconductor layer with a first conductivity type formed at the surface of the semiconductor substrate so as to be isolated from the well region, the first semiconductor layer being set to the same potential as that of the well region; and a second semiconductor layer with a second conductivity formed in the first semiconductor layer and connected to the corresponding select gate line, wherein each of the switch element is a diode which includes an anode and a cathode, the first semiconductor layer performing as the anode, the second semiconductor layer performing as the cathode.

8. The semiconductor memory device according to claim 1, further comprises a first well region formed at the surface of the semiconductor substrate, the memory cell array being formed on the first well region;

a second well region formed at the surface of the semiconductor substrate so as to be isolated from the first well region;

a read decoder which selects any one of the select gate lines in a read operation; and the write decoder which selects any one of the word lines in a write operation and applies the erase voltage to the first well region in an erase operation, wherein in an erase operation, the read decoder discharges the charge on the select gate lines to the power supply voltage node of the read decoder before the write decoder applies an erase voltage to the first well region, the write decoder discharges the charge on the select gate lines to the second well region after discharging the charge from the charge accumulation layer by applying the erase voltage to the first well region.

9. The semiconductor memory device according to claim 8, wherein the write decoder includes first row address decode circuits which are provided for the word lines in a one-to-one correspondence and supply a row address decode signal obtained by decoding a row address signal to the word lines, and first isolating transistors each of which has one end of its current path connected to the second well region and other end of its current path connected to one end of the corresponding select gate line, and the read decoder includes second row address decode circuits which are provided for the select gate lines in a one-to-one correspondence and produce a row address decode signal by decoding the row address signal, and second isolating transistors each of which has one end of its current path connected to the output node of the second row address decode circuit and other end of its current path connected to the other end of the corresponding select gate line.

10. A semiconductor memory device comprising:

memory cells each of which includes a first MOS transistor having a charge accumulation layer and a control gate and into which data is written by injecting electrons into the charge accumulation layer by FN tunneling and from which data is erased by discharging electrons from the charge accumulation layer;

a memory cell array in which the memory cells are arranged in a matrix;

row select signal lines each of which connects commonly the memory cells in a same row and selects a row direction of the memory cell array; and switch elements which, in an erase operation, electrically connect the unselected ones of the row select signal lines to a semiconductor substrate in which the memory cell array is formed.

11. The semiconductor memory device according to claim 10, wherein each of the switch elements is a diode which has an anode connected to the semiconductor substrate and a cathode, in an erase operation, an erase voltage is applied to the semiconductor substrate, making the substrate higher in potential than the cathode of the diode.

12. The semiconductor memory device according to claim 11, wherein the diode is a part of a dummy cell which is provided at one end of the memory cell array and which includes a third MOS transistor having a first gate electrode and a second gate electrode formed on the first gate electrode with an inter-gate insulating film interposed therebetween, the second gate electrode being connected to the semiconductor substrate, and the anode of the diode is the semiconductor substrate and the cathode of the diode is formed in the semiconductor substrate so as to include an impurity diffused layer performing as a source region or a drain region of the dummy cell.

13. The semiconductor memory device according to claim 10, wherein the memory cells erased from simultaneously in an erase operation are formed on a same well region of the semiconductor substrate.

14. The semiconductor memory device according to claim 10, wherein each of the memory cells further includes a second MOS transistor which has a drain connected to a source of the first MOS transistor, the row select signal lines include word lines each of which connects commonly the control gates of the first MOS transistors in a same row and select gate lines each of which connects commonly the gates of the second MOS transistors in the same row, and the semiconductor memory device further comprises bit lines each of which connects commonly drains of the first MOS transistors in a same column and source line which connects commonly the sources of the second MOS transistors.

15. The semiconductor memory device according to claim 14, further comprising a well region with a first conductivity type formed at the surface of the semiconductor substrate, the memory cell array being formed on the well region, and a semiconductor layer with a second conductivity type formed in the well region and connected to the corresponding select gate line, wherein each of the switch elements is a diode which includes an anode and a cathode, the well region performing as the anode, the semiconductor layer performing as the cathode.

16. The semiconductor memory device according to claim 14, further comprising
- a well region formed at the surface of the semiconductor substrate, the memory cell array being formed on the first well region;
- a first semiconductor layer with a first conductivity type formed at the surface of the semiconductor substrate so as to be isolated from the well region, the first semiconductor layer being set to the same potential as that of the well region; and
- a second semiconductor layer with a second conductivity formed in the first semiconductor layer and connected to the corresponding select gate line,
- wherein each of the switch element is a diode which includes an anode and a cathode, the first semiconductor layer performing as the anode, the second semiconductor layer performing as the cathode.

17. The semiconductor memory device according to claim 14, further comprises
- a first well region formed at the surface of the semiconductor substrate, the memory cell array being formed on the first well region;
- a second well region formed at the surface of the semiconductor substrate so as to be isolated from the first well region;
- a read decoder which selects any one of the select gate lines in a read operation; and
- the write decoder which selects any one of the word lines in a write operation and applies the erase voltage to the first well region in an erase operation,
- wherein in an erase operation, the read decoder discharges the charge on the select gate lines to the power supply voltage node of the read decoder before the write decoder applies an erase voltage to the first well region, and
- the write decoder discharges the charge on the select gate lines to the second well region after discharging the charge from the charge accumulation layer by applying the erase voltage to the first well region.

18. The semiconductor memory device according to claim 17, wherein the write decoder includes first row address decode circuits which are provided for the word lines in a one-to-one correspondence and supply a row address decode signal obtained by decoding a row address signal to the word lines, and first isolating transistors each of which has one end of its current path connected to the second well region and the other end of its current path connected to one end of the corresponding select gate line, and
- the read decoder includes second row address decode circuits which are provided for the select gate lines in a one-to-one correspondence and produce a row address decode signal by decoding the row address signal, and second isolating transistors each of which has one end of its current path connected to the output node of the second row address decode circuit and other end of its current path connected to the other end of the corresponding select gate line.

19. A memory card comprising a semiconductor memory device recited in claim 1.

20. The memory card according to claim 19, further comprising a control device which controls the semiconductor memory device.

* * * * *